(12) United States Patent
    Kimura

(10) Patent No.: US 9,047,815 B2
(45) Date of Patent: Jun. 2, 2015

(54) METHOD FOR DRIVING SEMICONDUCTOR DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1203 days.

(21) Appl. No.: 12/708,057

(22) Filed: Feb. 18, 2010

(65) Prior Publication Data

US 2010/0220117 A1    Sep. 2, 2010

(30) Foreign Application Priority Data

Feb. 27, 2009    (JP) ................. 2009-045574

(51) Int. Cl.
    *G09G 5/10*    (2006.01)
    *G09G 3/32*    (2006.01)
(52) U.S. Cl.
    CPC ...... *G09G 3/3233* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2320/043* (2013.01)
(58) Field of Classification Search
    USPC .............. 315/169.3; 313/483, 486, 500, 313/505–507; 327/108–112; 326/82–83; 345/74.1–83, 204, 690
    See application file for complete search history.

(56) References Cited

U.S. PATENT DOCUMENTS

| | | | |
|---|---|---|---|
| 6,611,130 B2 | 8/2003 | Chang | |
| 6,661,180 B2* | 12/2003 | Koyama | ................. 315/169.3 |
| 7,106,006 B2* | 9/2006 | Koyama | ................. 315/169.3 |
| 7,173,590 B2 | 2/2007 | Uchino et al. | |
| 7,365,713 B2 | 4/2008 | Kimura | |
| 7,414,599 B2 | 8/2008 | Chung et al. | |

(Continued)

FOREIGN PATENT DOCUMENTS

| | | |
|---|---|---|
| CN | 1698086 A | 11/2005 |
| CN | 1975844 A | 6/2007 |

(Continued)

OTHER PUBLICATIONS

State Intellectual Property Office of the People's Republic of China (SIPO) Office Action (CN Patent Application No. 201010126274.7) dated Aug. 6, 2013, with English translation, 19 pages.

(Continued)

*Primary Examiner* — Priyank Shah
(74) *Attorney, Agent, or Firm* — Fish & Richardson P.C.

(57) ABSTRACT

To provide a method for driving a semiconductor device, by which influence of variation in threshold voltage and mobility of transistors can be reduced. The semiconductor device includes an n-channel transistor, a switch for controlling electrical connection between a gate and a first terminal of the transistor, a capacitor electrically connected between the gate and a second terminal of the transistor, and a display element. The method has a first period for holding the sum of a voltage corresponding to the threshold voltage of the transistor and an image signal voltage in the capacitor; a second period for turning on the switch so that electric charge held in the capacitor in accordance with the sum of the image signal voltage and the threshold voltage is discharged through the transistor; and a third period for supplying a current to the display element through the transistor after the second period.

12 Claims, 27 Drawing Sheets

(56) References Cited

U.S. PATENT DOCUMENTS

| | | | |
|---|---|---|---|
| 7,429,985 B2 * | 9/2008 | Kimura et al. | 345/213 |
| 7,456,810 B2 | 11/2008 | Kimura | |
| 7,714,813 B2 | 5/2010 | Uchino et al. | |
| 7,768,485 B2 | 8/2010 | Uchino et al. | |
| 7,876,294 B2 | 1/2011 | Sasaki et al. | |
| 7,948,456 B2 | 5/2011 | Yamashita et al. | |
| 8,004,477 B2 | 8/2011 | Uchino et al. | |
| 8,059,068 B2 | 11/2011 | Kimura | |
| 8,149,185 B2 * | 4/2012 | Uchino et al. | 345/76 |
| 8,310,469 B2 * | 11/2012 | Park et al. | 345/204 |
| 8,325,111 B2 | 12/2012 | Kimura | |
| 8,502,754 B2 | 8/2013 | Lin | |
| 8,519,918 B2 | 8/2013 | Sasaki et al. | |
| 8,803,768 B2 | 8/2014 | Kimura et al. | |
| 8,901,828 B2 * | 12/2014 | Kimura | 315/169.3 |
| 2004/0227749 A1 * | 11/2004 | Kimura | 345/211 |
| 2005/0030266 A1 * | 2/2005 | Nakatogawa | 345/76 |
| 2006/0044244 A1 * | 3/2006 | Numao | 345/92 |
| 2006/0245121 A1 * | 11/2006 | Numao | 361/18 |
| 2007/0057873 A1 * | 3/2007 | Uchino et al. | 345/76 |
| 2007/0126664 A1 * | 6/2007 | Kimura | 345/76 |
| 2007/0126665 A1 | 6/2007 | Kimura | |
| 2007/0236424 A1 | 10/2007 | Kimura | |
| 2007/0247399 A1 | 10/2007 | Yamashita et al. | |
| 2008/0246785 A1 | 10/2008 | Shirasaki et al. | |
| 2008/0284312 A1 | 11/2008 | Kimura | |
| 2009/0009676 A1 | 1/2009 | Kimura et al. | |
| 2009/0096727 A1 | 4/2009 | Kimura | |
| 2009/0225010 A1 * | 9/2009 | Kimura | 345/76 |
| 2010/0220092 A1 * | 9/2010 | Kimura | 345/213 |
| 2010/0328294 A1 | 12/2010 | Sasaki et al. | |
| 2011/0187699 A1 * | 8/2011 | Yamashita et al. | 345/212 |
| 2012/0169794 A1 * | 7/2012 | Uchino et al. | 345/690 |
| 2013/0092963 A1 | 4/2013 | Kimura | |

FOREIGN PATENT DOCUMENTS

| | | |
|---|---|---|
| CN | 101221725 A | 7/2008 |
| EP | 1 793 366 A2 | 6/2007 |
| EP | 1918904 A | 5/2008 |
| EP | 1 939 846 A2 | 7/2008 |
| JP | 2003202833 A | 7/2003 |
| JP | 2003216110 A | 7/2003 |
| JP | 2003-255897 A | 9/2003 |
| JP | 2005031630 A | 2/2005 |
| JP | 2005345722 A | 12/2005 |
| JP | 2006-215213 A | 8/2006 |
| JP | 2007148128 A | 6/2007 |
| JP | 2007148129 A | 6/2007 |
| JP | 2007310311 A | 11/2007 |
| TW | 200417970 | 9/2004 |
| TW | 200834517 | 8/2008 |
| WO | 2004/102518 A1 | 11/2004 |
| WO | WO2006060902 A1 | 6/2006 |

OTHER PUBLICATIONS

Taiwanese Office Action (Application No. 99105663) Dated Nov. 12, 2014.

* cited by examiner

FIG. 27A
FIG. 27B
FIG. 27C
FIG. 27D
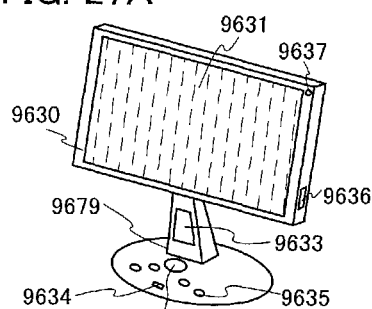
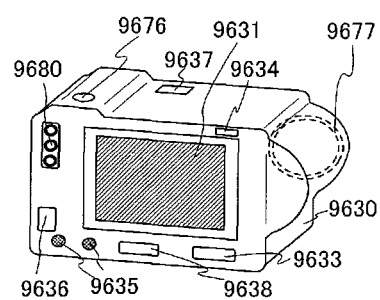
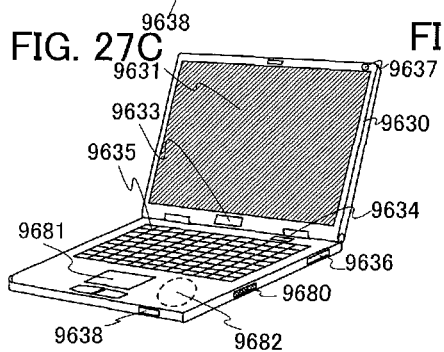
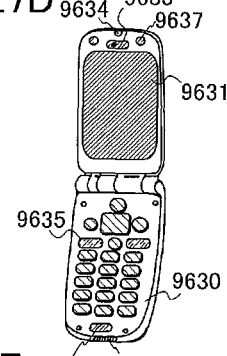
FIG. 27E
FIG. 27F
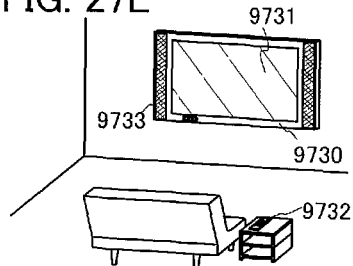
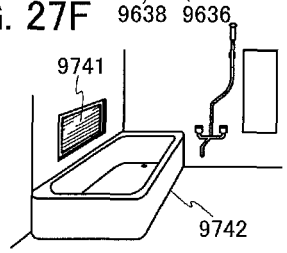
FIG. 27G
FIG. 27H
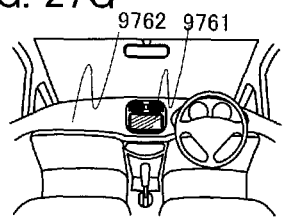
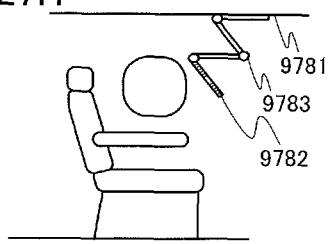

METHOD FOR DRIVING SEMICONDUCTOR DEVICE

BACKGROUND OF THE INVENTION

1. Field of the Invention

The present invention relates to a semiconductor device, a display device, and a light-emitting device; and a driving method thereof.

2. Description of the Related Art

Flat panel displays such as liquid crystal displays (LCDs) become widely used in recent years. However, the LCD has various disadvantages such as narrow viewing angle, narrow chromatic range, and slow response speed. Thus, research of an organic EL (also referred to as electroluminescence, organic light-emitting diode, OLED, or the like) display as a display that overcomes those disadvantages becomes active (see Patent Document 1).

However, the organic EL display has a problem in that current characteristics of a transistor for controlling current which flows to an organic EL element vary among pixels. When the current flowing to an organic EL element (i.e., current flowing through a transistor) varies, the luminance of the organic EL element also varies, whereby an image with unevenness is displayed on a screen. Thus, a method for compensating variation in threshold voltage of transistors is examined (see Patent Documents 2 to 6).

However, even if variation in threshold voltage of transistors is compensated, variation in mobility of the transistors leads to variation in current flowing to an organic EL element, so that image unevenness occurs. Thus, a method for compensating not only variation in threshold voltage but also variation in mobility of transistors is examined (see Patent Documents 7 and 8).

REFERENCE

Patent Document

Patent Document 1: Japanese Published Patent Application No. 2003-216110
Patent Document 2: Japanese Published Patent Application No. 2003-202833
Patent Document 3: Japanese Published Patent Application No. 2005-031630
Patent Document 4: Japanese Published Patent Application No. 2005-345722
Patent Document 5: Japanese Published Patent Application No. 2007-148129
Patent Document 6: PCT International Publication No. 2006/060902
Patent Document 7: Japanese Published Patent Application No. 2007-148128 (paragraph 0098)
Patent Document 8: Japanese Published Patent Application No. 2007-310311 (paragraph 0026)

SUMMARY OF THE INVENTION

In the techniques disclosed in Patent Documents 7 and 8, variation in mobility of transistors is compensated while an image signal (a video signal) is input to a pixel. Therefore, a problem occurs.

For example, since variation in mobility is compensated while an image signal is input to a pixel, an image signal cannot be input to another pixel during the period. In general, when the number of the pixels, the frame frequency, the screen size, or the like is decided, the maximum length of a period for inputting an image signal to each pixel (such a period is so-called one gate selection period or one horizontal period). Accordingly, in one gate selection period, a period for compensating variation in mobility is increased, whereby periods for other processes (e.g., input of an image signal or acquisition of the threshold voltage) are decreased. Therefore, in a pixel, various processes are necessary to be performed in one gate selection period. Thus, compensation of mobility is insufficient because accurate processes cannot be performed owing lack of process time, or because a sufficient period for compensating variation in mobility cannot be obtained.

Further, one gate selection period per pixel becomes increasingly shorter as the number of the pixels or the frame frequency is increased, or as the screen size is increased. Accordingly, a time for inputting an image signal to the pixel, a time for compensating variation in mobility, and the like cannot be sufficiently obtained.

Alternatively, when variation in mobility is compensated while an image signal is input, compensation of variation in mobility is likely to be affected by distortion of a waveform of the image signal. Accordingly, the degree of compensation of mobility varies between the case where distortion of the waveform of the image signal is large and the case where the distortion is small. Thus, accurate compensation cannot be performed.

Alternatively, when variation in mobility is compensated while an image signal is input to a pixel, it is difficult to perform dot sequential driving in many cases. In the dot sequential driving, when image signals are input to pixels in a given row, image signals are input not to all the pixels in the row at the same time but to the pixels one by one sequentially. Thus, the length of the period for inputting an image signal is different for each pixel. Accordingly, when variation in mobility is compensated while an image signal is input, the length of the period for compensating variation in mobility is different for each pixel, so that the amount of compensation also varies among pixels. Thus, compensation cannot be normally performed. Therefore, when variation in mobility is compensated while an image signal is input, it is necessary to perform line sequential driving in which signals are input to all the pixels in a given row at the same time, instead of dot sequential driving.

Furthermore, when the line sequential driving is performed, a structure of a source signal line driver circuit (also referred to as a video signal line driver circuit, a source driver, and a data driver) is complicated compared with the case where the dot sequential driving is performed. For example, for the source signal line driver circuit with the line sequential driving, circuits such as a DA converter, an analog buffer, and a latch circuit are often needed. The analog buffer often includes an operational amplifier, a source follower circuit, or the like and is easily affected by variation in current characteristics of transistors. Accordingly, when a circuit is configured by a thin film transistor (TFT), a circuit for compensating variation in current characteristics of transistors is necessary. Thus, the scale of a circuit is increased or power consumption is increased. Therefore, when a TFT is used as a transistor in a pixel portion, it might be difficult to form the pixel portion and a signal line driver circuit over the same substrate. Accordingly, the signal line driver circuit needs to be formed by using a different means from that used for the pixel portion; thus, it is possible that costs are increased. Moreover, the pixel portion and the signal line driver circuit need to be connected using COG (chip on glass), TAB (tape automated bonding), or the like, so that contact failure might occur or the reliability might be decreased.

In view of the above, an object of one embodiment of the present invention is as follows: to reduce influence of variation in threshold voltage of transistors; to reduce influence of variation in mobility of transistors; to reduce influence of variation in current characteristics of transistors; to obtain a long input period of an image signal; to obtain a long compensation period for reducing influence of variation in threshold voltage; to obtain a long compensation period for reducing influence of variation in mobility; to reduce influence of distortion of a waveform of an image signal; to employ not only line sequential driving but also dot sequential driving; to form a pixel and a driver circuit over the same substrate; to reduce power consumption; to reduce manufacturing costs; or to reduce a possibility that contact failure occurs at a connection point of a wiring. Note that the description of these objects does not prevent the existence of other objects. Further, one embodiment of the present invention does not need to achieve all the above objects.

One embodiment of the present invention is a method for driving a semiconductor device as follows. The semiconductor device includes a transistor with n-type conductivity, a switch configured to control a conduction state between a gate of the transistor and a first terminal of the transistor, a capacitor electrically connected between the gate of the transistor and a second terminal of the transistor, and a display element. The method for driving the semiconductor device has a first period for holding a sum of a voltage corresponding to a threshold voltage of the transistor and an image signal voltage in the capacitor; a second period for turning on the switch so that electric charge held in the capacitor in accordance with the sum of the image signal voltage and the threshold voltage is discharged through the transistor, and a third period for supplying a current to the display element through the transistor after the second period.

Another embodiment of the present invention is a method for driving a semiconductor device as follows. The semiconductor device includes a transistor with n-type conductivity, a switch configured to control a conduction state between a gate of the transistor and a first terminal of the transistor, a capacitor electrically connected between the gate of the transistor and a second terminal of the transistor, and a display element. The method for driving the semiconductor device has a first period for holding a voltage corresponding to a threshold voltage of the transistor in the capacitor; a second period for holding a sum of the voltage corresponding to the threshold voltage of the transistor and an image signal voltage in the capacitor; a third period for turning on the switch so that electric charge held in the capacitor in accordance with the sum of the image signal voltage and the threshold voltage is discharged through the transistor; and a fourth period for supplying a current to the display element through the transistor after the third period.

Another embodiment of the present invention is a method for driving a semiconductor device as follows. The semiconductor device includes a transistor with n-type conductivity, a switch configured to control a conduction state between a gate of the transistor and a first terminal of the transistor, a capacitor electrically connected between the gate of the transistor and a second terminal of the transistor, and a display element. The method for driving the semiconductor device has a first period for initializing a voltage held in the capacitor; a second period for holding a voltage corresponding to a threshold voltage of the transistor in the capacitor; a third period for holding a sum of the voltage corresponding to the threshold voltage of the transistor and an image signal voltage in the capacitor; a fourth period for turning on the switch so that electric charge held in the capacitor in accordance with the sum of the image signal voltage and the threshold voltage is discharged through the transistor; and a fifth period for supplying a current to the display element through the transistor after the fourth period.

Note that a variety of switches can be used as the switch. For example, an electrical switch or a mechanical switch can be used. That is, any element can be used as long as it can control a current flow, without limitation on a certain element. For example, a transistor (e.g., a bipolar transistor or a MOS transistor), or a diode (e.g., a PN diode, a PIN diode, a Schottky diode, an MIM (metal insulator metal) diode, an MIS (metal insulator semiconductor) diode, or a diode-connected transistor) can be used as the switch. Alternatively, a logic circuit in which such elements are combined can be used as the switch.

An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

Note that a CMOS switch may be used as the switch by using both an n-channel transistor and a p-channel transistor.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be provided between elements having a connection relation illustrated in drawings and texts, without limitation on a predetermined connection relation, for example, the connection relation illustrated in the drawings and the texts.

For example, in the case where A and B are electrically connected, one or more elements which enable electrical connection between A and B (e.g., a switch, a transistor, a capacitor, an inductor, a resistor, and/or a diode) may be connected between A and B. In the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) may be connected between A and B. For example, in the case where a signal output from A is transmitted to B even when another circuit is provided between A and B, A and B are functionally connected.

Note that when it is explicitly described that "A and B are electrically connected", the case where A and B are electrically connected (i.e., the case where A and B are connected with another element or another circuit therebetween), the case where A and B are functionally connected (i.e., the case where A and B are functionally connected with another circuit therebetween), and the case where A and B are directly connected (i.e., the case where A and B are connected without another element or another circuit therebetween) are included therein. That is, when it is explicitly described that "A and B are electrically connected", the description is the same as the case where it is explicitly only described that "A and B are connected".

Note that a display element, a display device which is a device including a display element, a light-emitting element, and a light-emitting device which is a device including a light-emitting element can employ a variety of modes and include a variety of elements. For example, a display element, a display device, a light-emitting element, and a light-emitting device can include a display medium whose contrast, luminance, reflectivity, transmittance, or the like changes by electromagnetic action, such as an EL (electroluminescence) element (e.g., an EL element containing organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube. Note that display devices using an EL element include an EL display; display devices using an electron emitter include a field emission display (FED) and an SED (surface-conduction electron-emitter display) flat panel display; display devices using a liquid crystal element include a liquid crystal display (e.g., a transmissive liquid crystal display, a transflective liquid crystal display, a reflective liquid crystal display, a direct-view liquid crystal display, or a projection liquid crystal display); and display devices using electronic ink or an electrophoretic element include electronic paper in their respective categories.

A liquid crystal element is an element that controls transmission or non-transmission of light by an optical modulation action of liquid crystal, and includes a pair of electrodes and liquid crystal. The optical modulation action of liquid crystal is controlled by an electric field (including a lateral electric field, a vertical electric field, and a diagonal electric field) applied to the liquid crystal. The following liquid crystal can be used for a liquid crystal element: nematic liquid crystal, cholesteric liquid crystal, smectic liquid crystal, discotic liquid crystal, thermotropic liquid crystal, lyotropic liquid crystal, low molecular liquid crystal, high molecular liquid crystal, polymer dispersed liquid crystal (PDLC), ferroelectric liquid crystal, anti-ferroelectric liquid crystal, main chain type liquid crystal, side chain type polymer liquid crystal, plasma addressed liquid crystal (PALC), and banana-shaped liquid crystal. Moreover, the following methods can be used for driving the liquid crystal, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue phase mode. Note that various kinds of liquid crystal elements and driving methods can be used without limitation on those described above.

As a transistor, a variety of transistors can be used. There is no limitation on the type of transistors. For example, a thin film transistor (TFT) including a non-single-crystal semiconductor film typified by a film made of amorphous silicon, polycrystalline silicon, microcrystalline (also referred to as microcrystal, nanocrystal, or semi-amorphous) silicon, or the like can be used.

Note that by using a catalyst (e.g., nickel) in the case of forming polycrystalline silicon, crystallinity can be further improved and a transistor having excellent electrical characteristics can be formed. Further, by using a catalyst (e.g., nickel) in the case of forming microcrystalline silicon, crystallinity can be further improved and a transistor having excellent electric characteristics can be formed. Note that it is possible to form polycrystalline silicon and microcrystalline silicon without using a catalyst (e.g., nickel).

The crystallinity of silicon is preferably enhanced to poly-crystallinity or microcrystallinity in the entire panel, but not limited thereto. The crystallinity of silicon may be improved only in part of the panel.

Moreover, a transistor can be formed by using a semiconductor substrate, an SOI substrate, or the like.

In addition, a transistor including a compound semiconductor or an oxide semiconductor, such as ZnO, a-InGaZnO, SiGe, GaAs, IZO, ITO, SnO, TiO, or AlZnSnO (AZTO) and a thin film transistor or the like obtained by thinning such a compound semiconductor or oxide semiconductor can be used. Note that such a compound semiconductor or oxide semiconductor can be used for not only a channel portion of a transistor but also for other applications. For example, such a compound semiconductor or oxide semiconductor can be used for a resistor, a pixel electrode, or a light-transmitting electrode. Further, since such an element can be formed at the same time as the transistor, the costs can be reduced.

A transistor or the like formed by an inkjet method or a printing method can also be used.

Further, a transistor or the like including an organic semiconductor or a carbon nanotube can be used. Accordingly, such a transistor can be formed using a flexible substrate. A semiconductor device using such a substrate can resist a shock.

In addition, various types of transistors can be used. For example, a MOS transistor, a junction transistor, a bipolar transistor, or the like can be employed.

Further, a MOS transistor, a bipolar transistor, and/or the like may be formed over one substrate.

Furthermore, various transistors other than the above transistors can be used.

A transistor can be formed using various types of substrates. The type of a substrate is not limited to a certain type. As the substrate, a single crystalline substrate (e.g., a silicon substrate), an SOI substrate, a glass substrate, a quartz substrate, a plastic substrate, a metal substrate, a stainless steel substrate, a substrate including a stainless steel foil, a tungsten substrate, a substrate including a tungsten foil, or a flexible substrate can be used, for example. Examples of the glass substrate are barium borosilicate glass and aluminoborosilicate glass. Examples of the flexible substrate are flexible synthetic resin such as plastics typified by polyethylene terephthalate (PET), polyethylene naphthalate (PEN), and polyethersulfone (PES), and acrylic. Alternatively, an attachment film (formed using polypropylene, polyester, vinyl, polyvinyl fluoride, polyvinyl chloride, or the like), paper including a fibrous material, a base material film (polyester, polyamide, polyimide, an inorganic vapor deposition film, paper, or the like), or the like can be used. Alternatively, the transistor may be formed using one substrate, and then, the transistor may be transferred to another substrate. As a substrate to which the transistor is transferred, a single crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. A skin (e.g., epidermis or corium) or hypodermal tissue of an animal such as a human being can be used as a substrate to which the transistor is transferred. Alternatively, the transistor may be formed using one substrate and the substrate may be thinned by polishing. As a substrate to be polished, a single crystal substrate, an SOI substrate, a glass substrate, a quartz substrate, a plastic substrate, a stainless steel substrate, a substrate including a stainless steel foil, or the like can be used. By using such a substrate, a transistor with excellent properties or low power consumption can be formed, a device with high durability or high heat resistance can be provided, or reduction in weight or thickness can be achieved.

Note that the structure of a transistor can be a variety of structures, without limitation on a certain structure. For example, a multi-gate structure having two or more gate electrodes can be used.

As another example, a structure where gate electrodes are formed above and below a channel can be used. Note that when the gate electrodes are formed above and below the channel, a structure where a plurality of transistors are connected in parallel is provided.

A structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be used. Moreover, a structure where a source electrode or a drain electrode overlaps with a channel region (or part thereof) can be used.

Note that a variety of transistors can be used, and the transistor can be formed using a variety of substrates. Accordingly, all the circuits which are necessary to realize a predetermined function can be formed using one substrate. For example, all the circuits which are necessary to realize the predetermined function can be formed using a glass substrate, a plastic substrate, a single crystal substrate, an SOI substrate, or any other substrate. Alternatively, some of the circuits which are necessary to realize the predetermined function can be formed using one substrate and some of the circuits which are necessary to realize the predetermined function can be formed using another substrate. That is, not all the circuits which are necessary to realize the predetermined function need to be formed using one substrate. For example, some of the circuits which are necessary to realize the predetermined function can be formed by transistors using a glass substrate, some of the circuits which are necessary to realize the predetermined function can be formed using a single crystal substrate, and an IC chip including transistors formed using the single crystal substrate can be connected to the glass substrate by COG (chip on glass) so that the IC chip is provided over the glass substrate. Alternatively, the IC chip can be connected to the glass substrate by TAB (tape automated bonding) or a printed wiring board.

Note that a transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Thus, a region which serves as a source or a drain is not referred to as a source or a drain in some cases. In such a case, one of the source and the drain may be referred to as a first terminal and the other of the source and the drain may be referred to as a second terminal, for example. Alternatively, one of the source and the drain may be referred to as a first electrode and the other of the source and the drain may be referred to as a second electrode. Further alternatively, one of the source and the drain may be referred to as a first region and the other of the source and the drain may be referred to as a second region.

Note that a transistor may be an element having at least three terminals of a base, an emitter, and a collector. In this case also, the emitter and the collector may be referred to as a first terminal and a second terminal, for example.

Note that when it is explicitly described that B is formed on or over A, it does not necessarily mean that B is formed in direct contact with A. The description includes the case where A and B are not in direct contact with each other, that is, the case where another object is placed between A and B. Here, each of A and B is an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A; and the case where another layer (e.g., a layer C or a layer D) is formed in direct contact with the layer A, and the layer B is formed in direct contact with the layer C or D. Note that another layer (e.g., the layer C or the layer D) may be a single layer or a plurality of layers.

Similarly, when it is explicitly described that B is formed above A, it does not necessarily mean that B is formed in direct contact with A, and another object may be placed between A and B. Accordingly, the case where a layer B is formed above a layer A includes the case where the layer B is formed in direct contact with the layer A and the case where another layer (e.g., a layer C and a layer D) is formed in direct contact with the layer A and the layer B is formed in direct contact with the layer C or D. Note that another layer (e.g., the layer C or the layer D) may be a single layer or a plurality of layers.

Note that when it is explicitly described that B is formed over, on, or above A, it includes the case where B is formed obliquely over/above A.

Note that the same can be said when it is explicitly described that B is formed below or under A.

Explicit singular forms preferably mean singular forms. However, embodiments of the present invention are not limited thereto, and such singular forms can include plural forms. Similarly, explicit plural forms preferably mean plural forms. However, embodiments of the present invention are not limited thereto, and such plural forms can include singular forms.

Note that the size, the thickness of layers, and regions in diagrams are sometimes exaggerated for simplicity. Therefore, embodiments of the present invention are not limited to such scales.

Note that a diagram schematically illustrates an ideal example, and embodiments of the present invention are not limited to the shape or the value illustrated in the diagram. For example, the following can be included: variation in shape due to a manufacturing technique or dimensional deviation; or variation in signal, voltage, or current due to noise or difference in timing.

Technical terms are used in order to describe a specific embodiment or the like in many cases. Note that one embodiment of the invention is not construed as being limited by the technical terms.

Terms which are not defined (including terms used for science and technology, such as technical terms and academic parlance) can be used as the terms which have a meaning equivalent to a general meaning that an ordinary person skilled in the art understands. It is preferable that the term defined by dictionaries or the like be construed as a consistent meaning with the background of related art.

The terms such as first, second, and third are used for distinguishing various elements, members, regions, layers, and areas from others. Therefore, the terms such as first, second, and third do not limit the number of elements, members, regions, layers, areas, or the like. Further, for example, "first" can be replaced with "second", "third", or the like.

Terms for describing spatial arrangement, such as "over", "above", "under", "below", "laterally", "right", "left", "obliquely", "back", "front", "inside", "outside", and "in" are often used for briefly showing, with reference to a diagram, a relation between an element and another element or between some characteristics and other characteristics. Note that embodiments of the present invention are not limited thereto, and such terms for describing spatial arrangement can indicate not only the direction illustrated in a diagram but also another direction. For example, when it is explicitly described that "B is over A", it does not necessarily mean that B is placed over A, and can include the case where B is placed under A because a device in a diagram can be inverted or rotated by 180°. Accordingly, "over" can refer to the direction described by "under" in addition to the direction described by "over". Note that embodiments of the present invention are not limited thereto, and "over" can refer to other directions described by "laterally", "right", "left", "obliquely", "back", "front", "inside", "outside", and "in" in addition to the directions described by "over" and "under" because a device in a diagram can be rotated in a variety of directions. That is, such terms can be construed as appropriate depending on circumstances.

In one embodiment of the present invention, influence of variation in threshold voltage of transistors can be reduced. Alternatively, in one embodiment of the present invention, influence of variation in mobility of transistors can be reduced. Alternatively, in one embodiment of the present invention, influence of variation in current characteristics of transistors can be reduced. Alternatively, in one embodiment of the present invention, a long input period of an image signal can be obtained. Alternatively, in one embodiment of the present invention, a long compensation period for reducing influence of variation in threshold voltage can be obtained. Alternatively, in one embodiment of the present invention, a long compensation period for reducing influence of variation in mobility can be obtained. Alternatively, in one embodiment of the present invention, the influence of distortion of a waveform of an image signal can be reduced. Alternatively, in one embodiment of the present invention, not only line sequential driving but also dot sequential driving can be employed. Alternatively, in one embodiment of the present invention, a pixel and a driver circuit can be formed over the same substrate. Alternatively, in one embodiment of the present invention, power consumption can be reduced. Alternatively, in one embodiment of the present invention, costs can be reduced. Alternatively, in one embodiment of the present invention, contact failure at a connection point of a wiring can be reduced.

BRIEF DESCRIPTION OF THE DRAWINGS

In the accompanying drawings:

FIGS. 27A to 27H each illustrate an electronic device shown in an embodiment.

DETAILED DESCRIPTION OF THE INVENTION

Figure 1A:
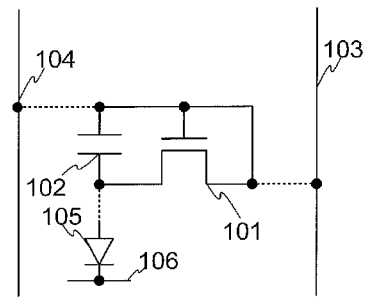
FIGS. 1A to 1F each illustrate a circuit or a driving method shown in an embodiment.

Embodiments of the present invention will be described below with reference to the accompanying drawings. Note that the embodiments can be implemented in various modes, and it is easily understood by those skilled in the art that modes and details can be variously changed without departing from the spirit and the scope of the present invention. Therefore, the present invention is not construed as being limited to the description of the following embodiments. Note that in the structures described below, reference numerals denoting the same components are used in common in different drawings, and detailed description of the same portions or portions having similar functions is not repeated.

Note that what is described (or part thereof) in one embodiment can be applied to, combined with, or exchanged with another content in the same embodiment and/or what is described (or part thereof) in another embodiment or other embodiments.

Note that in each embodiment, what is described in the embodiment is a content described with reference to a variety of diagrams or a content described with texts disclosed in this specification.

In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Note that in a diagram or a text described in one embodiment, it is possible to take out part of the diagram or the text and constitute an embodiment of the invention. Accordingly, in the case where a diagram or a text related to a certain portion is described, the context taken out from part of the diagram or the text is also disclosed as one embodiment of the invention and can constitute one embodiment of the invention. Therefore, for example, in a diagram (e.g., a cross-sectional view, a plan view, a circuit diagram, a block diagram, a flow chart, a process diagram, a perspective view, a cubic diagram, a layout diagram, a timing chart, a structure diagram, a schematic view, a graph, a list, a ray diagram, a vector diagram, a phase diagram, a waveform chart, a photograph, or a chemical formula) or a text in which one or more active elements (e.g., transistors or diodes), wirings, passive elements (e.g., capacitors or resistors), conductive layers, insulating layers, semiconductor layers, organic materials, inorganic materials, components, substrates, modules, devices, solids, liquids, gases, operating methods, manufacturing methods, or the like are described, it is possible to take out part of the diagram or the text and constitute one embodiment of the invention. For example, it is possible to take out M pieces of circuit elements (e.g., transistors or capacitors) (M is an integer, where M<N) from a circuit diagram in which N pieces of circuit elements (e.g., transistors or capacitors) (N is an integer) and constitute one embodiment of the invention. As another example, it is possible to take out M pieces of layers (M is an integer, where M<N) from a cross-sectional view in which N pieces of layers (N is an integer) are provided and constitute one embodiment of the invention. As another example, it is possible to take out M pieces of elements (M is an integer, where M<N) from a flow chart in which N pieces of elements (N is an integer) are provided and constitute one embodiment of the invention.

Embodiment 1

FIGS. 1A to 1F each illustrate an example of a driving method, drive timing, and a circuit configuration which are used when variation in current characteristics of transistors, such as mobility, is compensated. Note that in this embodiment, an n-channel transistor is described as an example.

FIG. 1A illustrates a circuit configuration in a period in which variation in current characteristics such as mobility of a transistor 101 is compensated. Note that the circuit configuration illustrated in FIG. 1A is a circuit configuration for discharging electric charge held in a gate of the transistor in order to compensate variation in current characteristics such as mobility of the transistor 101, and in practice, the connection relation in the circuit configuration is realized by controlling on and off of a plurality of switches provided between wirings. Note that in drawings, a solid line represents a conduction state between elements, and a dotted line represents a non-conduction state between elements.

In FIG. 1A, there is continuity (conduction) between one of a source or a drain (hereinafter referred to as a first terminal) of the transistor 101, and a first terminal (also referred to as a first electrode) of a capacitor 102 and a gate of the transistor 101. There is continuity between the other of the source or the drain (hereinafter referred to as a second terminal) of the transistor 101, and a second terminal (also referred to as a second electrode) of the capacitor 102 and the gate of the transistor 101. There is continuity between the first terminal (the first electrode) of the capacitor 102 and the gate and the first terminal of the transistor 101.

There is no continuity between a first terminal (or a first electrode) of a display element 105, and the second terminal of the transistor 101 and the second terminal of the capacitor 102. Preferably, there is no continuity between the first terminal (the first electrode) of the display element 105, and a terminal other than the second terminal of the transistor 101 and the second terminal of the capacitor 102, a wiring, or an electrode. Preferably, there is no continuity between a second terminal (or a second electrode) of the display element 105 and a wiring 106.

Alternatively, it is possible that there is no continuity between the first terminal of the display element 105 and the second terminal of the transistor 101, and instead, the potential of the wiring 106 is high and the display element 105 is reverse biased so that almost no current flows to the display element 105.

There is no continuity between a wiring 104 and the first terminal of the transistor 101. Moreover, there is no continuity between the wiring 104 and the first terminal (the first electrode) of the capacitor 102. Note that as illustrated in FIG. 1A, it is preferable that there be no continuity between the wiring 104 and a terminal other than the first terminal of the transistor 101 and the first terminal (the first electrode) of the capacitor 102, a wiring, or an electrode.

Note that an image signal, a predetermined voltage, or the like is applied to the transistor 101 or the capacitor 102 through the wiring 104 in some cases. Accordingly, the wiring 104 is sometimes referred to as a source signal line, an image signal line, a video signal line, or the like.

Note that before the connection structure illustrated in FIG. 1A is realized, that is, before variation in current characteristics such as mobility of the transistor 101 is compensated, it is preferable that a voltage corresponding to the threshold voltage of the transistor 101 be held in the capacitor 102. Further, an image signal (a video signal) is preferably input to the capacitor 102 through the wiring 104. Accordingly, the sum of the voltage corresponding to the threshold voltage of the transistor 101 and an image signal voltage is preferably held in the capacitor 102. Thus, in a state before the state in FIG. 1A is realized, that is, before variation in current characteristics such as mobility of the transistor 101 is compensated, it is preferable that there is continuity between the wiring 104 and at least one of the drain, the source, and the gate of the transistor 101, the first terminal and the second terminal of the capacitor 102, and the like, and that input operation of the image signal be already performed.

Note that the sum of the voltage corresponding to the threshold voltage of the transistor 101 and the image signal voltage is preferably held in the capacitor 102. Alternatively, it is possible that not the voltage corresponding to the threshold voltage of the transistor 101 but only the image signal voltage is held in the capacitor 102.

Note that when the voltage is held in the capacitor 102, it is possible that the voltage fluctuates slightly due to switching noise or the like. Note that a minor fluctuation is insignificant as long as the fluctuation is within the range that does not influence on actual operation. Accordingly, for example, when the sum of the voltage corresponding to the threshold voltage of the transistor 101 and the image signal voltage is input to the capacitor 102, the actual voltage held in the capacitor 102 is not completely the same as the voltage input, and the level of the voltage slightly differs due to influence of noise or the like in some cases. Note that a minor fluctuation is insignificant as long as the fluctuation is within the range that does not influence on actual operation.

Figure 1B:
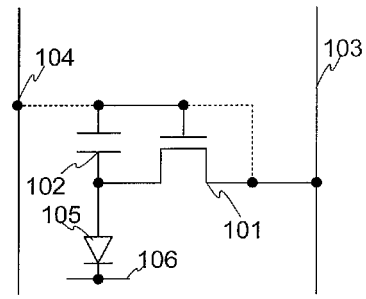

Next, FIG. 1B illustrates a circuit configuration in a period in which current is supplied to the display element 105 through the transistor 101. Note that the circuit configuration illustrated in FIG. 1B is a circuit configuration for supplying current to the display element 105 from the transistor 101, and in practice, the connection relation in the circuit configuration is realized by controlling on and off of a plurality of switches provided between the wirings.

There is continuity between the first terminal of the transistor 101 and a wiring 103. There is continuity between the second terminal of the transistor 101, and the first terminal of the display element 105 and the second terminal of the capacitor 102. There is no continuity between the first terminal of the transistor 101 and the gate of the transistor 101. There is continuity between the first terminal of the capacitor 102 and the gate of the transistor 101. There is continuity between the second terminal of the capacitor 102, and the second terminal of the transistor 101 and the first terminal of the display element 105. There is continuity between the second terminal of the display element 105 and the wiring 106.

There is no continuity between the wiring 104 and the first terminal of the transistor 101. Moreover, there is no continuity between the wiring 104 and the first terminal of the capacitor 102. Note that as illustrated in FIG. 1B, it is preferable that there be no continuity between the wiring 104 and a terminal other than the first terminal of the transistor 101 and the first terminal of the capacitor 102, a wiring, or an electrode.

In other words, at the time of transition from a period in which variation in current characteristics such as mobility of the transistor 101 is compensated (FIG. 1A) to a period in which current is supplied to the display element 105 through the transistor 101 (FIG. 1B), at least a conduction state between the first terminal of the transistor 101 and the gate of the transistor 101 and a conduction state between the second terminal of the transistor 101 and the first terminal of the display element 105 are changed. However, this embodiment is not limited thereto, and a conduction state of other portions can be changed. Then, an element such as a switch, a transistor, or a diode is preferably provided so that the conduction state can be controlled as described above. Accordingly, the conduction state is controlled by using the element, and a circuit configuration which realizes the connection states illustrated in FIGS. 1A and 1B can be realized. Therefore, as long as the connection states illustrated in FIGS. 1A and 1B can be realized, an element such as a switch, a transistor, or a diode can be provided freely without limitation on the number and the connection structure of the element.

Figure 2A:
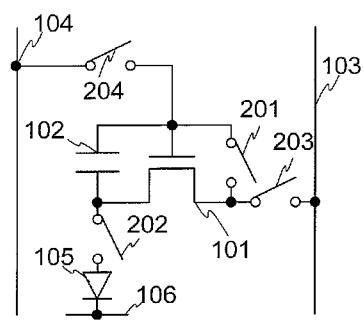
FIGS. 2A to 2D each illustrate a circuit or a driving method shown in an embodiment.

For example, as illustrated in FIG. 2A, a first terminal of a switch 201 is electrically connected to the gate of the transistor 101 and the first terminal of the capacitor 102. A second terminal of the switch 201 is electrically connected to the first terminal of the transistor 101. Moreover, a first terminal of a switch 202 is electrically connected to the second terminal of the transistor 101 and the second terminal of the capacitor 102. A second terminal of the switch 202 is electrically connected to the first terminal of the display element 105. Further, a first terminal of a switch 203 is electrically connected to the wiring 103. A second terminal of the switch 203 is electrically connected to the second terminal of the switch 201 and the first terminal of the transistor 101. A first terminal of a switch 204 is electrically connected to the first terminal of the switch 201, the gate of the transistor 101, and the first terminal of the capacitor 102. A second terminal of the switch 204 is electrically connected to the wiring 104. As thus described, the arrangement of four switches can realize the circuit configuration which realizes the connection states in FIGS. 1A and 1B.

Figure 2B:
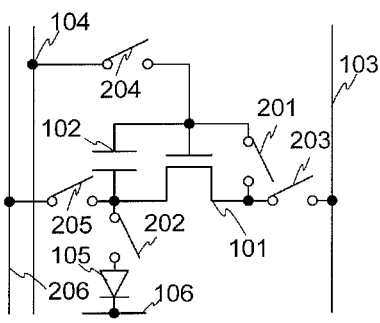
Figure 2C:
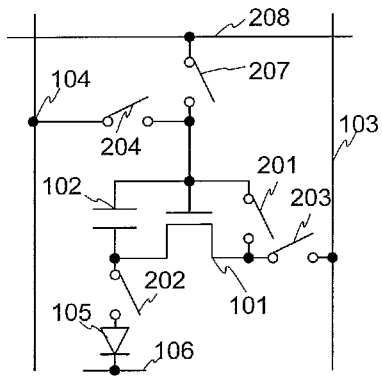
Figure 2D:
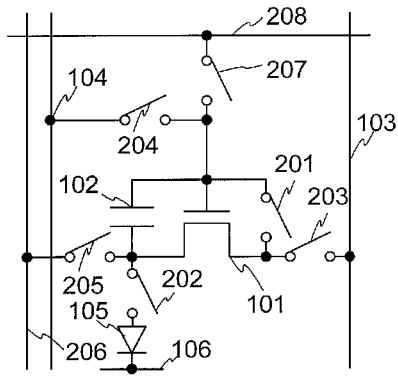

FIGS. 2B to 2D each illustrate an example different from that in FIG. 2A. FIG. 2B illustrates a configuration in which a switch 205 is additionally provided in the configuration in FIG. 2A and connection between a wiring 206 and the second terminal of the transistor 101 is controlled so that the potential of the second terminal of the transistor 101 is controlled. FIG. 2C illustrates a configuration in which a switch 207 is additionally provided in the configuration in FIG. 2A and connection between a wiring 208 and the gate of the transistor 101 is controlled so that the potential of the gate of the transistor 101 is controlled. FIG. 2D illustrates a configuration in which the switch 207 is additionally provided in the configuration in FIG. 2B and connection between the wiring 208 and the gate of the transistor 101 is controlled so that the potential of the gate and the potential of the second terminal of the transistor 101 are controlled. Moreover, by changing the potential of the wiring 206 or the wiring 208, for example, operation similar to that in FIG. 1A or FIG. 1B can be realized. Furthermore, if needed, a switch, a transistor, or the like is provided as appropriate.

Note that in the case of using the term "there is continuity between A and B", a variety of elements can be connected between A and B. For example, a resistor, a capacitor, a transistor, a diode, or the like can be connected in series or in parallel between A and B. Similarly, in the case of using the term "there is no continuity between A and B", a variety of elements can be connected between A and B. Since the term at least indicates that there is no continuity between A and B, a variety of elements can be connected between A and B. For example, an element such as a resistor, a capacitor, a transistor, or a diode can be connected in series or in parallel.

Next, an operation method will be described. Here, the operation method is described using the circuit in FIG. 2A; a similar operation method can be used for other circuits.

Figure 6A:
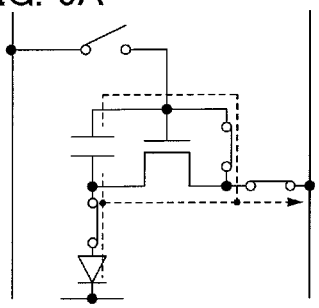
FIGS. 6A to 6E illustrate a circuit or a driving method shown in an embodiment.

First, initialization is performed as illustrated in FIG. 6A. This is operation in which the potential of the gate or the drain (or the source) of the transistor 101 is set to a predetermined potential. Accordingly, a state such that the transistor 101 is turned on can be obtained. Alternatively, a predetermined voltage is applied to the capacitor 102, so that electric charge is held in the capacitor 102. The switches 201, 202, and 203 are conducting and are on. Preferably, the switch 204 is not conducting and is off. Note that this embodiment is not limited thereto. Since it is preferable that current do not flow to the display element 105, a condition that enables this is preferable. Accordingly, it is preferable that at least one of the switches 201, 202, and 203 be not conducting and be off.

Note that in FIGS. 6A to 6E, dotted arrows are shown to facilitate understanding of movement of electric charge. Note that this embodiment is not limited to this example, and any potential relation with which predetermined driving is performed can be employed.

Figure 6B:
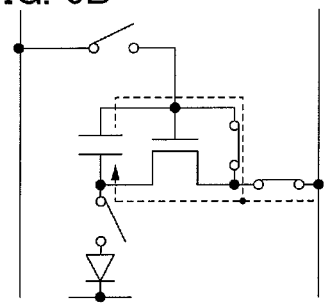

Next, as illustrated in FIG. 6B, the threshold voltage of the transistor 101 is obtained. The switches 201 and 203 are conducting and are on. Preferably, the switches 202 and 204 are not conducting and are off. Since the capacitor 102 holds the electric charge which has been stored in the period in FIG. 6A, the electric charge is discharged at that time. Accordingly, the potential of the gate of the transistor 101 is shifted from the potential based on the electric charge stored in the period in FIG. 6A towards the potential to which the threshold voltage (a positive value) of the transistor 101 is added. That is, the potential of the gate of the transistor 101 becomes close to a potential which is higher by the absolute value of the threshold voltage of the transistor 101. At that time, a voltage between the gate and the source of the transistor 101 becomes close to the threshold voltage of the transistor 101. Through such operation, the threshold voltage can be obtained between the opposite electrodes of the capacitor 102.

Note that when the electric charge in the capacitor 102 is discharged in this period, variation in length of the period is of little significance. This is because the electric charge is almost completely discharged as a certain time passes, so that variation in length of the period does not much affect the operation. Therefore, this operation can be performed by dot sequential driving, not by line sequential driving. Accordingly, a driver circuit can be realized with a simple configuration. Thus, when the circuit illustrated in FIG. 2A is considered as one pixel, it is possible to form a pixel portion in which the pixels are arranged in matrix and a driver circuit portion for supplying a signal to the pixel portion by using the same kind of transistors, or it is possible to form the pixel portion and the driver circuit portion over the same substrate. Note that this embodiment is not limited thereto. Line sequential driving can be employed, or the pixel portion and the driver circuit portion can be formed over different substrates.

Figure 6C:
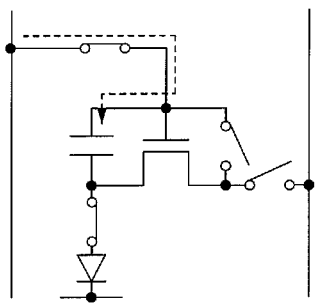

Next, as illustrated in FIG. 6C, an image signal is input. The switches 202 and 204 are conducting and are on. Preferably, the switches 201 and 203 are not conducting and are off. Then, an image signal is supplied from the wiring 104. Since the capacitor 102 holds the electric charge which has been stored in the period in FIG. 6B, additional electric charge is stored at that time. Accordingly, the potential of the gate of the transistor 101 is shifted from the potential of the image signal supplied from the wiring 104 towards the potential to which the threshold voltage (a positive value) of the transistor 101 is added. That is, the potential of the gate of the transistor 101 becomes close to a higher potential than the potential of the image signal supplied from the wiring 104 by the absolute value of the threshold voltage of the transistor 101. Through the operation in FIGS. 6B and 6C, the image signal can be input and the threshold voltage can be obtained.

Figure 25A:
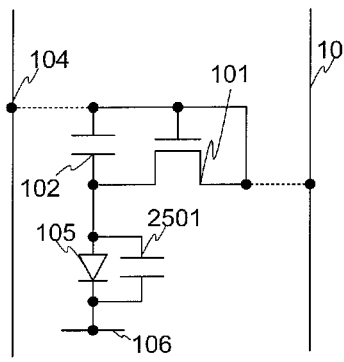
FIGS. 25A to 25F each illustrate a circuit or a driving method shown in an embodiment.
Figure 25B:
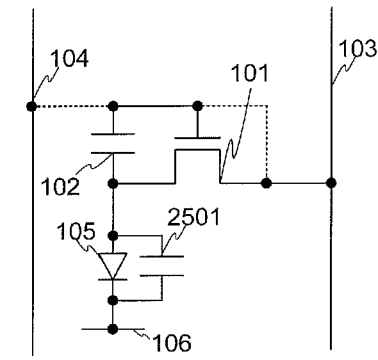

Alternatively, as illustrated in FIGS. 25A and 25B, a capacitor 2501 may be electrically placed in parallel with the display element 105. That is, as illustrated in FIGS. 25A and 25B, a first terminal of the capacitor 2501 is connected to the first terminal of the display element 105, and a second terminal of the capacitor 2501 is connected to the second terminal of the display element 105. FIG. 25A illustrates, in a manner similar to FIG. 1A, a conduction state and a non-conduction state between the wirings and elements in a period in which variation in current characteristics such as mobility of the transistor 101 is compensated. FIG. 25B illustrates, in a manner similar to FIG. 1B, a conduction state and a non-conduction state between the wirings and elements in a period in which current is supplied to the display element 105 through the transistor 101. With the circuit configuration in FIGS. 25A and 25B, the potential of the gate of the transistor 101 can be closer to the sum of the threshold voltage and the image signal voltage.

Figure 6D:
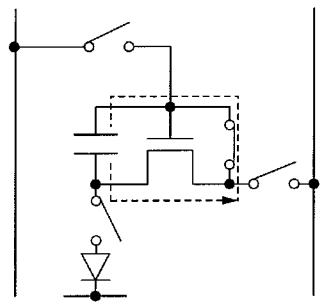

Next, as illustrated in FIG. 6D, variation in current characteristics such as mobility of the transistor 101 is compensated. This corresponds to the period in FIG. 1A or the like. The switch 201 is conducting and is on. Preferably, the switches 202, 203, and 204 are not conducting and are off. With such a state, the electric charge stored in the capacitor 102 is discharged through the transistor 101. In this manner, the electric charge is slightly discharged through the transistor 101, so that the influence of variation in current flowing to the transistor 101 can be reduced.

Figure 6E:
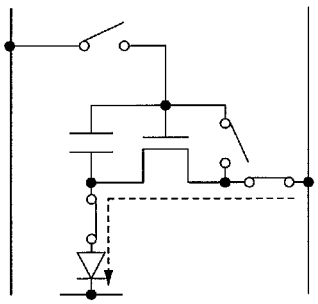

Next, as illustrated in FIG. 6E, current is supplied to the display element 105 through the transistor 101. This corresponds to the period in FIG. 1B or the like. Then, the switches 202 and 203 are conducting and are on. Preferably, the switches 201 and 204 are not conducting and are off. At that time, the voltage between the gate and the source of the transistor 101 is set to the voltage obtained by subtracting the voltage corresponding to current characteristics of the transistor 101 from the sum of the voltage corresponding to the threshold voltage and the image signal voltage. Thus, the influence of variation in current characteristics of the transistor 101 can be reduced, and the appropriate amount of current can be supplied to the display element 105.

As illustrated in FIGS. 6A to 6E, in the period in which variation in current characteristics such as mobility of the transistor 101 is compensated (FIG. 1A), variation in current characteristics such as mobility of the transistor 101 is reduced; thus, variation in current supplied to the display element 105 is also reduced in the period in which current is supplied to the display element 105 (FIG. 1B). As a result, variation in display state of the display element 105 can also be reduced, whereby display with higher quality can be obtained.

Note that the period in which current is supplied to the display element 105 (FIG. 1B) is preferably made to appear immediately after the period in which variation in current characteristics such as mobility of the transistor 101 is compensated (FIG. 1A). This is because the process is performed in the period in which current is supplied to the display element 105 (FIG. 1B) by using the gate potential (the electric charge held in the capacitor 102) of the transistor 101 obtained in the period in which current is supplied to the display element 105 (FIG. 1B). However, this embodiment is not limited to the timing in which the period in which current is supplied to the display element 105 (FIG. 1B) appears immediately after the period in which variation in current characteristics such as mobility of the transistor 101 is compensated (FIG. 1A). For example, in the case where the amount of electric charge in the capacitor 102 is changed in the period in which variation in current characteristics such as mobility of the transistor 101 is compensated (FIG. 1A) and the amount of electric charge in the capacitor 102, which is determined at the termination of the period, is not largely changed in the period in which current is supplied to the display element 105 (FIG. 1B), a period for another process may be provided between the period in which variation in current characteristics such as mobility of the transistor 101 is compensated (FIG. 1A) and the period in which current is supplied to the display element 105 (FIG. 1B).

Thus, it is preferable that the amount of electric charge held in the capacitor 102 at the termination of the period in which variation in current characteristics such as mobility of the transistor 101 is compensated be substantially the same as the amount of electric charge held in the capacitor 102 at the start of the period in which current is supplied to the display element 105. Note that the amount of electric charge may be slightly different between both these periods due to the influence of noise or the like. Specifically, the difference of the amount of electric charge in both these periods is preferably 10% or less, more preferably 3% or less. It is more preferable that the difference of the amount of electric charge is 3% or less, because human eyes cannot see the difference when a human watches a display element affected by the difference.

Figure 3A:
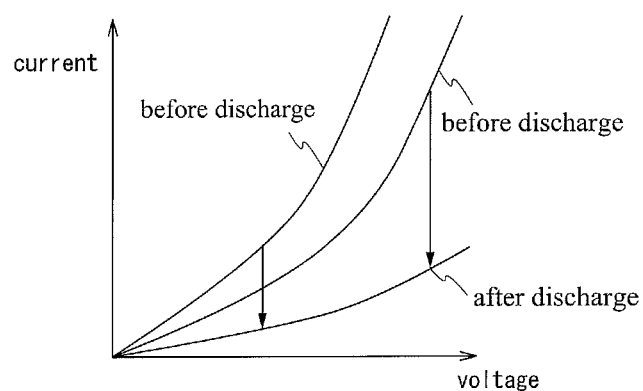
FIGS. 3A and 3B each illustrate operation shown in an embodiment.

FIG. 3A illustrates how a state of current-voltage characteristics changes in the period in which variation in current characteristics such as mobility of the transistor 101 is compensated (FIG. 1A). The electric charge held in the capacitor 102 is discharged through the source and the drain of the transistor 101 in the period in which variation in current characteristics such as mobility of the transistor 101 is compensated (FIG. 1A). Thus, the amount of electric charge held in the capacitor 102 is decreased, and the voltage held in the capacitor 102 is also decreased. Accordingly, the absolute value of the voltage between the gate and the source of the transistor 101 is also decreased. The electric charge held in the capacitor 102 is discharged through the transistor 101, so that the amount of electric charge to be discharged depends on the current characteristics of the transistor 101. In other words, the higher the mobility of the transistor 101 is, the larger the amount of charge is discharged. Alternatively, the larger the ratio (W/L) of channel width W to channel length L of the transistor 101 becomes, the larger the amount of electric charge is discharged. Alternatively, as the absolute value of the voltage between the gate and the source of the transistor 101 becomes larger (i.e., the absolute value of the voltage held in the capacitor 102 becomes larger), the larger amount of charge is discharged. Alternatively, the smaller the parasitic resistance in the source region and the drain region of the transistor 101 becomes, the larger the amount of charge is discharged. Alternatively, the smaller the resistance of an LDD region of the transistor 101 becomes, the larger the amount of charge is discharged. Further alternatively, the smaller the contact resistance of a contact hole which is electrically connected to the transistor 101 becomes, the larger the amount of charge is discharged.

Accordingly, a graph of current-voltage characteristics in a period before discharge, that is, a period before the period in which variation in current characteristics such as mobility of the transistor 101 is compensated (FIG. 1A) is changed to a curve with a gentle slope as a result of discharge of part of the electric charge held in the capacitor 102 in the period in which variation in current characteristics such as mobility of the transistor 101 is compensated (FIG. 1A). Then, for example, the difference of the graphs of current-voltage characteristics before and after the discharge becomes larger as the mobility of the transistor 101 is higher. Thus, when the mobility of the transistor 101 is high (i.e., when the slope of the graph is large), the amount of change of the slope is large after the discharge; whereas when the mobility of the transistor 101 is low (i.e., when the slope of the graph is small), the amount of change of the slope is small after the discharge. As a result, after the discharge, the difference of the graphs of current-voltage characteristic is small compared with the case where the transistor 101 has high mobility and the case where the transistor 101 has low mobility, whereby influence of variation in mobility can be reduced. Moreover, if the absolute value of the voltage between the gate and the source of the transistor 101 is larger (i.e., the absolute value of the voltage held in the capacitor 102 is larger), the larger amount of electric charge is discharged. On the other hand, if the abso-lute value of the voltage between the gate and the source of the transistor 101 is smaller (i.e., the absolute value of the voltage held in the capacitor 102 is smaller), the smaller amount of electric charge is discharged. Accordingly, variation in mobility can be reduced as more appropriate.

Figure 3B:
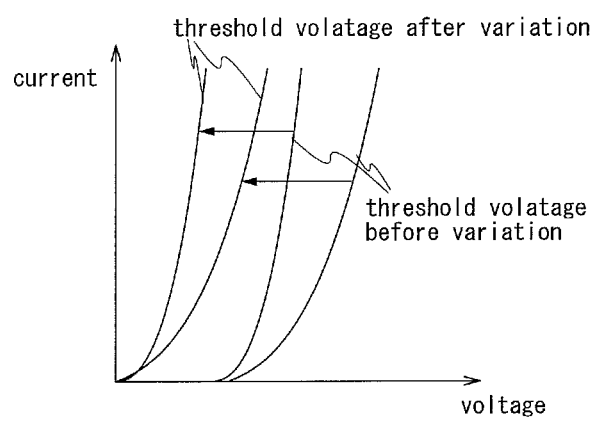

Note that FIG. 3A shows the graph of the case where influence of variation in threshold voltage is already reduced. Accordingly, as illustrated in FIG. 3B, the influence of variation in threshold voltage is reduced before the period in which variation in mobility of the transistor 101 is compensated (FIG. 1A). In order to reduce variation in threshold voltage, the graph of current-voltage characteristics is shifted in parallel by the threshold voltage. In other words, the sum of the image signal voltage and the threshold voltage is applied as the voltage between the gate and the source of the transistor. Thus, the influence of variation in threshold voltage is reduced. After variation in threshold voltage is reduced, variation in current characteristic of the transistor 101 can be largely reduced by reducing variation in mobility as illustrated in the graph in FIG. 3A.

Note that current characteristics of the transistor 101 whose variation can be compensated include not only the mobility of the transistor 101 but also the threshold voltage, parasitic resistance in the source portion or the drain portion, resistance of an LDD region, and contact resistance in a contact hole electrically connected to the transistor 101. Since electric charge is discharged through the transistor 101, variation in these current characteristics can also be reduced as in the case of variation in mobility.

Thus, the amount of electric charge in the capacitor 102 in a period before the discharge, that is, in a period before the period in which variation in current characteristics such as mobility of the transistor 101 is compensated (FIG. 1A) is larger than that at the termination of the period in which variation in current characteristics such as mobility of the transistor 101 is compensated (FIG. 1A). This is because in the period in which variation in current characteristics such as mobility of the transistor 101 is compensated (FIG. 1A), electric charge in the capacitor 102 is discharged, so that the amount of electric charge held in the capacitor 102 is reduced.

Note that the discharge of the electric charge held in the capacitor 102 is preferably stopped soon after part of the electric charge is discharged. If the electric charge is completely discharged, that is, if the electric charge is discharged until no current flows, information of an image signal is almost lost. Thus, it is preferable that the discharge be stopped before electric charge is completely discharged. In other words, the discharge is preferably stopped while current flows to the transistor 101.

Accordingly, when the length of one gate selection period (or one horizontal period, a value obtained by dividing one frame period by the number of rows of pixels, or the like) is compared with that of the period in which variation in current characteristics such as mobility of the transistor 101 is compensated (FIG. 1A), one gate selection period (or one horizontal period, a value obtained by dividing one frame period by the number of rows of pixels, or the like) is preferably longer than the period in FIG. 1A. This is because if electric charge is discharged for a longer period than one gate selection period, it is possible that the discharge is performed too much. Note that this embodiment is not limited thereto.

Alternatively, when the length of a period in which an image signal is input to a pixel is compared with that of the period in which variation in current characteristics such as mobility of the transistor 101 is compensated (FIG. 1A), the period in which an image signal is input to a pixel is preferably longer than the period in FIG. 1A. This is because if electric charge is discharged for a longer period than the period in which an image signal is input to a pixel, it is possible that the discharge is performed too much. Note that this embodiment is not limited thereto.

Alternatively, the length of a period in which the threshold voltage of the transistor is obtained is compared with that of the period in which variation in current characteristics such as mobility of the transistor 101 is compensated (FIG. 1A), the period in which the threshold voltage of the transistor is obtained is preferably longer than the period in FIG. 1A. This is because if electric charge is discharged for a longer period than the period in which the threshold voltage of the transistor is obtained, it is possible that the discharge is performed too much. Note that this embodiment is not limited thereto.

Note that in the period in which variation in current characteristics such as mobility of the transistor 101 is compensated (FIG. 1A), the length of the period in which the electric charge held in the capacitor 102 is discharged is preferably determined in accordance with the amount of variation in mobility of the transistor 101, the size of the capacitor 102, or W/L of the transistor 101, for example.

For example, the case where there are a plurality of circuits which are illustrated in any of FIGS. 1A to 1F or FIGS. 2A to 2D is considered. As an example, the circuit includes a first pixel for displaying a first color and a second pixel for displaying a second color. As a transistor corresponding to the transistor 101, the first pixel and the second pixel include a transistor 101A and a transistor 101B, respectively. Similarly, as a capacitor corresponding to the capacitor 102, the first pixel and the second pixel include a capacitor 102A and a capacitor 102B, respectively.

Moreover, when W/L of the transistor 101A is larger than W/L of the transistor 101B, the capacitance value of the capacitor 102A is preferably larger than the capacitance value of the capacitor 102B. This is because the amount of electric charge discharged from the transistor 101A is larger than that from the transistor 101B, so that change in voltage of the capacitor 102A is larger than that of the capacitor 102B. In order to adjust this, the capacitance value of the capacitor 102A is preferably larger. Alternatively, when the channel width W of the transistor 101A is larger than the channel width W of the transistor 101B, the capacitance value of the capacitor 102A is preferably larger than the capacitance value of the capacitor 102B. Alternatively, when the channel length L of the transistor 101A is smaller than the channel length L of the transistor 101B, the capacitance value of the capacitor 102A is preferably larger than the capacitance value of the capacitor 102B. Note that this embodiment is not limited thereto.

Figure 25C:
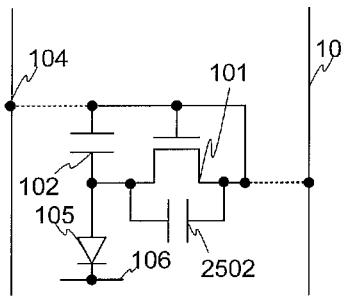
Figure 25D:
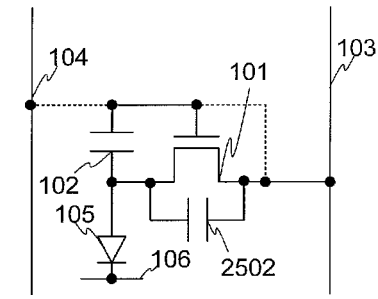

Note that a capacitor can be additionally provided in order to control the amount of discharge of electric charge held in the capacitor 102. For example, as described in FIGS. 25A and 25B, the capacitor 2501 which is electrically in parallel with the display element 105 may be added. Alternatively, a capacitor 2502 may be added between the first terminal and the second terminal of the transistor 101 so as to be electrically in parallel with the transistor 101. FIGS. 25C and 25D illustrate a circuit configuration in which the capacitor 2502 is added between the first terminal and the second terminal of the transistor 101 so as to be electrically in parallel with the transistor 101. FIG. 25C illustrates, in a manner similar to FIG. 1A, a conduction state and a non-conduction state between the wirings and elements in a period in which variation in current characteristics such as mobility of the transistor 101 is compensated. FIG. 25D illustrates, in a manner similar to FIG. 1B, a conduction state and a non-conduction state between the wirings and elements in a period in which current is supplied to the display element 105 through the transistor 101. Note that the capacitance value of the added capacitor in FIGS. 25A to 25D may be different among pixels.

Figure 1C:
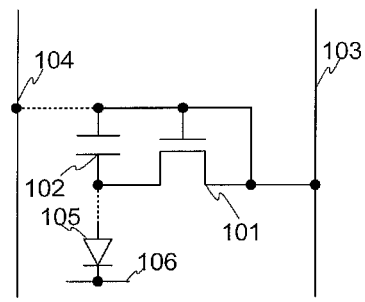
Figure 1D:
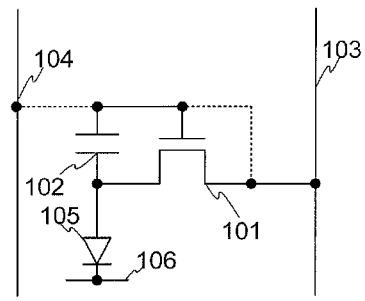
Figure 1E:
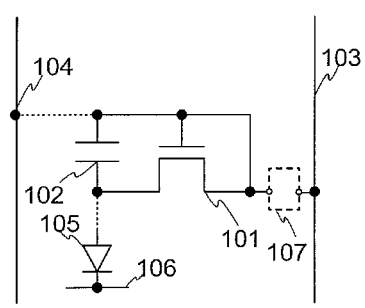
Figure 1F:
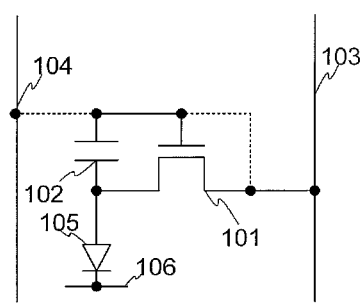
Figure 4A:
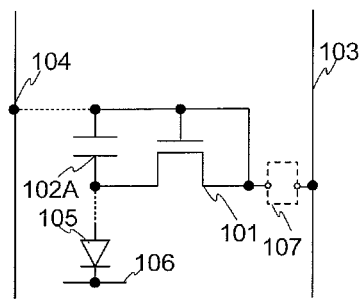
FIGS. 4A to 4F each illustrate a circuit or a driving method shown in an embodiment.
Figure 4B:
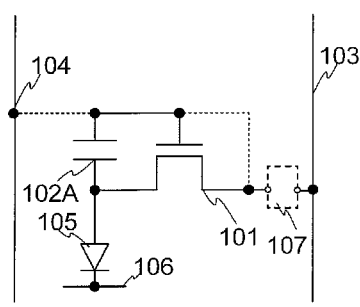
Figure 4C:
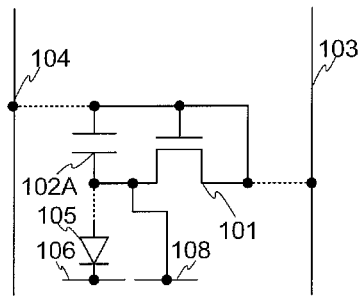
Figure 4D:
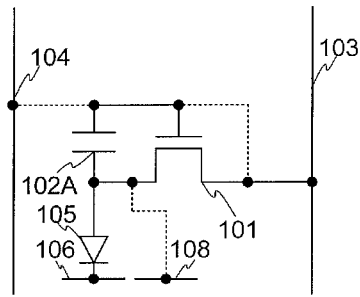
Figure 4E:
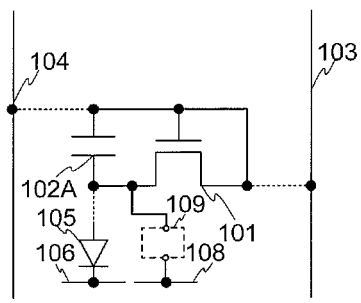
Figure 4F:
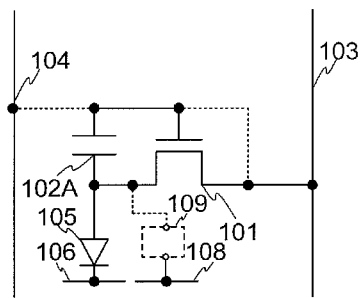
Figure 5A:
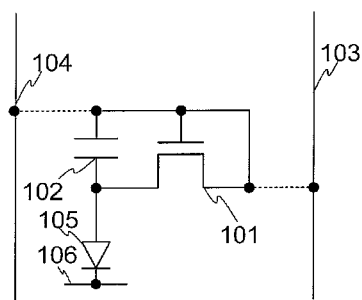
FIGS. 5A to 5D each illustrate a circuit or a driving method shown in an embodiment.
Figure 5B:
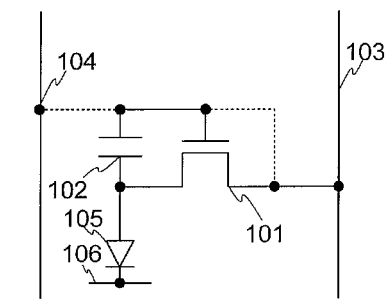
Figure 5C:
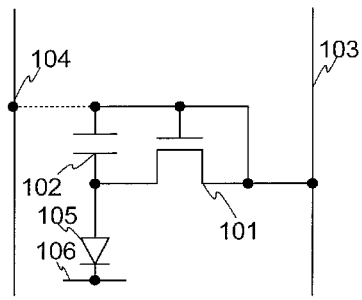
Figure 5D:
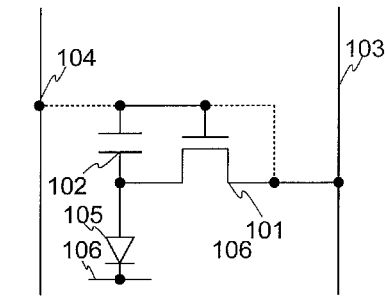

Note that the connection structure of the circuit is not limited to that in FIGS. 1A and 1B. As an example, in FIG. 1A, there is no continuity between the first terminal of the transistor 101 and the first terminal of the capacitor 102, and the wiring 103; and there is no continuity between the second terminal of the transistor 101 and the first terminal of the display element 105. However, this embodiment is not limited thereto. As an example, in FIG. 1B, there should be continuity between the wiring 103, which has a function of supplying a given potential, and the first terminal of the transistor 101; and there should be continuity between the second terminal of the transistor 101 and the first terminal of the display element 105. As other connection structures of the circuit, FIGS. 1C and 1D illustrate an example of the case where the first terminal of the transistor 101 is connected to the wiring 103. Moreover, FIGS. 1E and 1F illustrate an example of the case where the first terminal of the transistor 101 is connected to the wiring 103 through a circuit element 107 in the period in which variation in current characteristics such as mobility of the transistor 101 is compensated. FIGS. 4A and 4B illustrate an example of the case where the first terminal of the transistor 101 is connected to the wiring 103 through the circuit element 107 in the period in which variation in current characteristics such as mobility of the transistor 101 is compensated and the period in which current is supplied to the display element 105. FIGS. 4C and 4D illustrate an example of the case where a wiring 108 which has a function of supplying a given potential is connected to the second terminal of the transistor 101 so that there is continuity between the wiring 108 and the second terminal of the transistor 101 in the period in which variation in current characteristics such as mobility of the transistor 101 is compensated. FIGS. 4E and 4F illustrate an example of the case where the second terminal of the transistor 101 is connected to the wiring 108 through a circuit element 109 in the period in which variation in current characteristics such as mobility of the transistor 101 is compensated and the period in which current is supplied to the display element 105. FIGS. 5A and 5B illustrate an example of the case where the second terminal of the transistor 101 is connected to the wiring 106 through the display element 105 in the period in which variation in current characteristics such as mobility of the transistor 101 is compensated. FIGS. 5C and 5D illustrate an example of the case where the first terminal of the transistor 101 is connected to the wiring 103 and the second terminal of the transistor 101 is connected to the wiring 106 through the display element 105 in the period in which variation in current characteristics such as mobility of the transistor 101 is compensated.

Note that in FIGS. 1C to 1F, a switch can be provided as in FIGS. 2A to 2D.

Note that as the circuit elements 107 and 109, an element obtained by combining electrical elements such as a capacitor, a resistor, a diode, and a switch so that desired electrical connection is realized can be used.

Specifically, operation in FIGS. 1C and 1D can be realized through the operation such as initialization, as in FIGS. 6A to 6E.

FIGS. 9A to 9E illustrate the operation in FIGS. 1C and 1D. Specific operation can be realized through the operation such as initialization, as in FIGS. 6A to 6E.

The configuration illustrated in FIGS. 4C and 4D can be realized with the circuit configuration in FIG. 2B.

Note that in FIGS. 1A to 1F, FIGS. 2A to 2D, FIGS. 4A to 4F, and the like, a single capacitor is described as the capacitor 102; alternatively, a plurality of capacitors can be arranged in series or in parallel.

Figure 25E:
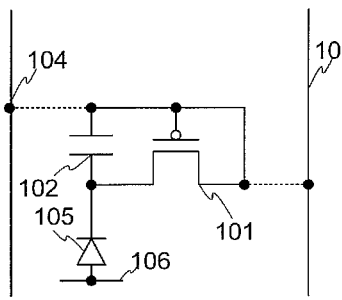
Figure 25F:
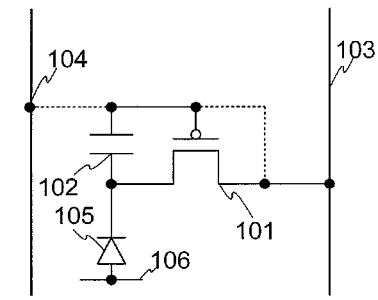

Note that in FIGS. 1A to 1F, FIGS. 2A to 2D, FIGS. 3A and 3B, FIGS. 4A to 4F, FIGS. 5A to 5D, and the like, the case where the transistor 101 is an n-channel transistor is described. Alternatively, a p-channel transistor can be used. As an example, FIGS. 25E and 25F illustrate the case where the transistor 101 is a p-channel transistor. FIG. 25E illustrates, in a manner similar to FIG. 1A, a conduction state and a non-conduction state between the wirings and elements in a period in which variation in current characteristics such as mobility of the transistor 101 is compensated. FIG. 25F illustrates, in a manner similar to FIG. 1B, a conduction state and a non-conduction state between the wirings and elements in a period in which current is supplied to the display element 105 through the transistor 101. In the case where a p-channel transistor is used as the transistor 101 as illustrated in FIGS. 25E and 25F, when an EL element is used as the display element 105, it is preferable to connect the EL element in a direction opposite to that in the case where an n-channel transistor is used.

Note that the transistor 101 often has the ability to control the amount of current flowing to the display element 105 and drive the display element 105.

The wiring 103 often has the ability to apply electric power to the display element 105. Alternatively, the wiring 103 often has the ability to supply current flowing to the transistor 101.

Note that the voltage corresponding to the threshold voltage of the transistor 101 is referred to a voltage which is the same level as the threshold voltage of transistor 101, or a voltage having a level close to the threshold voltage of transistor 101. For example, when the threshold voltage of the transistor 101 is high, the voltage corresponding to the threshold voltage is also high; whereas when the threshold voltage of the transistor 101 is low, the voltage corresponding to the threshold voltage is also low. As thus described, the voltage whose level is determined in accordance with the threshold voltage is referred to as the voltage corresponding to the threshold voltage. Accordingly, a voltage whose level is slightly different from that of the threshold voltage due to influence of noise or the like can also be referred to as the voltage corresponding to the threshold voltage.

Note that the display element 105 is an element having a function of changing the luminance, brightness, reflectivity, transmittance, or the like. Thus, as the display element 105, a liquid crystal element, a light-emitting element, an organic EL element, or an electrophoretic element can be used, for example. Note that in this embodiment and the accompanying drawing, description is made on the assumption that a light-emitting element such as an organic EL element is used.

Note that in this embodiment, what is illustrated in the drawing can be freely combined with or replaced with what is described in other embodiments as appropriate.

Embodiment 2

Next, in this embodiment, an application example of the circuit and the driving method which are described in Embodiment 1 will be described.

Figure 7A:
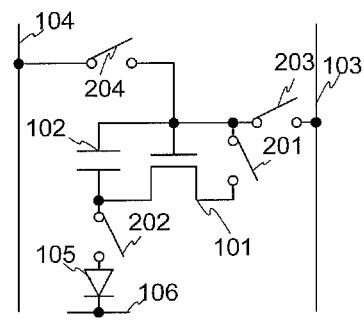
FIGS. 7A to 7D each illustrate a circuit or a driving method shown in an embodiment.

FIG. 7A illustrates a specific example of FIGS. 1A and 1B. The first terminal of the switch 201 is electrically connected to the gate of the transistor 101 and the first terminal of the capacitor 102. The second terminal of the switch 201 is electrically connected to the first terminal of the transistor 101. Moreover, the first terminal of the switch 202 is electrically connected to the second terminal of the transistor 101 and the second terminal of the capacitor 102. The second terminal of the switch 202 is electrically connected to the first terminal of the display element 105. Further, the first terminal of the switch 203 is electrically connected to the wiring 103. The second terminal of the switch 203 is electrically connected to the first terminal of the switch 201, the gate of the transistor 101, and the first terminal of the capacitor 102. The first terminal of the switch 204 is electrically connected to the first terminal of the switch 201, the second terminal of the switch 203, the gate of the transistor 101, and the first terminal of the capacitor 102. The second terminal of the switch 204 is electrically connected to the wiring 104. As thus described, the arrangement of four switches can realize the circuit configuration which realizes the connection states in FIGS. 1A and 1B (or FIGS. 4C and 4D).

Figure 7B:
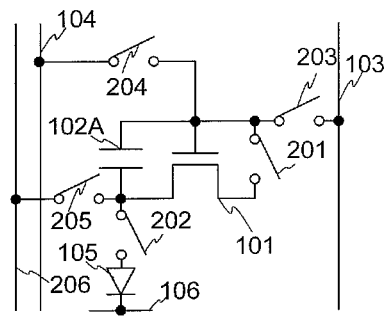
Figure 7C:
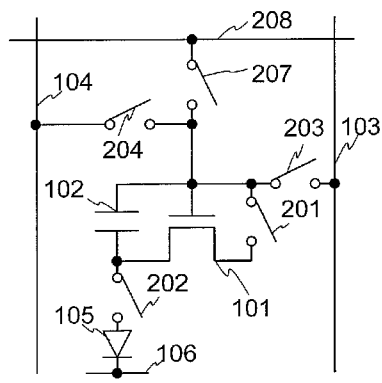
Figure 7D:
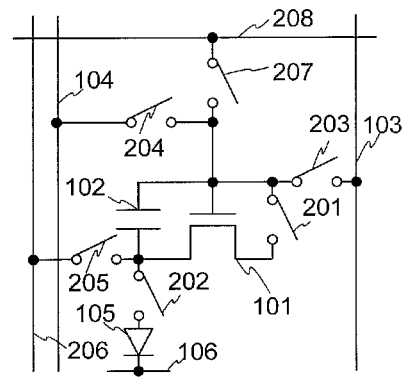

FIGS. 7B to 7D each illustrate an example different from that in FIG. 7A. FIG. 7B illustrates a configuration in which the switch 205 is additionally provided in the configuration in FIG. 7A and connection between the wiring 206 and the second terminal of the transistor 101 is controlled so that the potential of the second terminal of the transistor 101 is controlled. FIG. 7C illustrates a configuration in which the switch 207 is additionally provided in the configuration in FIG. 7A and connection between the wiring 208 and the gate of the transistor 101 is controlled so that the potential of the gate of the transistor 101 is controlled. FIG. 7D illustrates a configuration in which the switch 207 is additionally provided in the configuration in FIG. 7B and connection between the wiring 208 and the gate of the transistor 101 is controlled so that the potential of the gate and the potential of the second terminal of the transistor 101 are controlled. Moreover, by changing the potential of the wiring 206 or the wiring 208, for example, operation similar to that in FIG. 1A or FIG. 1B (or FIG. 4C or FIG. 4D) can be realized. Furthermore, if needed, a switch, a transistor, or the like is provided as appropriate.

Note that FIGS. 7A to 7D illustrate part of the examples of the structures described in Embodiment 1; other examples can also be realized in a similar manner.

Next, an operation method will be described. Here, the operation method is described using the circuit in FIG. 7A; a similar operation method can be used for other circuits.

Figure 8A:
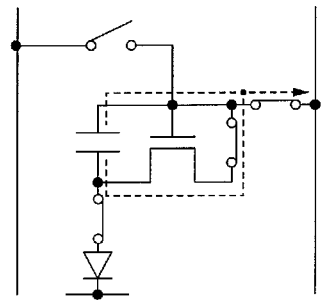
FIGS. 8A to 8E illustrate a circuit or a driving method shown in an embodiment.

First, initialization is performed as illustrated in FIG. 8A. This is operation in which the potential of the gate or the drain (or the source) of the transistor 101 is set to a predetermined potential. Accordingly, a state such that the transistor 101 is turned on can be obtained. Alternatively, a predetermined voltage is applied to the capacitor 102, so that electric charge is held in the capacitor 102. The switches 201, 202, and 203 are conducting and are on. Preferably, the switch 204 is not conducting and is off. Note that this embodiment is not limited thereto. Since it is preferable that current do not flow to the display element 105, a condition that enables this is preferable. Accordingly, it is preferable that at least one of the switches 201, 202, and 203 be not conducting and be off.

Note that in FIGS. 8A to 8E, dotted arrows are shown to facilitate understanding of movement of electric charge. Note that this embodiment is not limited to this example, and any potential relation with which predetermined driving is performed can be employed.

Figure 8B:
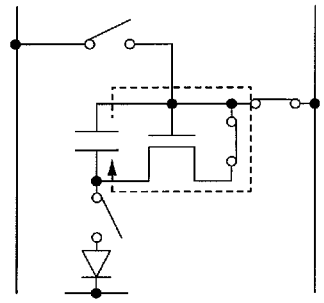

Next, as illustrated in FIG. 8B, the threshold voltage of the transistor 101 is obtained. The switches 201 and 203 are conducting and are on. Preferably, the switches 202 and 204 are not conducting and are off. Since the capacitor 102 stores the electric charge which has been stored in the period in FIG. 8A, the electric charge is discharged at that time. Accordingly, the potential of the gate of the transistor 101 is shifted from the potential based on the electric charge stored in the period in FIG. 8A towards the potential to which the threshold voltage (a positive value) of the transistor 101 is added. That is, the potential of the gate of the transistor 101 becomes close to a potential which is higher by the absolute value of the threshold voltage of the transistor 101. At that time, the voltage between the gate and the source of the transistor 101 becomes close to the threshold voltage of the transistor 101. Through such operation, the threshold voltage can be obtained between the opposite electrodes of the capacitor 102.

Note that when the electric charge in the capacitor 102 is discharged in this period, variation in length of the period is discharged is of little significance. This is because the electric charge is almost completely discharged as a certain time passes, so that variation in length of the period does not much affect the operation. Therefore, this operation can be performed by dot sequential driving, not by line sequential driving. Accordingly, a driver circuit can be realized with a simple configuration. Thus, when the circuit illustrated in FIG. 7A is considered as one pixel, it is possible to form a pixel portion in which the pixels are arranged in matrix and a driver circuit portion for supplying a signal to the pixel portion by using the same kind of transistors, or it is possible to form the pixel portion and the driver circuit portion over the same substrate. Note that this embodiment is not limited thereto. Line sequential driving can be employed, or the pixel portion and the driver circuit portion can be formed over different substrates.

Figure 8C:
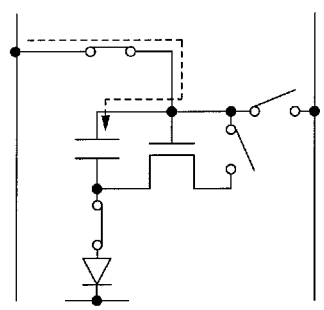

Next, as illustrated in FIG. 8C, an image signal is input. The switches 202 and 204 are conducting and are on. Preferably, the switches 201 and 203 are not conducting and are off. Then, an image signal is supplied from the wiring 104. Since the capacitor 102 holds the electric charge which has been stored in the period in FIG. 8B, additional electric charge is stored at that time. Accordingly, the potential of the gate of the transistor 101 is shifted from the potential of the image signal supplied from the wiring 104 towards the potential to which the threshold voltage (a positive value) of the transistor 101 is added. That is, the potential of the gate of the transistor 101 becomes close to a higher potential than the potential of the image signal supplied from the wiring 104 by the absolute value of the threshold voltage of the transistor 101. Through the operation in FIGS. 8B and 8C, the image signal can be input and the threshold voltage can be obtained.

Figure 8D:
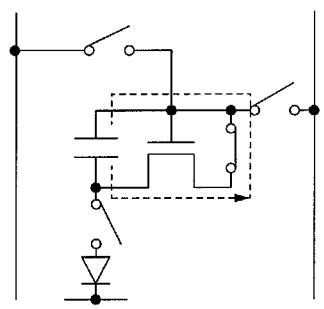

Next, as illustrated in FIG. 8D, variation in current characteristics such as mobility of the transistor 101 is compensated. This corresponds to the period in FIG. 1A, FIG. 4C, or the like. The switch 201 is conducting and is on. Preferably, the switches 202, 203, and 204 are not conducting and are off. With such a state, the electric charge stored in the capacitor 102 is discharged through the transistor 101. In this manner, the electric charge is slightly discharged through the transistor 101, so that the influence of variation in current flowing to the transistor 101 can be reduced.

Figure 8E:
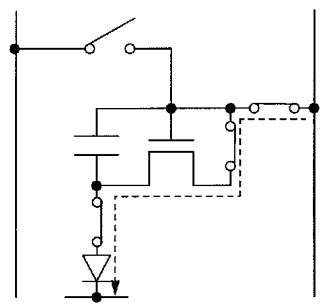
Figure 9A:
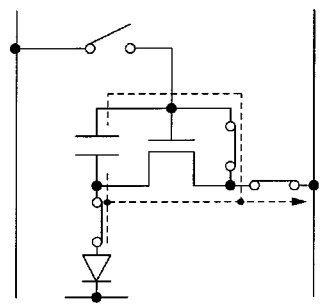
FIGS. 9A to 9E illustrate a circuit or a driving method shown in an embodiment.
Figure 9B:
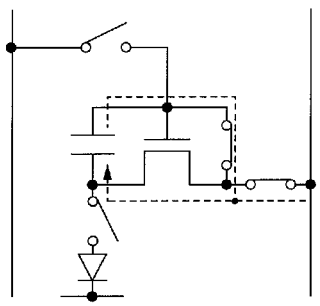
Figure 9C:
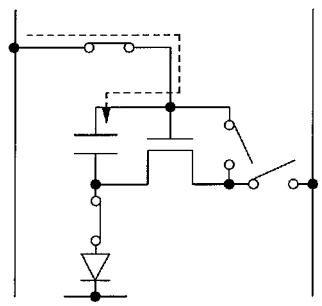
Figure 9D:
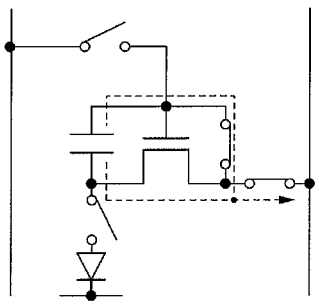
Figure 9E:
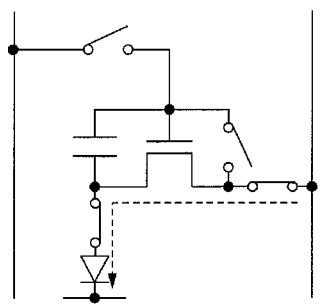
Figure 10A:
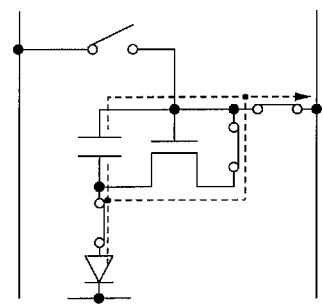
FIGS. 10A to 10E illustrate a circuit or a driving method shown in an embodiment.
Figure 10B:
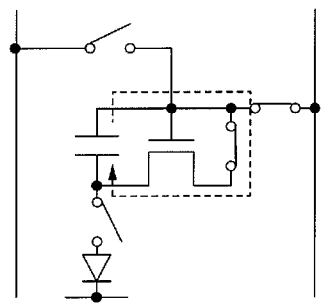
Figure 10C:
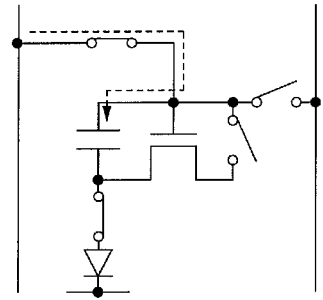
Figure 10D:
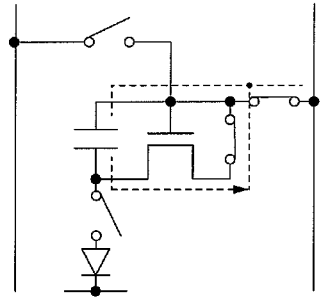
Figure 10E:
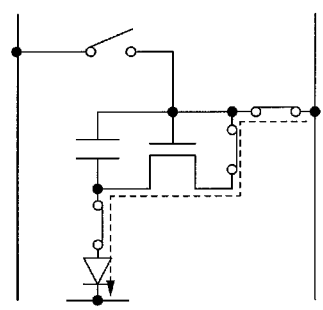

Next, as illustrated in FIG. 8E, current is supplied to the display element 105 through the transistor 101. This corresponds to the period in FIG. 1B, FIG. 4D, or the like. The switches 202 and 203 are conducting and are on. Preferably, the switches 201 and 204 are not conducting and are off. At that time, the voltage between the gate and the source of the transistor 101 is set to the voltage obtained by subtracting the voltage corresponding to current characteristics of the transistor 101 from the sum of the voltage corresponding to the threshold voltage and the image signal voltage. Thus, the influence of variation in current characteristics of the transistor 101 can be reduced, and the appropriate amount of current can be supplied to the display element 105.

As illustrated in FIGS. 8A to 8E, in the period in which variation in current characteristics such as mobility of the transistor 101 is compensated (FIG. 1A), variation in current characteristics such as mobility of the transistor 101 is reduced; thus, variation in current supplied to the display element 105 is also reduced in the period in which current is supplied to the display element 105 (FIG. 1B or FIG. 4D). As a result, variation in display state of the display element 105 can also be reduced, whereby display with higher quality can be obtained.

In the case of employing the circuit configuration in FIG. 7B, the potential of the second terminal of the transistor 101 can be controlled in the initialization period illustrated in FIG. 8A. Preferably, the switches 201, 203, and 205 are conducting and are on. Preferably, the switches 202 and 204 are not conducting and are off. Note that the operations in FIG. 8B and drawings that follow FIG. 8B can be similar to those described above.

In the case of employing the circuit configuration in FIG. 7C, the potential of the gate of the transistor 101 can be controlled in the initialization period illustrated in FIG. 8A. Preferably, the switches 201, 202, and 207 are conducting and are on. Preferably, the switches 203 and 204 are not conducting and are off. Note that the operations in FIG. 8B and the following drawings can be similar to those described above.

In the case of employing the circuit configuration in FIG. 7D, the potential of the gate and/or the potential of the second terminal of the transistor 101 can be controlled in the initialization period illustrated in FIG. 8A. Preferably, the switches 201, 205, and 207 are conducting and are on. Preferably, the switches 202, 203, and 204 are not conducting and are off. Note that the operations in FIG. 8B and the following drawings can be similar to those described above.

Note that in FIGS. 8A to 8E, another operation or another period can be provided between the operations, that is, when one operation is shifted to the next operation. For example, the state illustrated in FIG. 8C may be provided between the period in FIG. 8A and the period in FIG. 8B. Since there is no harm providing such a period, a problem does not occur.

FIGS. 10A to 10E illustrate the operation in FIGS. 1C and 1D. Specific operation can be realized through the operation such as initialization, as in FIGS. 8A to 8E.

Note that in this embodiment, what is illustrated in the drawing can be freely combined with or replaced with what is described in other embodiments as appropriate.

Embodiment 3

Next, in this embodiment, an application example of the circuit and the driving method which are described in Embodiment 1 will be described.

Figure 11A:
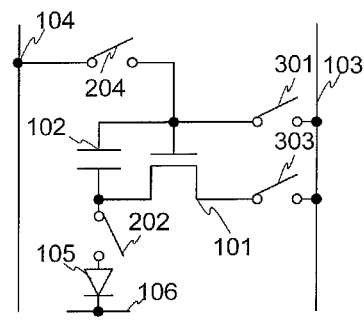
FIGS. 11A to 11D each illustrate a circuit or a driving method shown in an embodiment.

FIG. 11A illustrates a specific example of FIGS. 1C and 1D. A first terminal of a switch 301 is electrically connected to the wiring 103. A second terminal of the switch 301 is electrically connected to the gate of the transistor 101 and the first terminal of the capacitor 102. The first terminal of the switch 202 is electrically connected to the second terminal of the transistor 101 and the second terminal of the capacitor 102. The second terminal of the switch 202 is electrically connected to the first terminal of the display element 105. Further, a first terminal of a switch 303 is electrically connected to the wiring 103. A second terminal of the switch 203 is electrically connected to the first terminal of the transistor 101. The first terminal of the switch 204 is electrically connected to the second terminal of the switch 301, the gate of the transistor 101, and the first terminal of the capacitor 102. The second terminal of the switch 204 is electrically connected to the wiring 104. As thus described, the arrangement of four switches can realize the circuit configuration which realizes the connection states in FIGS. 1C and 1D.

Figure 11B:
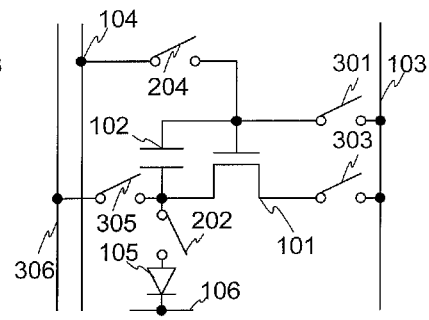
Figure 11C:
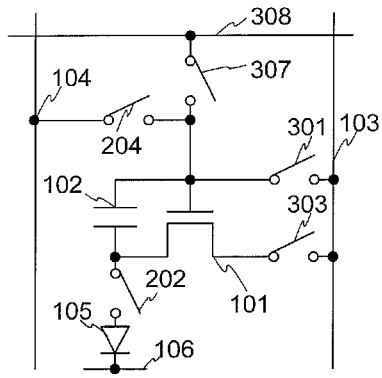
Figure 11D:
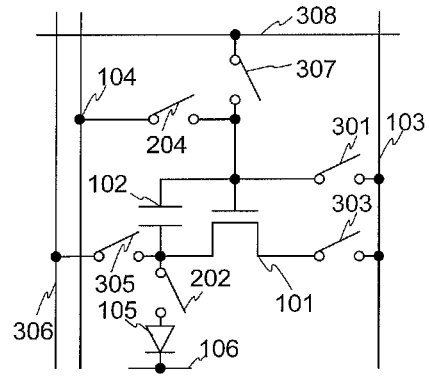

FIGS. 11B to 11D each illustrate an example different from that in FIG. 11A. FIG. 11B illustrates a configuration in which a switch 305 is additionally provided in FIG. 11A and connection between a wiring 306 and the second terminal of the transistor 101 is controlled so that the potential of the second terminal of the transistor 101 is controlled. FIG. 11C illustrates a configuration in which a switch 307 is additionally provided in FIG. 11A and connection between a wiring 308 and the gate of the transistor 101 is controlled so that the potential of the gate of the transistor 101 is controlled. FIG. 11D illustrates a configuration in which the switch 307 is additionally provided in FIG. 11B and connection between the wiring 308 and the gate of the transistor 101 is controlled so that the potential of the gate and the potential of the second terminal of the transistor 101 are controlled. Moreover, by changing the potential of the wiring 306 or the wiring 308, for example, operation similar to that in FIG. 1C or FIG. 1D can be realized. Furthermore, if needed, a switch, a transistor, or the like is provided as appropriate.

Note that FIGS. 11A to 11D illustrate part of the examples of the structures described in Embodiment 1; other examples can also be realized in a similar manner.

Next, an operation method will be described. Here, the operation method is described using the circuit in FIG. 11A; a similar operation method can be used for other circuits.

Figure 12A:
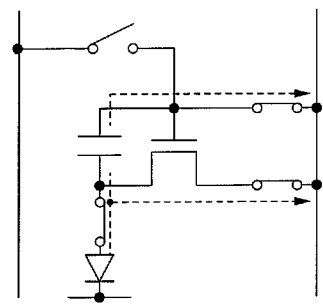
FIGS. 12A to 12E illustrate a circuit or a driving method shown in an embodiment.

First, initialization is performed as illustrated in FIG. 12A. This is operation in which the potential of the gate or the drain (or the source) of the transistor 101 is set to a predetermined potential. Accordingly, a state such that the transistor 101 is turned on can be obtained. Alternatively, a predetermined voltage is applied to the capacitor 102, so that electric charge is held in the capacitor 102. The switches 301, 202, and 303 are conducting and are on. Preferably, the switch 204 is not conducting and is off. Note that this embodiment is not limited thereto. Since it is preferable that current do not flow to the display element 105, a condition that enables this is preferable. Accordingly, it is preferable that at least one of the switches 301, 202, and 303 be not conducting and be off.

Note that in FIGS. 12A to 12E, dotted arrows are shown to facilitate understanding of movement of electric charge. Note that this embodiment is not limited to this example, and any potential relation with which predetermined driving is performed can be employed.

Figure 12B:
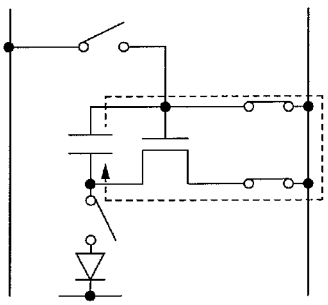

Next, as illustrated in FIG. 12B, the threshold voltage of the transistor 101 is obtained. The switches 301 and 303 are conducting and are on. Preferably, the switches 202 and 204 are not conducting and are off. Since the capacitor 102 holds the electric charge which has been stored in the period in FIG. 12A, the electric charge is discharged at that time. Accordingly, the potential of the gate of the transistor 101 is shifted from the potential based on the electric charge stored in the period in FIG. 12A towards the potential to which the threshold voltage (a positive value) of the transistor 101 is added. That is, the potential of the gate of the transistor 101 becomes close to a potential which is higher by the absolute value of the threshold voltage of the transistor 101. At that time, the voltage between the gate and the source of the transistor 101 becomes close to the threshold voltage of the transistor 101. Through such operation, the threshold voltage can be obtained between the opposite electrodes of the capacitor 102.

Note that when the electric charge in the capacitor 102 is discharged in this period, variation in length of the period is of little significance. This is because the electric charge is almost completely discharged as a certain time passes, so that variation in length of the period does not much affect the operation. Therefore, this operation can be performed by dot sequential driving, not by line sequential driving. Accordingly, a driver circuit can be realized with a simple configuration. Thus, when the circuit illustrated in FIG. 11A is considered as one pixel, it is possible to form a pixel portion in which the pixels are arranged in matrix and a driver circuit portion for supplying a signal to the pixel portion by using the same kind of transistors, or it is possible to form the pixel portion and the driver circuit portion over the same substrate. Note that this embodiment is not limited thereto. Line sequential driving can be employed, or the pixel portion and the driver circuit portion can be formed over different substrates.

Figure 12C:
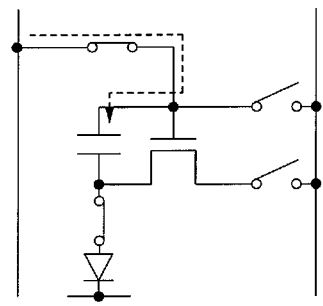

Next, as illustrated in FIG. 12C, an image signal is input. The switches 202 and 204 are conducting and are on. Preferably, the switches 301 and 303 are not conducting and are off. Then, an image signal is supplied from the wiring 104. Since the capacitor 102 holds the electric charge which has been stored in the period in FIG. 12B, additional electric charge is stored at that time. Accordingly, the potential of the gate of the transistor 101 is shifted from the potential of the image signal supplied from the wiring 104 towards the potential to which the threshold voltage (a positive value) of the transistor 101 is added. That is, the potential of the gate of the transistor 101 becomes close to a higher potential than the potential of the image signal supplied from the wiring 104 by the absolute value of the threshold voltage of the transistor 101. Through the operation in FIGS. 12B and 12C, the image signal can be input and the threshold voltage can be obtained.

Figure 12D:
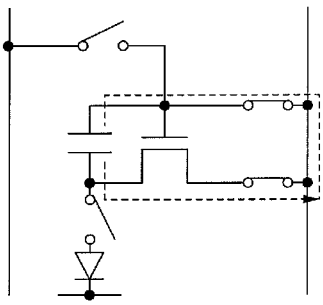

Next, as illustrated in FIG. 12D, variation in current characteristics such as mobility of the transistor 101 is compensated. This corresponds to the period in FIG. 1C or the like. The switches 301 and 303 are conducting and are on. Preferably, the switches 202 and 204 are not conducting and are off. With such a state, the electric charge stored in the capacitor 102 is discharged through the transistor 101. In this manner, the electric charge is slightly discharged through the transistor 101, so that the influence of variation in current flowing to the transistor 101 can be reduced.

Figure 12E:
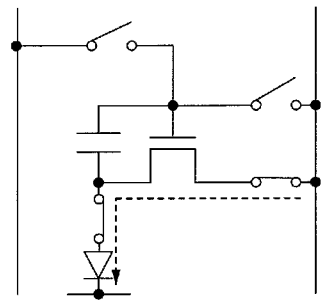

Next, as illustrated in FIG. 12E, current is supplied to the display element 105 through the transistor 101. This corresponds to the period in FIG. 1D or the like. The switches 202 and 303 are conducting and are on. Preferably, the switches 301 and 204 are not conducting and are off. At that time, the voltage between the gate and the source of the transistor 101 is set to the voltage obtained by subtracting the voltage corresponding to current characteristics of the transistor 101 from the sum of the voltage corresponding to the threshold voltage and the image signal voltage. Thus, the influence of variation in current characteristics of the transistor 101 can be reduced, and the appropriate amount of current can be supplied to the display element 105.

As illustrated in FIGS. 12A to 12E, in the period in which variation in current characteristics such as mobility of the transistor 101 is compensated (FIG. 1C), variation in current characteristics such as mobility of the transistor 101 is reduced; thus, variation in current supplied to the display element 105 is also reduced in the period in which current is supplied to the display element 105 (FIG. 1D). As a result, variation in display state of the display element 105 can also be reduced, whereby display with higher quality can be obtained.

In the case of employing the circuit configuration in FIG. 11B, the potential of the second terminal of the transistor 101 can be controlled in the initialization period illustrated in FIG. 12A. Preferably, the switches 301, 303, and 305 are conducting and are on. Preferably, the switches 202 and 204 are not conducting and are off. Note that the operations in FIG. 12B and drawings that follow FIG. 12B can be similar to those described above.

In the case of employing the circuit configuration in FIG. 11C, the potential of the gate of the transistor 101 can be controlled in the initialization period illustrated in FIG. 12A. Preferably, the switches 202, 303, and 307 are conducting and are on. Preferably, the switches 301 and 204 are not conducting and are off. Note that the operations in FIG. 12B and the following drawings can be similar to those described above.

In the case of employing the circuit configuration in FIG. 11D, the potential of the gate and/or the potential of the second terminal of the transistor 101 can be controlled in the initialization period illustrated in FIG. 12A. Preferably, the switches 303, 305, and 307 are conducting and are on. Preferably, the switches 202, 203, and 204 are not conducting and are off. Note that the operations in FIG. 12B and the following drawings can be similar to those described above.

Note that in FIGS. 12A to 12E, another operation or another period can be provided between the operations, that is, when one operation is shifted to the next operation. For example, the state illustrated in FIG. 12C may be provided between the period in FIG. 12A and the period in FIG. 12B. Since there is no harm providing such a period, a problem does not occur.

Note that in this embodiment, what is illustrated in the drawing can be freely combined with or replaced with what is described in other embodiments as appropriate.

Embodiment 4

Next, in this embodiment, an application example of the circuit and the driving method which are described in Embodiment 1 will be described.

Figure 13A:
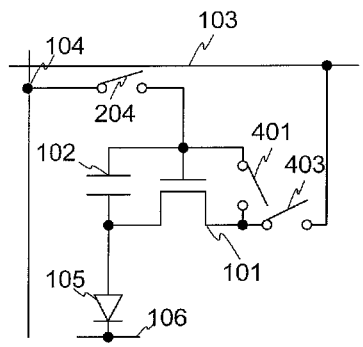
FIGS. 13A to 13D each illustrate a circuit or a driving method shown in an embodiment.

FIG. 13A illustrates a specific example of FIGS. 5A and 5B. A first terminal of a switch 401 is electrically connected to the gate of the transistor 101 and the first terminal of the capacitor 102. A second terminal of the switch 401 is electrically connected to the first terminal of the transistor 101 and a second terminal of a switch 403. Further, a first terminal of the switch 403 is electrically connected to the wiring 103. The second terminal of the switch 403 is electrically connected to the first terminal of the transistor 101 and the second terminal of the switch 401. The first terminal of the switch 204 is electrically connected to the first terminal of the switch 401, the gate of the transistor 101, and the first terminal of the capacitor 102. The second terminal of the switch 204 is electrically connected to the wiring 104. As thus described, the arrangement of four switches can realize the circuit configuration which realizes the connection states in FIGS. 5A and 5B.

Figure 13B:
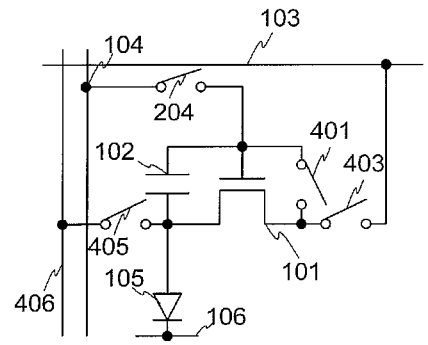
Figure 13C:
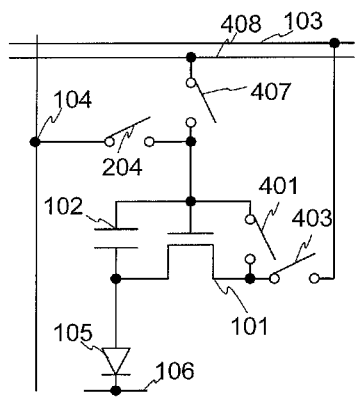
Figure 13D:
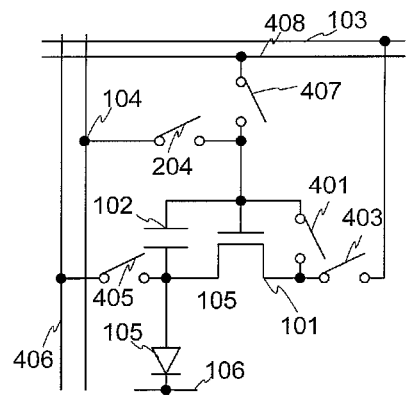

FIGS. 13B to 13D each illustrate an example different from that in FIG. 13A. FIG. 13B illustrates a configuration in which a switch 405 is additionally provided in the configuration in FIG. 13A and connection between a wiring 406 and the second terminal of the transistor 101 is controlled so that the potential of the second terminal of the transistor 101 is controlled. FIG. 13C illustrates a configuration in which a switch 407 is additionally provided in the configuration in FIG. 13A and connection between a wiring 408 and the gate of the transistor 101 is controlled so that the potential of the gate of the transistor 101 is controlled. FIG. 13D illustrates a configuration in which the switch 407 is additionally provided in the configuration in FIG. 13B and connection between the wiring 408 and the gate of the transistor 101 is controlled so that the potential of the gate and the potential of the second terminal of the transistor 101 are controlled. Moreover, by changing the potential of the wiring 406 or the wiring 408, for example, operation similar to that in FIG. 5A or FIG. 5B can be realized. Furthermore, if needed, a switch, a transistor, or the like is provided as appropriate.

Note that FIGS. 13A to 13D illustrate part of the examples of the structures described in Embodiment 1; other examples can also be realized in a similar manner.

Next, an operation method will be described. Here, the operation method is described using the circuit in FIG. 13A; a similar operation method can be used for other circuits.

Figure 14A:
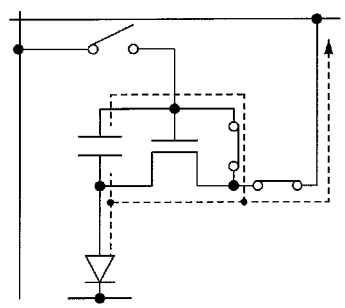
FIGS. 14A to 14E illustrate a circuit or a driving method shown in an embodiment.

First, initialization is performed as illustrated in FIG. 14A. This is operation in which the potential of the gate or the drain (or the source) of the transistor 101 is set to a predetermined potential. Accordingly, a state such that the transistor 101 is turned on can be obtained. Alternatively, a predetermined voltage is applied to the capacitor 102, so that electric charge is held in the capacitor 102. The switches 401 and 403 are conducting and are on. Preferably, the switch 204 is not conducting and is off. Moreover, in the initialization period in FIG. 14A, the potential of the wiring 103 is preferably lower than potentials of other wirings. Note that this embodiment is not limited thereto. Since it is preferable that current do not flow to the display element 105, a condition that enables this is preferable. Accordingly, it is preferable that at least a voltage applied to the light-emitting element be a reverse bias.

Note that in FIGS. 14A to 14E, dotted arrows are shown to facilitate understanding of movement of electric charge. Note that this embodiment is not limited to this example, and any potential relation with which predetermined driving is performed can be employed.

Figure 14B:
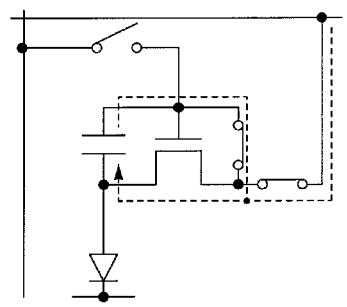

Next, as illustrated in FIG. 14B, the threshold voltage of the transistor 101 is obtained. The switches 401 and 403 are conducting and are on. Preferably, the switch 204 is not conducting and is off. Moreover, in the period in FIG. 14B for obtaining the threshold voltage of the transistor 101, the potential of the wiring 103 is preferably higher than that in the initialization period. Since the capacitor 102 holds the electric charge which has been stored in the period in FIG. 14A, the electric charge is discharged at that time. Accordingly, the potential of the gate of the transistor 101 is shifted from the potential based on the electric charge stored in the period in FIG. 14A towards the potential to which the threshold voltage (a positive value) of the transistor 101 is added. That is, the potential of the gate of the transistor 101 becomes close to a potential which is higher by the absolute value of the threshold voltage of the transistor 101. At that time, the voltage between the gate and the source of the transistor 101 becomes close to the threshold voltage of the transistor 101. Through such operation, the threshold voltage can be obtained between the opposite electrodes of the capacitor 102.

Note that when the electric charge in the capacitor 102 is discharged in this period, variation in length of the period is of little significance. This is because the electric charge is almost completely discharged as a certain time passes, so that variation in length of the period does not much affect the operation. Therefore, this operation can be performed by dot sequential driving, not by line sequential driving. Accordingly, a driver circuit can be realized with a simple configuration. Thus, when the circuit illustrated in FIG. 13A is considered as one pixel, it is possible to form a pixel portion in which the pixels are arranged in matrix and a driver circuit portion for supplying a signal to the pixel portion by using the same kind of transistors, or it is possible to form the pixel portion and the driver circuit portion over the same substrate. Note that this embodiment is not limited thereto. Line sequential driving can be employed, or the pixel portion and the driver circuit portion can be formed over different substrates.

Figure 14C:
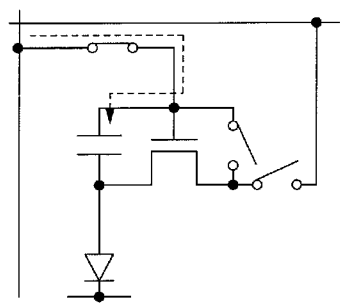

Next, as illustrated in FIG. 14C, an image signal is input. The switch 204 is conducting and is on. Preferably, the switches 401 and 403 are not conducting and are off. Moreover, in the period in FIG. 14C for inputting an image signal, the potential of the wiring 103 is preferably higher than potentials input to other wirings. Then, an image signal is supplied from the wiring 104. Since the capacitor 102 holds the electric charge which has been stored in the period in FIG. 14B, additional electric charge is stored at that time. Accordingly, the potential of the gate of the transistor 101 is shifted from the potential of the image signal supplied from the wiring 104 towards the potential to which the threshold voltage (a positive value) of the transistor 101 is added. That is, the potential of the gate of the transistor 101 becomes close to a higher potential than the potential of the image signal supplied from the wiring 104 by the absolute value of the threshold voltage of the transistor 101. Through the operation in FIGS. 14B and 14C, the image signal can be input and the threshold voltage can be obtained.

Figure 14D:
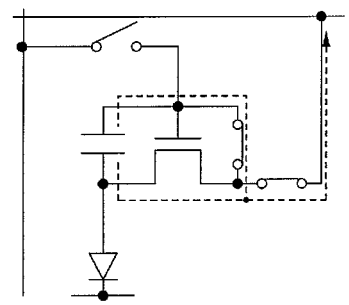

Next, as illustrated in FIG. 14D, variation in current characteristics such as mobility of the transistor 101 is compensated. This corresponds to the period in FIG. 5A or the like. The switches 401 and 403 are conducting and are on. Preferably, the switch 204 is not conducting and is off. Moreover, in the period in FIG. 14D for compensating variation in current characteristics such as mobility of the transistor 101, the potential of the wiring 103 is preferably higher than potentials input to other wirings. With such a state, the electric charge stored in the capacitor 102 is discharged through the transistor 101. In this manner, the electric charge is slightly discharged through the transistor 101, so that the influence of variation in current flowing to the transistor 101 can be reduced.

Figure 14E:
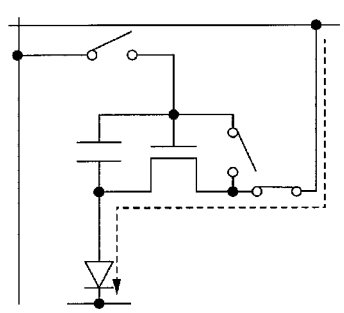

Next, as illustrated in FIG. 14E, current is supplied to the display element 105 through the transistor 101. This corresponds to the period in FIG. 5B or the like. The switch 403 is conducting and is on. Preferably, the switches 401 and 204 are not conducting and are off. Moreover, in the period in FIG. 14E for supplying current to the display element 105 through the transistor 101, the potential of the wiring 103 is preferably higher than potentials input to other wirings. At that time, the voltage between the gate and the source of the transistor 101 is set to the voltage obtained by subtracting the voltage corresponding to current characteristics of the transistor 101 from the sum of the voltage corresponding to the threshold voltage and the image signal voltage. Thus, the influence of variation in current characteristics of the transistor 101 can be reduced, and the appropriate amount of current can be supplied to the display element 105.

As illustrated in FIGS. 14A to 14E, in the period in which variation in current characteristics such as mobility of the transistor 101 is compensated (FIG. 5A), variation in current characteristics such as mobility of the transistor 101 is reduced; thus, variation in current supplied to the display element 105 is also reduced in the period in which current is supplied to the display element 105 (FIG. 5B). As a result, variation in display state of the display element 105 can also be reduced, whereby display with higher quality can be obtained.

In the case of employing the circuit configuration in FIG. 13B, the potential of the second terminal of the transistor 101 can be controlled in the initialization period illustrated in FIG. 14A. Preferably, the switches 401, 403, and 405 are conducting and are on. Preferably, the switch 204 is not conducting and is off. Note that the operations in FIG. 14B and drawings that follow FIG. 14B can be similar to those described above.

In the case of employing the circuit configuration in FIG. 13C, the potential of the gate of the transistor 101 can be controlled in the initialization period illustrated in FIG. 14A. Preferably, the switches 403 and 407 are conducting and are on. Preferably, the switches 401 and 204 are not conducting and are off Note that the operations in FIG. 14B and the following drawings can be similar to those described above.

In the case of employing the circuit configuration in FIG. 13D, the potential of the gate and/or the potential of the second terminal of the transistor 101 can be controlled in the initialization period illustrated in FIG. 14A. Preferably, the switches 403, 405, and 407 are conducting and are on. Preferably, the switches 401 and 204 are not conducting and are off. Note that the operations in FIG. 14B and the following drawings can be similar to those described above.

Note that in FIGS. 14A to 14E, another operation or another period can be provided between the operations, that is, when one operation is shifted to the next operation. For example, the state illustrated in FIG. 14C may be provided between the period in FIG. 14A and the period in FIG. 14B. Since there is no harm providing such a period, a problem does not occur.

Note that in this embodiment, what is illustrated in the drawing can be freely combined with or replaced with what is described in other embodiments as appropriate.

Embodiment 5

Next, in this embodiment, an application example of the circuit and the driving method which are described in Embodiment 1 will be described.

Figure 15A:
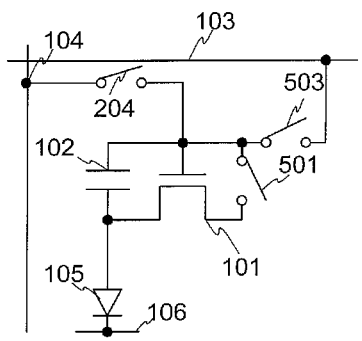
FIGS. 15A to 15D each illustrate a circuit or a driving method shown in an embodiment.

FIG. 15A illustrates another specific example of FIGS. 5A and 5B, which is different from that in Embodiment 4. A first terminal of a switch 501 is electrically connected to the gate of the transistor 101, the first terminal of the capacitor 102, and a second terminal of a switch 503. A second terminal of the switch 501 is electrically connected to the first terminal of the transistor 101. A first terminal of the switch 503 is electrically connected to the wiring 103. The second terminal of the switch 503 is electrically connected to the gate of the transistor 101, the first terminal of the capacitor 102, and the first terminal of the switch 501. The first terminal of the switch 204 is electrically connected to the first terminal of the switch 501, the gate of the transistor 101, and the first terminal of the capacitor 102. The second terminal of the switch 204 is electrically connected to the wiring 104. As thus described, the arrangement of four switches can realize the circuit configuration which realizes the connection states in FIGS. 5A and 5B.

Figure 15B:
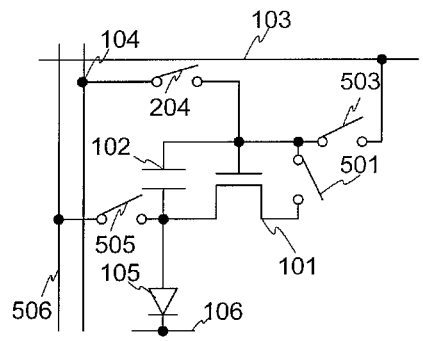
Figure 15C:
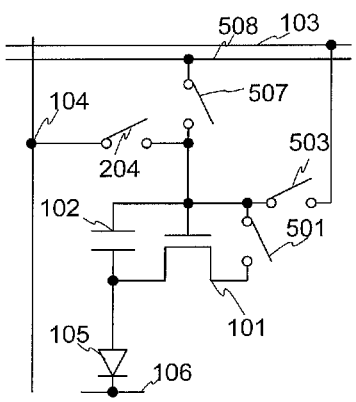
Figure 15D:
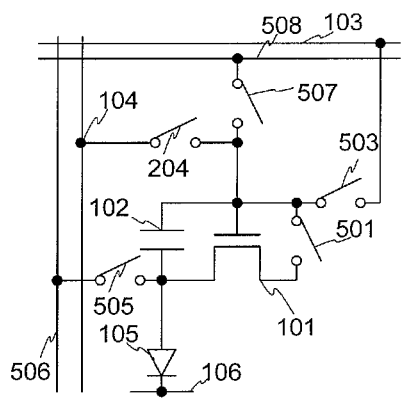

FIGS. 15B to 15D each illustrate an example different from that in FIG. 15A. FIG. 15B illustrates a configuration in which a switch 505 is additionally provided in the configuration in FIG. 15A and connection between a wiring 506 and the second terminal of the transistor 101 is controlled so that the potential of the second terminal of the transistor 101 is controlled. FIG. 15C illustrates a configuration in which a switch 507 is additionally provided in the configuration in FIG. 15A and connection between a wiring 508 and the gate of the transistor 101 is controlled so that the potential of the gate of the transistor 101 is controlled. FIG. 15D illustrates a configuration in which the switch 507 is additionally provided in the configuration in FIG. 15B and connection between the wiring 508 and the gate of the transistor 101 is controlled so that the potential of the gate and the potential of the second terminal of the transistor 101 are controlled. Moreover, by changing the potential of the wiring 506 or the wiring 508, for example, operation similar to that in FIG. 5A or FIG.

5B can be realized. Furthermore, if needed, a switch, a transistor, or the like is provided as appropriate.

Note that FIGS. 15A to 15D illustrate part of the examples of the structures described in Embodiment 1; other examples can also be realized in a similar manner.

Next, an operation method will be described. Here, the operation method is described using the circuit in FIG. 15A; a similar operation method can be used for other circuits.

Figure 16A:
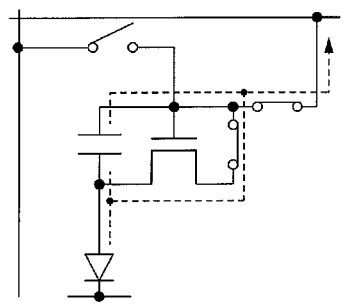
FIGS. 16A to 16E illustrate a circuit or a driving method shown in an embodiment.

First, initialization is performed as illustrated in FIG. 16A. This is operation in which the potential of the gate or the drain (or the source) of the transistor 101 is set to a predetermined potential. Accordingly, a state such that the transistor 101 is turned on can be obtained. Alternatively, a predetermined voltage is applied to the capacitor 102, so that electric charge is held in the capacitor 102. The switches 501 and 503 are conducting and are on. Preferably, the switch 204 is not conducting and is off. Moreover, in the initialization period in FIG. 16A, the potential of the wiring 103 is preferably lower than potentials of other wirings. Note that this embodiment is not limited thereto. Since it is preferable that current do not flow to the display element 105, a condition that enables this is preferable. Accordingly, it is preferable that at least a voltage applied to the light-emitting element be a reverse bias.

Note that in FIGS. 16A to 16E, dotted arrows are shown to facilitate understanding of movement of electric charge. Note that this embodiment is not limited to this example, and any potential relation with which predetermined driving is performed can be employed.

Figure 16B:
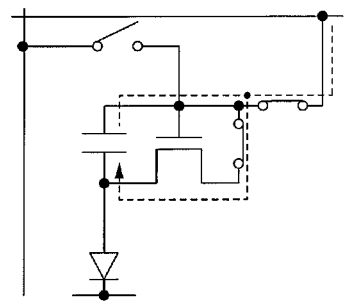

Next, as illustrated in FIG. 16B, the threshold voltage of the transistor 101 is obtained. The switches 501 and 503 are conducting and are on. Preferably, the switch 204 is not conducting and is off. Moreover, in the period in FIG. 16B for obtaining the threshold voltage of the transistor 101, the potential of the wiring 103 is preferably higher than that in the initialization period. Since the capacitor 102 holds the electric charge which has been stored in the period in FIG. 16A, the electric charge is discharged at that time. Accordingly, the potential of the gate of the transistor 101 is shifted from the potential based on the electric charge stored in the period in FIG. 16A towards the potential to which the threshold voltage (a positive value) of the transistor 101 is added. That is, the potential of the gate of the transistor 101 becomes close to a potential which is higher by the absolute value of the threshold voltage of the transistor 101. At that time, the voltage between the gate and the source of the transistor 101 becomes close to the threshold voltage of the transistor 101. Through such operation, the threshold voltage can be obtained between the opposite electrodes of the capacitor 102.

Note that when the electric charge in the capacitor 102 is discharged in this period, variation in length of the period is of little significance. This is because the electric charge is almost completely discharged as a certain time passes, so that variation in length of the period does not much affect the operation. Therefore, this operation can be performed by dot sequential driving, not by line sequential driving. Accordingly, a driver circuit can be realized with a simple configuration. Thus, when the circuit illustrated in FIG. 15A is considered as one pixel, it is possible to form a pixel portion in which the pixels are arranged in matrix and a driver circuit portion for supplying a signal to the pixel portion by using the same kind of transistors, or it is possible to form the pixel portion and the driver circuit portion over the same substrate. Note that this embodiment is not limited thereto. Line sequential driving can be employed, or the pixel portion and the driver circuit portion can be formed over different substrates.

Figure 16C:
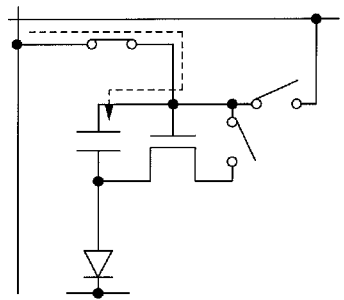

Next, as illustrated in FIG. 16C, an image signal is input. The switch 204 is conducting and is on. Preferably, the switches 501 and 503 are not conducting and are off. Moreover, in the period in FIG. 16C for inputting an image signal, the potential of the wiring 103 is preferably higher than potentials input to other wirings. Then, an image signal is supplied from the wiring 104. Since the capacitor 102 stores the electric charge which has been stored in the period in FIG. 16B, additional electric charge is stored at that time. Accordingly, the potential of the gate of the transistor 101 is shifted from the potential of the image signal supplied from the wiring 104 towards the potential to which the threshold voltage (a positive value) of the transistor 101 is added. That is, the potential of the gate of the transistor 101 becomes close to a higher potential than the potential of the image signal supplied from the wiring 104 by the absolute value of the threshold voltage of the transistor 101. Through the operation in FIGS. 16B and 16C, the image signal can be input and the threshold voltage can be obtained.

Figure 16D:
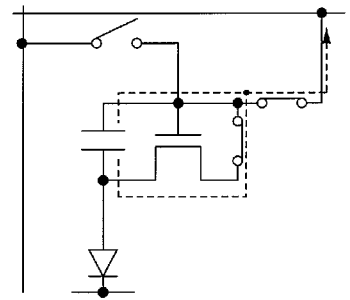

Next, as illustrated in FIG. 16D, variation in current characteristics such as mobility of the transistor 101 is compensated. This corresponds to the period in FIG. 5A or the like. The switches 501 and 503 are conducting and are on. Preferably, the switch 204 is not conducting and is off. Moreover, in the period in FIG. 16D for compensating variation in current characteristics such as mobility of the transistor 101, the potential of the wiring 103 is preferably higher than potentials input to other wirings. With such a state, the electric charge stored in the capacitor 102 is discharged through the transistor 101. In this manner, the electric charge is slightly discharged through the transistor 101, so that the influence of variation in current flowing to the transistor 101 can be reduced.

Figure 16E:
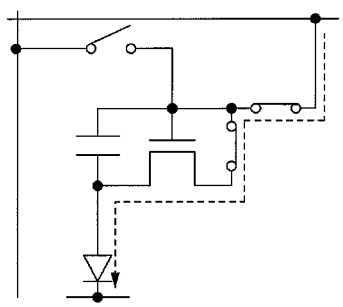

Next, as illustrated in FIG. 16E, current is supplied to the display element 105 through the transistor 101. This corresponds to the period in FIG. 5B or the like. The switches 501 and 503 are conducting and are on. Preferably, the switch 204 is not conducting and is off. Moreover, in the period in FIG. 16E for supplying current to the display element 105 through the transistor 101, the potential of the wiring 103 is preferably higher than potentials input to other wirings. At that time, the voltage between the gate and the source of the transistor 101 is set to the voltage obtained by subtracting the voltage corresponding to current characteristics of the transistor 101 from the sum of the voltage corresponding to the threshold voltage and the image signal voltage. Thus, the influence of variation in current characteristics of the transistor 101 can be reduced, and the appropriate amount of current can be supplied to the display element 105.

As illustrated in FIGS. 16A to 16E, in the period in which variation in current characteristics such as mobility of the transistor 101 is compensated (FIG. 5A), variation in current characteristics such as mobility of the transistor 101 is reduced; thus, variation in current supplied to the display element 105 is also reduced in the period in which current is supplied to the display element 105 (FIG. 5B). As a result, variation in display state of the display element 105 can also be reduced, whereby display with higher quality can be obtained.

In the case of employing the circuit configuration in FIG. 15B, the potential of the second terminal of the transistor 101 can be controlled in the initialization period illustrated in FIG. 16A. Preferably, the switches 501, 503, and 505 are conducting and are on. Preferably, the switch 204 is not conducting and is off. Note that the operations in FIG. 16B and drawings that follow FIG. 16B can be similar to those described above.

In the case of employing the circuit configuration in FIG. 15C, the potential of the gate of the transistor 101 can be controlled in the initialization period illustrated in FIG. 16A. Preferably, the switches 501, 503, and 507 are conducting and are on. Preferably, the switch 204 is not conducting and is off. Note that the operations in FIG. 16B and the following drawings can be similar to those described above.

In the case of employing the circuit configuration in FIG. 15D, the potential of the gate and/or the potential of the second terminal of the transistor 101 can be controlled in the initialization period illustrated in FIG. 16A. Preferably, the switches 501, 503, 505, and 407 are conducting and are on. Preferably, the switch 204 is not conducting and is off. Note that the operations in FIG. 16B and the following drawings can be similar to those described above.

Note that in FIGS. 16A to 16E, another operation or another period can be provided between the operations, that is, when one operation is shifted to the next operation. For example, the state illustrated in FIG. 16C may be provided between the period in FIG. 16A and the period in FIG. 16B. Since there is no harm providing such a period, a problem does not occur.

Note that in this embodiment, what is illustrated in the drawing can be freely combined with or replaced with what is described in other embodiments as appropriate.

Embodiment 6

Next, in this embodiment, an application example of the circuit and the driving method which are described in Embodiment 1 will be described.

Figure 17A:
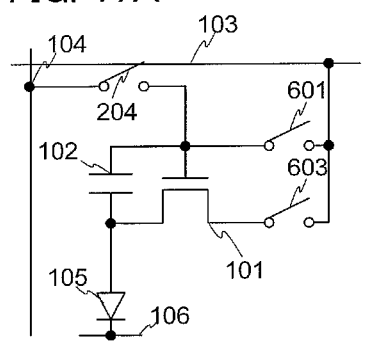
FIGS. 17A to 17D each illustrate a circuit or a driving method shown in an embodiment.

FIG. 17A illustrates a specific example of FIGS. 5C and 5D. A first terminal of a switch 601 is electrically connected to the wiring 103. A second terminal of the switch 601 is electrically connected to the gate of the transistor 101 and the first terminal of the capacitor 102. A first terminal of a switch 603 is electrically connected to the wiring 103. A second terminal of the switch 603 is electrically connected to the first terminal of the transistor 101. The first terminal of the switch 204 is electrically connected to the first terminal of the switch 601, the gate of the transistor 101, and the first terminal of the capacitor 102. The second terminal of the switch 204 is electrically connected to the wiring 104. As thus described, the arrangement of four switches can realize the circuit configuration which realizes the connection states in FIGS. 5C and 5D.

Figure 17B:
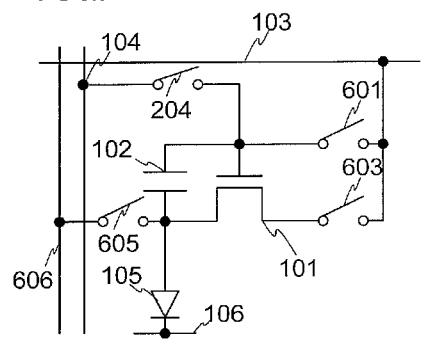
Figure 17C:
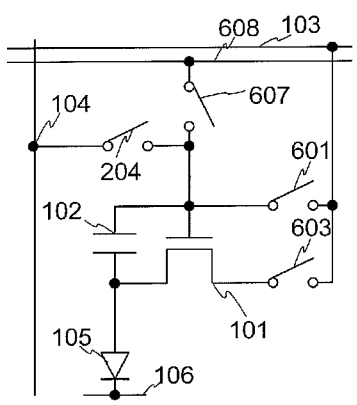
Figure 17D:
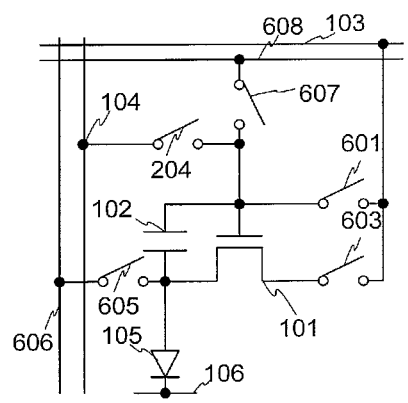

FIGS. 17B to 17D each illustrate an example different from that in FIG. 17A. FIG. 17B illustrates a configuration in which a switch 605 is additionally provided in FIG. 17A and connection between a wiring 606 and the second terminal of the transistor 101 is controlled so that the potential of the second terminal of the transistor 101 is controlled. FIG. 17C illustrates a configuration in which a switch 607 is additionally provided in FIG. 17A and connection between a wiring 608 and the gate of the transistor 101 is controlled so that the potential of the gate of the transistor 101 is controlled. FIG. 17D illustrates a configuration in which the switch 607 is additionally provided in FIG. 17B and connection between the wiring 608 and the gate of the transistor 101 is controlled so that the potential of the gate and the potential of the second terminal of the transistor 101 are controlled. Moreover, by changing the potential of the wiring 606 or the wiring 608, for example, operation similar to that in FIG. 5C or FIG. 5D can be realized. Furthermore, if needed, a switch, a transistor, or the like is provided as appropriate.

Note that FIGS. 17A to 17D illustrate part of the examples of the structures described in Embodiment 1; other examples can also be realized in a similar manner.

Next, an operation method will be described. Here, the operation method is described using the circuit in FIG. 17A; a similar operation method can be used for other circuits.

Figure 18A:
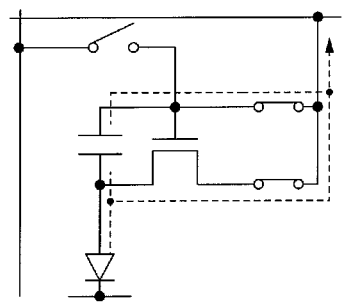
FIGS. 18A to 18E illustrate a circuit or a driving method shown in an embodiment.

First, initialization is performed as illustrated in FIG. 18A. This is operation in which the potential of the gate or the drain (or the source) of the transistor 101 is set to a predetermined potential. Accordingly, a state such that the transistor 101 is turned on can be obtained. Alternatively, a predetermined voltage is applied to the capacitor 102, so that electric charge is held in the capacitor 102. The switches 601 and 603 are conducting and are on. Preferably, the switch 204 is not conducting and is off. Moreover, in the initialization period in FIG. 18A, the potential of the wiring 103 is preferably lower than potentials of other wirings. Note that this embodiment is not limited thereto. Since it is preferable that current do not flow to the display element 105, a condition that enables this is preferable. Accordingly, it is preferable that at least a voltage applied to the light-emitting element be a reverse bias.

Note that in FIGS. 18A to 18E, dotted arrows are shown to facilitate understanding of movement of electric charge. Note that this embodiment is not limited to this example, and any potential relation with which predetermined driving is performed can be employed.

Figure 18B:
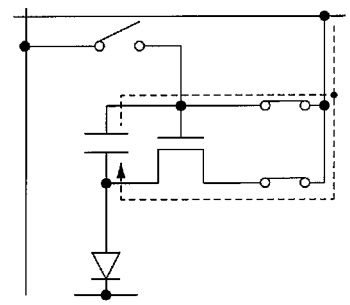

Next, as illustrated in FIG. 18B, the threshold voltage of the transistor 101 is obtained. The switches 601 and 603 are conducting and are on. Preferably, the switch 204 is not conducting and is off. Moreover, in the period in FIG. 18B for obtaining the threshold voltage of the transistor 101, the potential of the wiring 103 is preferably higher than that in the initialization period. Since the capacitor 102 holds the electric charge which has been stored in the period in FIG. 18A, the electric charge is discharged at that time. Accordingly, the potential of the gate of the transistor 101 is shifted from the potential based on the electric charge stored in the period in FIG. 18A towards the potential to which the threshold voltage (a positive value) of the transistor 101 is added. That is, the potential of the gate of the transistor 101 becomes close to a potential which is higher by the absolute value of the threshold voltage of the transistor 101. At that time, the voltage between the gate and the source of the transistor 101 becomes close to the threshold voltage of the transistor 101. Through such operation, the threshold voltage can be obtained between the opposite electrodes of the capacitor 102.

Note that when the electric charge in the capacitor 102 is discharged in this period, variation in length of the period is of little significance. This is because the electric charge is almost completely discharged as a certain time passes, so that variation in length of the period does not much affect the operation. Therefore, this operation can be performed by dot sequential driving, not by line sequential driving. Accordingly, a driver circuit can be realized with a simple configuration. Thus, when the circuit illustrated in FIG. 17A is considered as one pixel, it is possible to form a pixel portion in which the pixels are arranged in matrix and a driver circuit portion for supplying a signal to the pixel portion by using the same kind of transistors, or it is possible to form the pixel portion and the driver circuit portion over the same substrate. Note that this embodiment is not limited thereto. Line sequential driving can be employed, or the pixel portion and the driver circuit portion can be formed over different substrates.

Figure 18C:
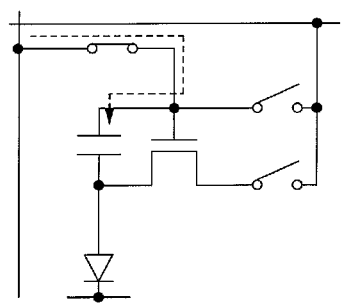

Next, as illustrated in FIG. 18C, an image signal is input. The switch 204 is conducting and is on. Preferably, the switches 601 and 603 are not conducting and are off. Moreover, in the period in FIG. 18C for inputting an image signal, the potential of the wiring 103 is preferably higher than potentials input to other wirings. Then, an image signal is supplied from the wiring 104. Since the capacitor 102 holds the electric charge which has been stored in the period in FIG. 18B, additional electric charge is stored at that time. Accordingly, the potential of the gate of the transistor 101 is shifted from the potential of the image signal supplied from the wiring 104 towards the potential to which the threshold voltage (a positive value) of the transistor 101 is added. That is, the potential of the gate of the transistor 101 becomes close to a higher potential than the potential of the image signal supplied from the wiring 104 by the absolute value of the threshold voltage of the transistor 101. Through the operation in FIGS. 18B and 18C, the image signal can be input and the threshold voltage can be obtained.

Figure 18D:
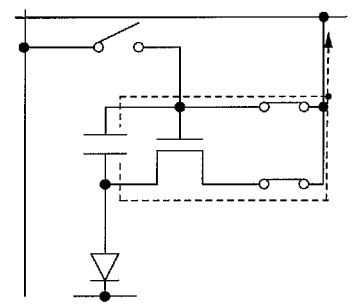

Next, as illustrated in FIG. 18D, variation in current characteristics such as mobility of the transistor 101 is compensated. This corresponds to the period in FIG. 5C or the like. The switches 601 and 603 are conducting and are on. Preferably, the switch 204 is not conducting and is off. Moreover, in the period in FIG. 18D for compensating variation in current characteristics such as mobility of the transistor 101, the potential of the wiring 103 is preferably higher than potentials input to other wirings. With such a state, the electric charge stored in the capacitor 102 is discharged through the transistor 101. In this manner, the electric charge is slightly discharged through the transistor 101, so that the influence of variation in current flowing to the transistor 101 can be reduced.

Figure 18E:
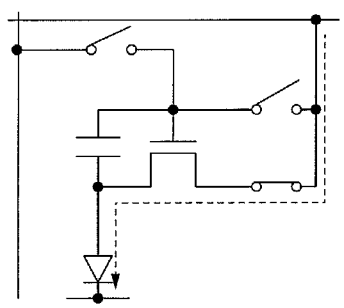

Next, as illustrated in FIG. 18E, current is supplied to the display element 105 through the transistor 101. This corresponds to the period in FIG. 5D or the like. The switches 601 and 603 are conducting and are on. Preferably, the switch 204 is not conducting and is off. Moreover, in the period in FIG. 18E for supplying current to the display element 105 through the transistor 101, the potential of the wiring 103 is preferably higher than potentials input to other wirings. At that time, the voltage between the gate and the source of the transistor 101 is set to the voltage obtained by subtracting the voltage corresponding to current characteristics of the transistor 101 from the sum of the voltage corresponding to the threshold voltage and the image signal voltage. Thus, the influence of variation in current characteristics of the transistor 101 can be reduced, and the appropriate amount of current can be supplied to the display element 105.

As illustrated in FIGS. 18A to 18E, in the period in which variation in current characteristics such as mobility of the transistor 101 is compensated (FIG. 5C), variation in current characteristics such as mobility of the transistor 101 is reduced; thus, variation in current supplied to the display element 105 is also reduced in the period in which current is supplied to the display element 105 (FIG. 5D). As a result, variation in display state of the display element 105 can also be reduced, whereby display with higher quality can be obtained.

In the case of employing the circuit configuration in FIG. 17B, the potential of the second terminal of the transistor 101 can be controlled in the initialization period illustrated in FIG. 18A. Preferably, the switches 601, 603, and 605 are conducting and are on. Preferably, the switch 204 is not conducting and is off. Note that the operations in FIG. 18B and drawings that follow FIG. 18B can be similar to those described above.

In the case of employing the circuit configuration in FIG. 17C, the potential of the gate of the transistor 101 can be controlled in the initialization period illustrated in FIG. 18A. Preferably, the switches 601, 603, and 607 are conducting and are on. Preferably, the switch 204 is not conducting and is off. Note that the operations in FIG. 18B and the following drawings can be similar to those described above.

In the case of employing the circuit configuration in FIG. 17D, the potential of the gate and/or the potential of the second terminal of the transistor 101 can be controlled in the initialization period illustrated in FIG. 18A. Preferably, the switches 601, 603, 605, and 607 are conducting and are on.

Preferably, the switch 204 is not conducting and is off. Note that the operations in FIG. 18B and the following drawings can be similar to those described above.

Note that in FIGS. 18A to 18E, another operation or another period can be provided between the operations, that is, when one operation is shifted to the next operation. For example, the state illustrated in FIG. 18C may be provided between the period in FIG. 18A and the period in FIG. 18B. Since there is no harm providing such a period, a problem does not occur.

Note that in this embodiment, what is illustrated in the drawing can be freely combined with or replaced with what is described in other embodiments as appropriate.

Embodiment 7

In this embodiment, a specific example of the circuits described in Embodiments 1 to 6 will be described.

Figure 19:
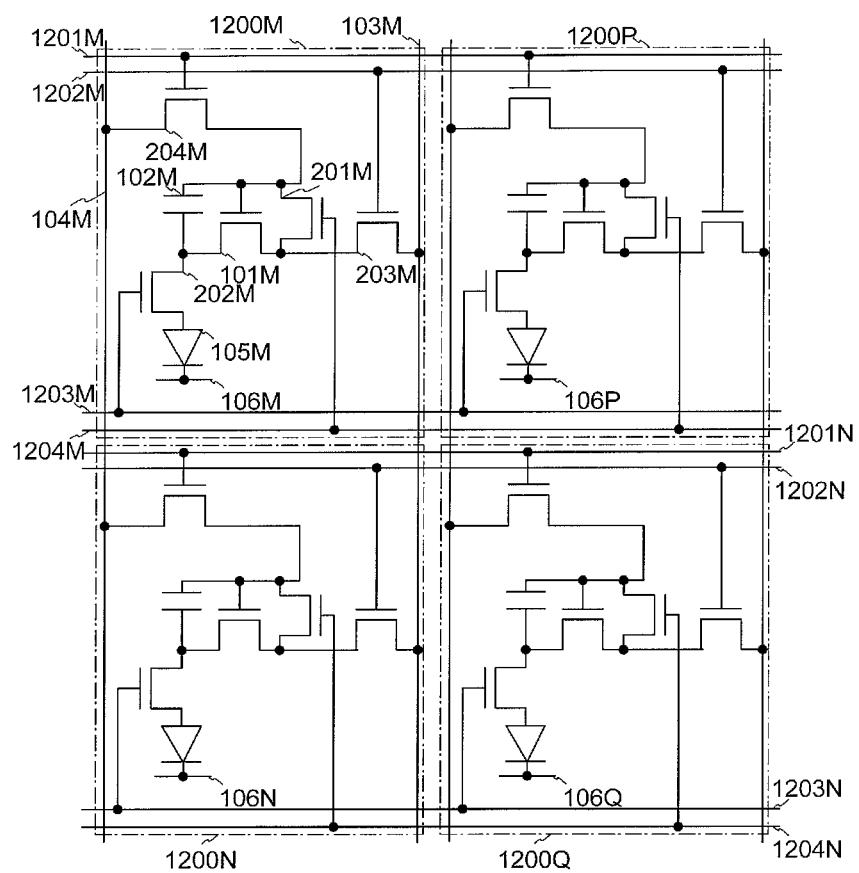
FIG. 19 illustrates a circuit or a driving method shown in an embodiment.

As an example, FIG. 19 illustrates an example of the case where the circuit illustrated in FIG. 2A forms one pixel and the pixels are provided in matrix. A switch in FIG. 19 is realized by using an n-channel transistor. Note that this embodiment is not limited thereto. A transistor having the other polarity can be used. Transistors of both polarities can be used. Moreover, a diode, a diode-connected transistor, or the like can be used.

The circuit illustrated in FIG. 2A forms a pixel 1200M, which is one pixel. A pixel 1200N, a pixel 1200P, and a pixel 1200Q which are pixels having the same structure as the pixel 1200M are provided in matrix. Pixels are sometimes connected to the same wiring depending on where the pixels are arranged.

Next, correspondence between the elements in FIG. 2A and elements in the pixel 1200M is described below. The wiring 104 corresponds to a wiring 104M. The wiring 103 corresponds to a wiring 103M. The switch 201 corresponds to a transistor 201M. The switch 202 corresponds to a transistor 202M. The transistor 101 corresponds to a transistor 101M. The switch 203 corresponds to a transistor 203M. The switch 204 corresponds to a transistor 204M. The capacitor 102 corresponds to a capacitor 102M. The display element 105 corresponds to a light-emitting element 105M. The wiring 106 corresponds to a wiring 106M.

A gate of the transistor 201M is connected to a wiring 1202M. A gate of the transistor 202M is connected to a wiring 1203M. A gate of the transistor 203M is connected to a wiring 1202M. A gate of the transistor 204M is connected to a wiring 1201M.

Note that each wiring connected to the gate of the transistor can be connected to a wiring of another pixel or another wiring of the same pixel.

Note that the wiring 106M can be connected to a wiring 106P, a wiring 106N, and a wiring 106Q.

Various other circuits can be formed as in FIG. 19.

Note that in this embodiment, what is illustrated in the drawing can be freely combined with or replaced with what is described in other embodiments as appropriate.

Embodiment 8

Next, another structure example and driving method of a display device will be described. In this embodiment, a method is described by which an image for interpolating motion of an image (an input image) input from the outside of a display device is generated inside the display device on the basis of a plurality of input images and the generated image (the generation image) and the input image are sequentially displayed. Note that when an image for interpolating motion of an input image is a generation image, motion of moving images can be made smooth, and decrease in quality of moving images because of afterimages or the like due to hold driving can be suppressed. Here, moving image interpolation is described below. Ideally, display of moving images is realized by controlling the luminance of each pixel in real time; however, individual control of pixels in real time has problems such as the enormous number of control circuits, space for wirings, and the enormous amount of input image data. Thus, it is difficult to realize the individual control of pixels. Therefore, for display of moving images by a display device, a plurality of still images are sequentially displayed in a certain cycle so that display appears to be moving images. The cycle (in this embodiment, referred to as an input image signal cycle and denoted by $T_{in}$) is standardized, and for example, 1/60 second in NTSC and 1/50 second in PAL. Such a cycle does not cause a problem of moving image display in a CRT, which is an impulsive display device. However, in a hold-type display device, when moving images conforming to these standards are displayed without change, a defect (hold blur) in which display is blurred because of afterimages or the like due to hold driving occurs. Since hold blur is recognized by discrepancy between unconscious motion interpolation due to human eye tracking and hold-type display, the hold blur can be reduced by making the input image signal cycle shorter than that in conventional standards (by making the control closer to individual control of pixels in real time). However, it is difficult to reduce the length of the input image signal cycle because the standard needs to be changed and the amount of data is increased. However, when an image for interpolating motion of an input image is generated inside the display device on the basis of a standardized input image signal and display is performed while the generation image interpolates the input image, hold blur can be reduced without change in the standard or increase in the amount of data. Operation such that an image signal is generated inside the display device on the basis of an input image signal to interpolate motion of the input image is referred to as moving image interpolation.

Figure 20A:
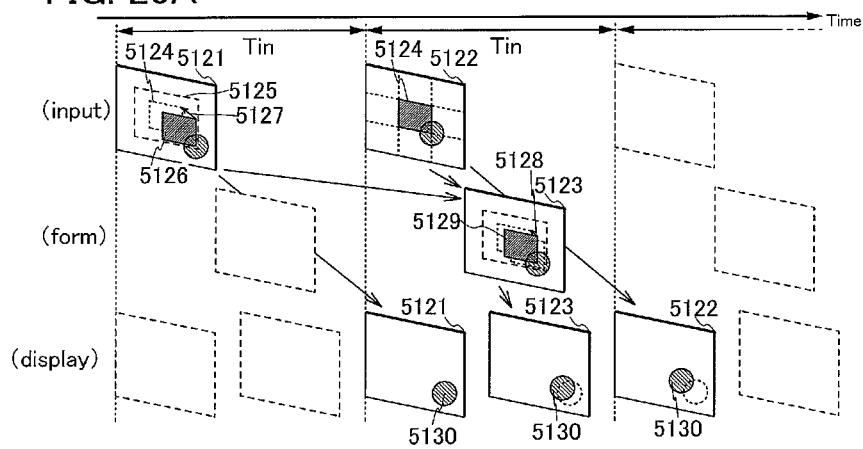
FIGS. 20A to 20C each illustrate a driving method shown in an embodiment.
Figure 20B:
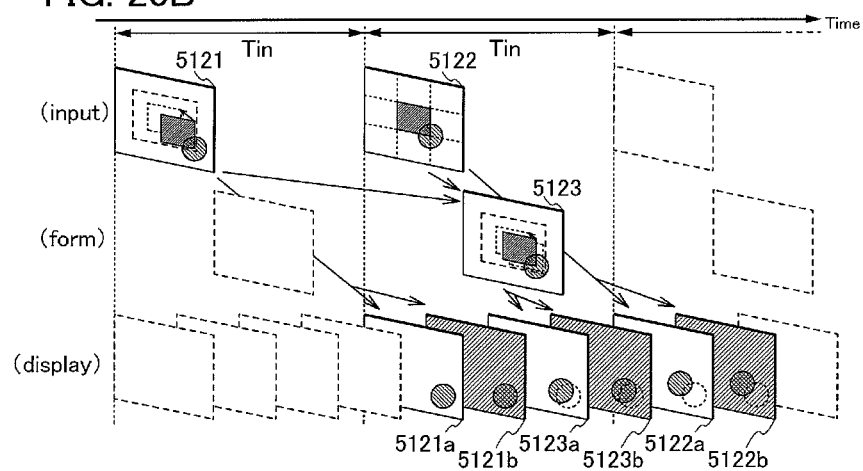

By a method for interpolating moving images in this embodiment, motion blur can be reduced. The method for interpolating moving images in this embodiment can include an image generation method and an image display method. Further, by using a different image generation method and/or a different image display method for motion with a specific pattern, motion blur can be effectively reduced. FIGS. 20A and 20B are schematic diagrams each illustrating an example of a method for interpolating moving images in this embodiment. FIGS. 20A and 20B each illustrate timing of treating each image by using the position of the horizontal direction, with the time as the horizontal axis. A portion represented as "input" indicates timing at which an input image signal is input. Here, images 5121 and 5122 are focused as two images that are temporally adjacent to each other. An input image is input at an interval of the cycle $T_{in}$. Note that the length of one cycle $T_{in}$ is referred to as one frame or one frame period in some cases. A portion represented as "generation" indicates timing at which a new image is generated from an input image signal. Here, an image 5123 which is a generation image generated on the basis of the images 5121 and 5122 is focused. A portion represented as "display indicates timing at which an image is displayed in the display device. Note that images other than the focused images are only represented by dashed lines, and by treating such images in a manner similar to that of the focused images, the example of the method for interpolating moving images in this embodiment can be realized.

In the example of the method for interpolating moving images in this embodiment, as illustrated in FIG. 20A, a generation image which is generated on the basis of two input images that are temporally adjacent is displayed in a period after one image is displayed until the other image is displayed, so that moving image interpolation can be performed. In this case, a display cycle of a display image is preferably half of an input cycle of the input image. Note that the display cycle is not limited to this and can be a variety of display cycles. For example, when the length of the display cycle is smaller than half of that of the input cycle, moving images can be displayed more smoothly. Alternatively, when the length of the display cycle is larger than half of that of the input cycle, power consumption can be reduced. Note that here, an image is generated on the basis of two input images which are temporally adjacent; however, the number of input images to be used is not limited to two and can be other numbers. For example, when an image is generated on the basis of three (or more than three) input images which are temporally adjacent, a generation image with higher accuracy can be obtained as compared to the case where an image is generated on the basis of two input images. Note that the display timing of the image 5121 is the same as the input timing of the image 5122, that is, the display timing is one frame later than the input timing. However, the display timing in the method for interpolating moving images in this embodiment is not limited to this and can be a variety of display timings. For example, the display timing can be delayed with respect to the input timing by more than one frame. Thus, the display timing of the image 5123 which is the generation image can be delayed, which allows enough time to generate the image 5123 and leads to reduction in power consumption and manufacturing cost. Note that when the display timing is significantly delayed with respect to the input timing, a period for holding an input image becomes longer, and the memory capacity for holding the input image is increased. Therefore, the display timing is preferably delayed with respect to the input timing by approximately one to two frames.

Here, an example of a specific generation method of the image 5123, which is generated on the basis of the images 5121 and 5122, is described. It is necessary to detect motion of an input image in order to interpolate moving images. In this embodiment, a method called a block matching method can be used in order to detect motion of an input image. Note that this embodiment is not limited to this, and a variety of methods (e.g., a method for obtaining a difference of image data or a method using Fourier transformation) can be used. In the block matching method, first, image data for one input image (here, image data of the image 5121) is stored in a data storage means (e.g., a memory circuit such as a semiconductor memory or a RAM). Then, an image in the next frame (here, the image 5122) is divided into a plurality of regions. Note that the divided regions can have the same rectangular shapes as illustrated in FIG. 20A; however, the divided regions are not limited to them and can have a variety of shapes (e.g., the shape or size varies depending on images). After that, in each divided region, data is compared to the image data in the previous frame (here, the image data of the image 5121), which is stored in the data storage means, so that a region where the image data is similar to each other is searched. FIG. 20A illustrates an example in which the image 5121 is searched for a region where data is similar to that of a region 5124 in the image 5122, and a region 5126 is found. Note that a search range is preferably limited when the image 5121 is searched. In the example of FIG. 20A, a region 5125 which is approximately four times as large as the region 5124 is set as the search range. By making the search range larger than this, detection accuracy can be increased even in a moving image with high-speed motion. Note that search in an excessively wide range needs an enormous amount of time, which makes it difficult to realize detection of motion. Thus, the region 5125 is preferably approximately two to six times as large as the area of the region 5124. After that, a difference of the position between the searched region 5126 and the region 5124 in the image 5122 is obtained as a motion vector 5127. The motion vector 5127 represents motion of image data in the region 5124 in one frame period. Then, in order to generate an image showing the intermediate state of motion, an image generation vector 5128 obtained by changing the size of the motion vector without change in the direction thereof is generated, and image data included in the region 5126 of the image 5121 is moved in accordance with the image generation vector 5128, so that image data in a region 5129 of the image 5123 is generated. By performing a series of processings on the entire region of the image 5122, the image 5123 can be generated. Then, by sequentially displaying the input image 5121, the generation image 5123, and the input image 5122, moving images can be interpolated. Note that the position of an object 5130 in the image is different (i.e., the object is moved) between the images 5121 and 5122. In the generated image 5123, the object is located at the midpoint between the object in the image 5121 and the object in the image 5122. By displaying such images, motion of moving images can be made smooth, and blur of moving images due to afterimages or the like can be reduced.

Note that the size of the image generation vector 5128 can be determined in accordance with the display timing of the image 5123. In the example of FIG. 20A, since the display timing of the image 5123 is the midpoint ($\frac{1}{2}$) between the display timings of the images 5121 and 5122, the size of the image generation vector 5128 is half of that of the motion vector 5127. Alternatively, for example, when the display timing is $\frac{1}{3}$ between the display timings of the images 5121 and 5122, the size of the image generation vector 5128 can be $\frac{1}{3}$, and when the display timing is $\frac{2}{3}$ between the display timings of the images 5121 and 5122, the size of the image generation vector 5128 can be $\frac{2}{3}$.

Note that in the case where a new image is generated by moving a plurality of regions having different motion vectors in this manner, a portion where one region has already been moved to a region that is a destination for another region or a portion to which any region is not moved is generated in some cases (i.e., overlap or blank occurs in some cases). For such portions, data can be compensated. As a method for compensating an overlap portion, a method by which overlap data is averaged; a method by which data is arranged in order of priority according to the direction of motion vectors or the like, and high-priority data is used as data in a generation image; or a method by which one of color and brightness is arranged in order of priority and the other thereof is averaged can be used, for example. As a method for compensating a blank portion, a method by which image data of the portion of the image 5121 or the image 5122 is used as data in a generation image without modification, a method by which image data of the portion of the image 5121 or the image 5122 is averaged, or the like can be used. Then, the generated image 5123 is displayed at the timing in accordance with the size of the image generation vector 5128, so that motion of moving images can be made smooth, and the decrease in quality of moving images because of afterimages or the like due to hold driving can be suppressed.

In another example of the method for interpolating moving images in this embodiment, as illustrated in FIG. 20B, when a generation image which is generated on the basis of two input images that are temporally adjacent is displayed in a period after one image is displayed until the other image is displayed, each display image is divided into a plurality of subimages to be displayed. Thus, moving images can be interpolated. This case can have advantages of displaying a dark image at regular intervals (advantages of making a display method closer to impulsive display) in addition to advantages of a shorter image display cycle. In other words, blur of moving images due to afterimages or the like can be further reduced as compared to the case where the length of the image display cycle is just made to half of that of the image input cycle. In the example of FIG. 20B, "input" and "generation" can be similar to the processing in the example of FIG. 20A; therefore, the description thereof is not repeated. For "display" in the example of FIG. 20B, one input image and/or one generation image can be divided into a plurality of subimages to be displayed. Specifically, as illustrated in FIG. 20B, the image 5121 is divided into subimages 5121a and 5121b and the subimages 5121a and 5121b are sequentially displayed so as to make human eyes perceive that the image 5121 is displayed; the image 5123 is divided into subimages 5123a and 5123b and the subimages 5123a and 5123b are sequentially displayed so as to make human eyes perceive that the image 5123 is displayed; and the image 5122 is divided into subimages 5122a and 5122b and the subimages 5122a and 5122b are sequentially displayed so as to make human eyes perceive that the image 5122 is displayed. That is, the display method can be made closer to impulsive display while the images perceived by human eyes are similar to those in the example of FIG. 20A, so that blur of moving images due to afterimages or the like can be further reduced. Note that the number of division of subimages is two in FIG. 20B; however, the number of division of subimages is not limited to this and can be other numbers. Note that subimages are displayed at regular intervals ($\frac{1}{2}$) in FIG. 20B; however, timing of displaying subimages is not limited to this and can be a variety of timings. For example, when timing of displaying dark subimages (5121b, 5122b, and 5123b) is made earlier (specifically, timing at $\frac{1}{4}$ to $\frac{1}{2}$), the display method can be made much closer to impulsive display, so that blur of moving images due to afterimages or the like can be further reduced. Alternatively, when the timing of displaying the dark subimages is delayed (specifically, timing at $\frac{1}{2}$ to $\frac{3}{4}$), the length of a period for displaying a bright image can be increased, so that the display efficiency can be increased and power consumption can be reduced.

Figure 20C:
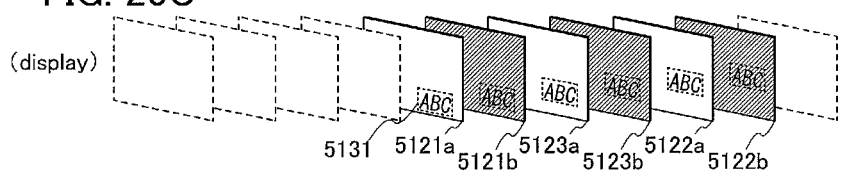

Another example of the method for interpolating moving images in this embodiment is an example in which the shape of an object which is moved in an image is detected and different processings are performed depending on the shape of the moving object. FIG. 20C shows display timing as in the example of FIG. 20B and illustrates the case where moving letters (also referred to as scrolling texts, subtitles, captions, or the like) are displayed. Note that since "input" and "generation" may be similar to those in FIG. 20B, they are not illustrated in FIG. 20C. The amount of blur of moving images by hold driving varies depending on properties of a moving object in some cases. In particular, blur is often recognized remarkably when letters are moved. This is because eyes track moving letters to read the letters, so that hold blur is likely to occur. Further, since letters often have clear outlines, blur due to hold blur is further emphasized in some cases. That is, determining whether an object which is moved in an image is a letter and performing special processing when the object is the letter are effective in reducing hold blur. Specifically, when edge detection, pattern detection, and/or the like are/is performed on an object which is moved in an image and the object is determined to be a letter, motion compensation is performed even on subimages generated by division of one image so that an intermediate state of motion is displayed. Thus, motion can be made smooth. In the case where the object is determined not to be a letter, when subimages are generated by division of one image as illustrated in FIG. 20B, the subimages can be displayed without change in the position of the moving object. FIG. 20C illustrates the example in which a region 5131 which is determined to be letters is moved upward, and the position of the region 5131 is different between the images 5121a and 5121b. Similarly, the position of the region 5131 is different between the images 5123a and 5123b, and between the images 5122a and 5122b. Accordingly, motion of letters for which hold blur is particularly easily recognized can be made smoother than that by normal motion compensation frame rate doubling, so that blur of moving images due to afterimages or the like can be further reduced.

Note that in this embodiment, what is illustrated in the drawing can be freely combined with or replaced with what is described in other embodiments as appropriate.

Embodiment 9

In this embodiment, an example of a display device will be described.

First, an example of a system block of a liquid crystal display device is described with reference to FIG. 21A. The liquid crystal display device includes a circuit 5361, a circuit 5362, a circuit 5363_1, a circuit 5363_2, a pixel portion 5364, a circuit 5365, and a lighting device 5366. A plurality of wirings 5371 which are extended from the circuit 5362 and a plurality of wirings 5372 which are extended from the circuits 5363_1 and 5363_2 are provided in the pixel portion 5364. Moreover, pixels 5367 which include display elements such as liquid crystal elements are provided in matrix in respective regions where the plurality of wirings 5371 and the plurality of wirings 5372 intersect with each other.

The circuit 5361 has a function of supplying a signal, voltage, current, or the like to the circuit 5362, the circuit 5363_1, the circuit 5363_2, and the circuit 5365 in response to a video signal 5360 and can function as a controller, a control circuit, a timing generator, a power supply circuit, a regulator, or the like. In this embodiment, for example, the circuit 5361 supplies a signal line driver circuit start signal (SSP), a signal line driver circuit clock signal (SCK), a signal line driver circuit inverted clock signal (SCKB), video signal data (DATA), or a latch signal (LAT) to the circuit 5362. Alternatively, as an example, the circuit 5361 supplies a scan line driver circuit start signal (GSP), a scan line driver circuit clock signal (GCK), or a scan line driver circuit inverted clock signal (GCKB) to the circuit 5363_1 and the circuit 5363_2. Further alternatively, the circuit 5361 supplies a backlight control signal (BLC) to the circuit 5365. Note that this embodiment is not limited thereto, and the circuit 5361 can supply various other signals, voltages, currents, or the like to the circuit 5362, the circuit 5363_1, the circuit 5363_2, and the circuit 5365.

The circuit 5362 has a function of outputting video signals to the plurality of wirings 5371 in response to a signal supplied from the circuit 5361 (e.g., SSP, SCK, SCKB, DATA, or LAT), and can function as a signal line driver circuit. The circuit 5363_1 and the circuit 5363_2 each have a function of outputting scan signals to the plurality of wirings 5372 in response to a signal supplied from the circuit 5361 (e.g., GSP, GCK, or GCKB), and can function as a scan line driver circuit. The circuit 5365 has a function of controlling the luminance (or the average luminance) of the lighting device 5366 by controlling the amount of electric power supplied to the lighting device 5366, time to supply the electric power to the lighting device 5366, or the like in accordance with the signal (BLC) supplied from the circuit 5361. The circuit 5365 can function as a power supply circuit.

Note that when video signals are input to the plurality of wirings 5371, the plurality of wirings 5371 can function as signal lines, video signal lines, source lines, or the like. When scan signals are input to the plurality of wirings 5372, the plurality of wirings 5372 can function as signal lines, scan lines, gate lines, or the like. Note that this embodiment is not limited thereto.

Note that when the same signal is input to the circuit 5363_1 and the circuit 5363_2 from the circuit 5361, scan signals output from the circuit 5363_1 to the plurality of wirings 5372 and scan signals output from the circuit 5363_2 to the plurality of wirings 5372 have approximately the same timings in many cases. Accordingly, load caused by driving of the circuits 5363_1 and 5363_2 can be reduced. Thus, the display device can be made larger. Alternatively, the display device can have higher definition. Alternatively, since the channel width of transistors included in the circuits 5363_1 and 5363_2 can be reduced, a display device with a narrower frame can be obtained. Note that this embodiment is not limited thereto, and the circuit 5361 can supply different signals to the circuit 5363_1 and the circuit 5363_2.

Note that one of the circuit 5363_1 and the circuit 5363_2 can be eliminated.

Note that a wiring such as a capacitor line, a power supply line, or a scan line can be additionally provided in the pixel portion 5364. Then, the circuit 5361 can output a signal, a voltage, or the like to such a wiring. Further, a circuit similar to the circuit 5363_1 or the circuit 5363_2 can be additionally provided. The additionally provided circuit can output a signal such as a scan signal to the additionally provided wiring.

Note that the pixel 5367 can include a light-emitting element such as an EL element as a display element. In that case, as illustrated in FIG. 21B, since the display element can emit light, the circuit 5365 and the lighting device 5366 can be eliminated. Moreover, in order to supply electric power to the display element, a plurality of wirings 5373 which can function as power supply lines can be provided in the pixel portion 5364. The circuit 5361 can apply a power supply voltage called voltage (ANO) to the wirings 5373. The wirings 5373 can be separately connected to the pixels in accordance with color elements or can be connected to all the pixels.

Note that FIG. 21B illustrates an example in which the circuit 5361 supplies different signals to the circuit 5363_1 and the circuit 5363_2. The circuit 5361 supplies a signal such as a scan line driver circuit start signal (GSP1), a scan line driver circuit clock signal (GCK1), or a scan line driver circuit inverted clock signal (GCKB1) to the circuit 5363_1. In addition, the circuit 5361 supplies a signal such as a scan line driver circuit start signal (GSP2), a scan line driver circuit clock signal (GCK2), or a scan line driver circuit inverted clock signal (GCKB2) to the circuit 5363_2. In that case, the circuit 5363_1 can scan only wirings in odd-numbered rows of the plurality of wirings 5372 and the circuit 5363_2 can scan only wirings in even-numbered rows of the plurality of wirings 5372. Accordingly, the driving frequency of the circuit 5363_1 and the circuit 5363_2 can be lowered, whereby power consumption can be reduced. Alternatively, the area in which a flip-flop of one stage can be laid out can be made larger. Thus, a display device can have higher definition. Alternatively, the size of a display device can be increased. Note that this embodiment is not limited thereto, and the circuit 5361 can output the same signal to the circuit 5363_1 and the circuit 5363_2 as in FIG. 21A.

Figure 21A:
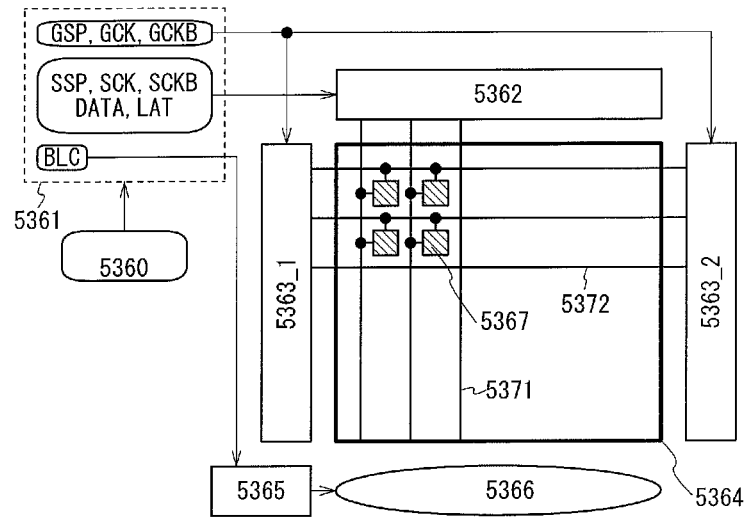
FIGS. 21A and 21B each illustrate a block diagram shown in an embodiment.
Figure 21B:
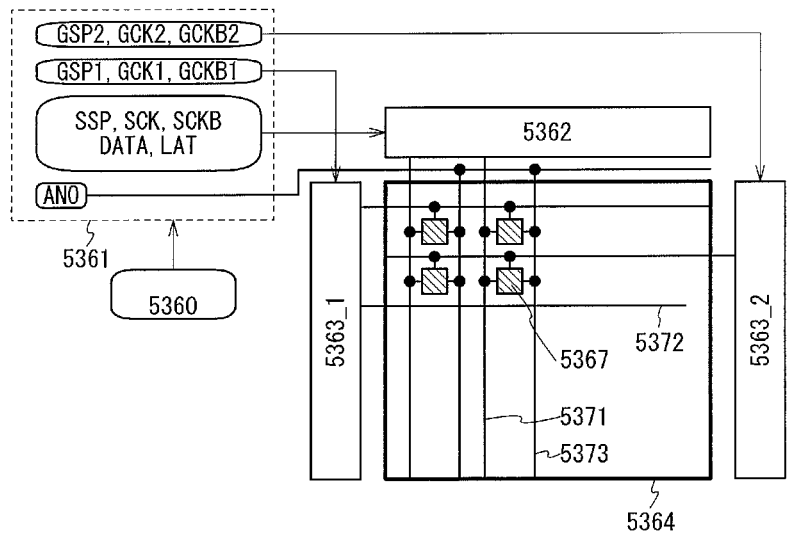

Note that as in FIG. 21B, the circuit 5361 can supply different signals to the circuit 5363_1 and the circuit 5363_2 in FIG. 21A.

The above is the description of one example of the system block of the display device.

Next, examples of structures of the display device will be described with reference to FIGS. 22A to 22E.

Figure 22A:
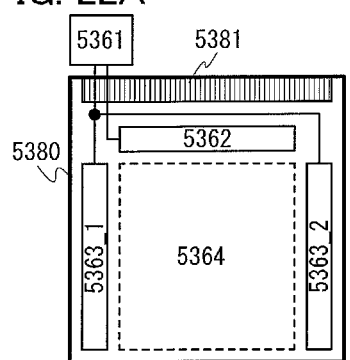
FIGS. 22A to 22E each illustrate a block diagram shown in an embodiment.

In FIG. 22A, circuits which have a function of outputting signals to the pixel portion 5364 (e.g., the circuit 5362, the circuit 5363_1, and the circuit 5363_2) are formed over a substrate 5380 where the pixel portion 5364 is also formed. In addition, the circuit 5361 is formed over a substrate which is different from the substrate where the pixel portion 5364 is formed. In this manner, since the number of external components is reduced, reduction in cost can be achieved. Alternatively, since the number of signals or voltages input to the substrate 5380 is reduced, the number of connections between the substrate 5380 and the external component can be reduced. Accordingly, improvement in reliability or increase in yield can be achieved.

Note that in the case where the circuit is formed over a substrate which is different from the substrate where the pixel portion 5364 is formed, the substrate can be mounted on a flexible printed circuit (FPC) by tape automated bonding (TAB). Alternatively, the substrate can be mounted on the same substrate 5380 as the pixel portion 5364 by chip on glass (COG).

In the case where the circuit is formed over a different substrate from the pixel portion 5364, a transistor formed using a single crystal semiconductor can be formed on the substrate. Therefore, the circuit formed over the substrate can have advantages such as improvement in driving frequency, improvement in driving voltage, or reduction of variation in output signals.

Note that a signal, voltage, current, or the like is input from an external circuit through an input terminal 5381 in many cases.

Figure 22B:
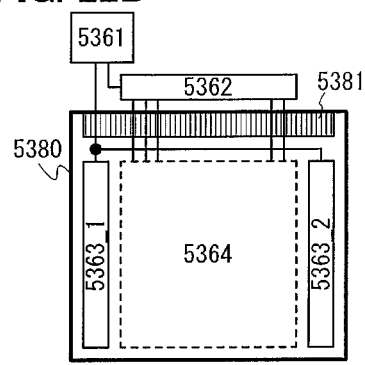

In FIG. 22B, circuits with low driving frequency (e.g., the circuit 5363_1 and the circuit 5363_2) are formed over the substrate 5380 where the pixel portion 5364 is formed. In addition, the circuit 5361 and the circuit 5362 are formed over a substrate which is different from the substrate where the pixel portion 5364 is formed. In this manner, the circuit formed over the substrate 5380 can be constituted by transistors with low mobility. Thus, a non-single-crystal semiconductor, a microcrystalline semiconductor, an organic semiconductor, an oxide semiconductor, or the like can be used for a semiconductor layer of the transistor. Accordingly, increase in the size of the display device, reduction in the number of steps, reduction in cost, improvement in yield, or the like can be achieved.

Figure 22C:
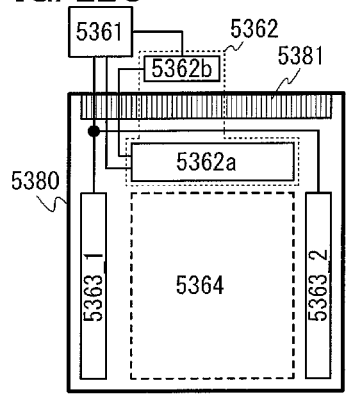

Note that as illustrated in FIG. 22C, part of the circuit 5362 (a circuit 5362a) can be formed over the substrate 5380 where the pixel portion 5364 is formed, and the other part of the circuit 5362 (a circuit 5362b) can be formed over a substrate which is different from the substrate where the pixel portion 5364 is formed. The circuit 5362a often includes a circuit which can be formed using a transistor with low mobility (e.g., a shift register, a selector, or a switch). The circuit 5362b often includes a circuit which is preferably formed using a transistor with high mobility and few variations in characteristics (e.g., a shift register, a latch circuit, a buffer circuit, a DA converter circuit, or an AD converter circuit). Accordingly, as in FIG. 22B, a non-single-crystal semiconductor, a microcrystalline semiconductor, an organic semiconductor, an oxide semiconductor, or the like can be used for a semiconductor layer of the transistor. Further, the number of external components can be reduced.

Figure 22D:
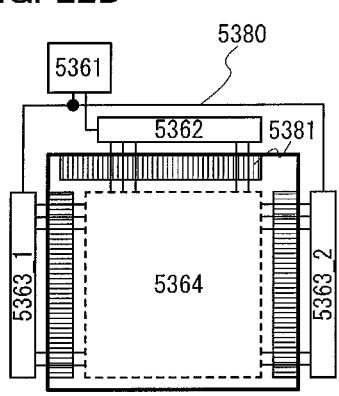

In FIG. 22D, circuits which have a function of outputting signals to the pixel portion 5364 (e.g., the circuit 5362, the circuit 5363_1, and the circuit 5363_2) and a circuit which has a function of controlling these circuits (e.g., the circuit 5361) are formed over a substrate which is different from the substrate where the pixel portion 5364 is formed. In this manner, since the pixel portion and the peripheral circuits can be formed over different substrates, improvement in yield can be achieved.

Note that in FIGS. 22A to 22C, as in FIG. 22D, the circuit 5363_1 and the circuit 5363_2 can be formed over a substrate which is different from the substrate where the pixel portion 5364 is formed.

Figure 22E:
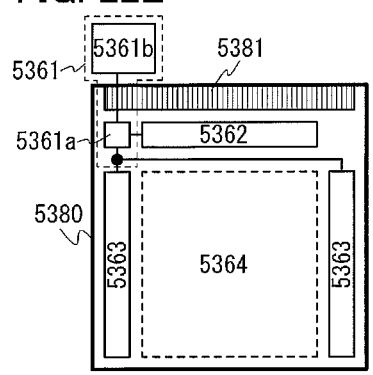

In FIG. 22E, part of the circuit 5361 (a circuit 5361a) is formed over the substrate 5380 over which the pixel portion 5364 is formed, and the other part of the circuit 5361 (a circuit 5361b) is formed over a substrate which is different from the substrate where the pixel portion 5364 is formed. The circuit 5361a often includes a circuit which can be formed using a transistor with low mobility (e.g., a switch, a selector, or a level shift circuit). Moreover, the circuit 5361b often includes a circuit which is preferably formed using a transistor with high mobility and few variations in characteristics (e.g., a shift register, a timing generator, an oscillator, a regulator, or an analog buffer).

Note that also in FIGS. 22A to 22D, the circuit 5361a can be formed over the same substrate as the pixel portion 5364, and the circuit 5361b can be formed over a substrate which is different from the substrate where the pixel portion 5364 is formed.

Note that in this embodiment, what is illustrated in the drawing can be freely combined with or replaced with what is described in other embodiments as appropriate.

Embodiment 10

In this embodiment, an example of steps for manufacturing a transistor and a capacitor will be described. In particular, manufacturing steps in which an oxide semiconductor is used for a semiconductor layer will be described. As an oxide semiconductor layer, a layer represented by $InMO_3(ZnO)_m$ (m>0) can be used. Note that M represents one or more of metal elements selected from Ga, Fe, Ni, Mn, and Co. As an example, only Ga may be contained as M, or any of the above metal elements in addition to Ga, for example, Ga and Ni or Ga and Fe may be contained as M. Note that the oxide semiconductor may contain a transition metal element such as Fe or Ni or oxide of the transition metal element as an impurity element in addition to the metal element contained as M. Such a thin film can be referred to as an In—Ga—Zn—O-based non-single-crystal film. As the oxide semiconductor, ZnO can be used. Note that the concentration of mobile ions in the oxide semiconductor layer, typically sodium, is preferably $5 \times 10^{18}/cm^3$ or less, more preferably $1 \times 10^{18}/cm^3$ or less so as to suppress change in electric characteristics of a transistor. Note that this embodiment is not limited thereto, and various other oxide semiconductor materials can be used for a semiconductor layer. Alternatively, for the semiconductor layer, a single crystal semiconductor, a polycrystalline semiconductor, a microcrystalline (microcrystal or nanocrystal) semiconductor, an amorphous semiconductor, or various non-single-crystal semiconductors can be used.

Figure 23A:
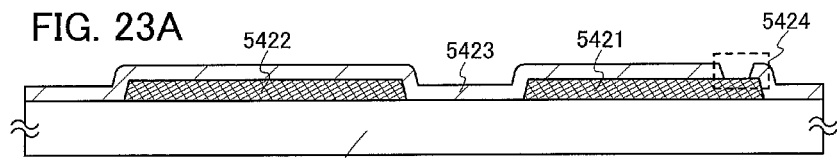
FIGS. 23A to 23E each illustrate a transistor shown in an embodiment.
Figure 23B:
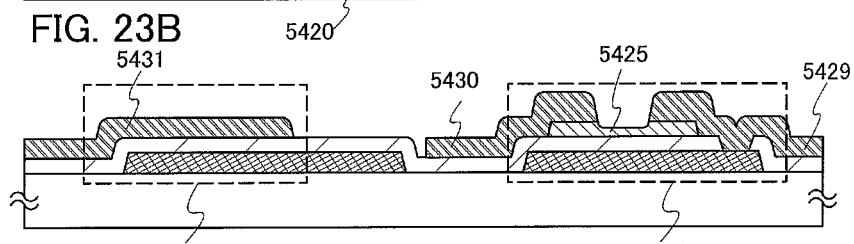
Figure 23C:
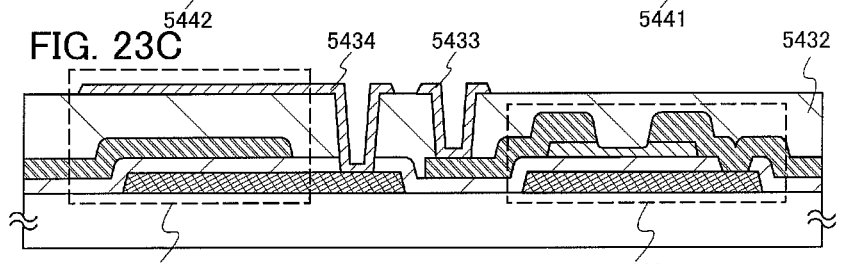

An example of steps for manufacturing a transistor and a capacitor is described with reference to FIGS. 23A to 23C. FIGS. 23A to 23C illustrate an example of steps for manufacturing a transistor 5441 and a capacitor 5442. The transistor 5441 is an example of an inverted staggered thin film transistor, in which a wiring is provided over an oxide semiconductor layer with a source electrode or a drain electrode therebetween.

First, a first conductive layer is formed over the entire surface of a substrate 5420 by a sputtering method. Next, the first conductive layer is selectively etched by using a resist mask formed through a photolithography process using a first photomask, so that a conductive layer 5421 and a conductive layer 5422 are formed. The conductive layer 5421 can function as a gate electrode. The conductive layer 5422 can function as one electrode of the capacitor. Note that this embodiment is not limited thereto, and each of the conductive layers 5421 and 5422 can include a portion functioning as a wiring, a gate electrode, or an electrode of the capacitor. After that, the resist mask is removed.

Next, an insulating layer 5423 is formed over the entire surface by a plasma CVD method or a sputtering method. The insulating layer 5423 can function as a gate insulating layer and is formed so as to cover the conductive layers 5421 and 5422. Note that the thickness of the insulating layer 5423 is often in the range of 50 to 250 nm.

When a silicon oxide layer is used as the insulating layer 5423, the silicon oxide layer can be formed by a CVD method using an organosilane gas. As the organosilane gas, yttrium oxide ($Y_2O_3$) or the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$).

Then, the insulating layer 5423 is selectively etched by using a resist mask formed through a photolithography process using a second photomask, so that a contact hole 5424 which reaches the conductive layer 5421 is formed. After that, the resist mask is removed. Note that this embodiment is not limited thereto, and the contact hole 5424 can be eliminated. Alternatively, the contact hole 5424 can be formed after an oxide semiconductor layer is formed. A cross-sectional view of the steps so far corresponds to FIG. 23A.

Next, an oxide semiconductor layer is formed over the entire surface by a sputtering method. Note that this embodiment is not limited thereto, and it is possible to form the oxide semiconductor layer by a sputtering method and to form an $n^+$ layer thereover. Note that the thickness of the oxide semiconductor layer is often in the range of 5 to 200 nm.

Before the oxide semiconductor layer is formed by a sputtering method, reverse sputtering in which plasma is generated by introduction of an argon gas is preferably performed. By the reverse sputtering, dust attached to a surface of the insulating layer 5423 and a bottom surface of the contact hole 5424 can be removed. The reverse sputtering is a method in which voltage is applied to a substrate, not to a target side, in an argon atmosphere by using an RF power supply and plasma is generated so that a substrate surface is modified. Note that this embodiment is not limited thereto, and nitrogen, helium, or the like can be used instead of the argon atmosphere. Alternatively, the reverse sputtering can be performed in an atmosphere where oxygen, $N_2O$, or the like is added to the argon atmosphere or in an atmosphere where $Cl_2$, $CF_4$, or the like is added to the argon atmosphere. Note that by the reverse sputtering, the thickness of the insulating layer 5423 is reduced from the surface by preferably approximately 2 nm to 10 nm. Formation of the oxide semiconductor layer without exposure to air after such plasma treatment is effective in preventing dust or moisture from being attached to the interface between the gate insulating layer and the oxide semiconductor layer.

Then, the oxide semiconductor layer is selectively etched using a third photomask. After that, a resist mask is removed.

Next, a second conductive layer is formed over the entire surface by a sputtering method. Then, the second conductive layer is selectively etched by using a resist mask formed through a photolithography process using a fourth photomask, so that a conductive layer 5429, a conductive layer 5430, and a conductive layer 5431 are formed. The conductive layer 5429 is connected to the conductive layer 5421 through the contact hole 5424. The conductive layers 5429 and 5430 can function as the source electrode and the drain electrode. The conductive layer 5431 can function as the other electrode of the capacitor. Note that this embodiment is not limited thereto, and each of the conductive layers 5429, 5430, and 5431 can include a portion functioning as a wiring, a source or drain electrode, or the electrode of the capacitor.

Note that if heat treatment (e.g., at 200° C. to 600° C.) is performed in a subsequent step, the second conductive layer preferably has heat resistance high enough to withstand the heat treatment. Accordingly, for the second conductive layer, Al and a heat-resistant conductive material (e.g., an element such as Ti, Ta, W, Mo, Cr, Nd, Sc, Zr, or Ce; an alloy in which these elements are combined; or nitride containing any of these elements) are preferably used in combination. Note that this embodiment is not limited thereto, and by employing a layered structure, the second conductive layer can have heat resistance. For example, it is possible to provide a film of a heat-resistant conductive material such as Ti or Mo above and below an Al film.

Before the second conductive layer is formed by a sputtering method, reverse sputtering in which plasma is generated by introduction of an argon gas is preferably performed so that dust attached to the surface of the insulating layer 5423, a surface of the oxide semiconductor layer, and the bottom surface of the contact hole 5424 is removed. Note that this embodiment is not limited thereto, and nitrogen, helium, or the like can be used instead of the argon atmosphere. Alternatively, the reverse sputtering can be performed in an atmosphere where oxygen, hydrogen, $N_2O$, or the like is added to the argon atmosphere or in an atmosphere where $Cl_2$, $CF_4$, or the like is added to the argon atmosphere.

Note that at the time of etching the second conductive layer, part of the oxide semiconductor layer is also etched, so that an oxide semiconductor layer 5425 is formed. By this etching, part of the oxide semiconductor layer 5425, which overlaps with the conductive layer 5421, or part of the oxide semiconductor layer 5425, over which the second conductive layer is not formed, is etched to be thinned in many cases. Note that this embodiment is not limited thereto, and it is possible not to etch the oxide semiconductor layer. However, in the case where the $n^+$ layer is formed over the oxide semiconductor layer, the oxide semiconductor layer is often etched. After that, the resist mask is removed. The transistor 5441 and the capacitor 5442 are completed when this etching is finished. A cross-sectional view of the steps so far corresponds to FIG. 23B.

Here, when the reverse sputtering is performed before the second conductive layer is formed by a sputtering method, the thickness of an exposed portion of the insulating layer 5423 is reduced by preferably approximately 2 nm to 10 nm in some cases. Accordingly, a recessed portion is sometimes formed in the insulating layer 5423. Alternatively, by performing the reverse sputtering after the second conductive layer is etched to form the conductive layers 5429, 5430, and 5431, end portions of the conductive layers 5429, 5430, and 5431 are curved in some cases as illustrated in FIG. 23B.

Next, heat treatment is performed at 200° C. to 600° C. in an air atmosphere or a nitrogen atmosphere. Through this heat treatment, rearrangement at the atomic level occurs in the In—Ga—Zn—O-based non-single-crystal layer. This heat treatment (including optical annealing) is important because strain energy which inhibits carrier movement is released by the heat treatment. Note that there is no particular limitation on the timing at which the heat treatment is performed, and the heat treatment can be performed at any time after the oxide semiconductor layer is formed.

Then, an insulating layer 5432 is formed over the entire surface. The insulating layer 5432 can have a single-layer structure or a layered structure. For example, when an organic insulating layer is used as the insulating layer 5432, the organic insulating layer is formed in such a manner that a composition which is a material for the organic insulating layer is applied and subjected to heat treatment at 200° C. to 600° C. in an air atmosphere or a nitrogen atmosphere. By forming the organic insulating layer in contact with the oxide semiconductor layer in such a manner, a thin film transistor with highly reliable electric characteristics can be manufactured. Note that when organic insulating layer is used as the insulating layer 5432, a silicon nitride film or a silicon oxide film can be provided below the organic insulating layer.

FIG. 23C illustrates a mode in which the insulating layer 5432 is formed using a non-photosensitive resin, so that an end portion of the insulating layer 5432 is angular in the cross section of a region where the contact hole is formed. However, when the insulating layer 5432 is formed using a photosensitive resin, the end portion of the insulating layer 5432 can be curved in the cross section of the region where the contact hole is formed. Thus, the coverage of the insulating layer 5432 with a third conductive layer or a pixel electrode which is formed later is increased.

Note that instead of application of the composition, the following method can be used depending on the material: dip coating, spray coating, an ink-jet method, a printing method, a doctor knife, a roll coater, a curtain coater, a knife coater, or the like.

Note that without performing the heat treatment after the oxide semiconductor layer is formed, the heat treatment for the composition, which is the material for the organic insulating layer, can also serve to heat the oxide semiconductor layer.

The insulating layer 5432 can be formed to a thickness of 200 nm to 5 µm, preferably 300 nm to 1 µm.

Next, the third conductive layer is formed over the entire surface. Then, the third conductive layer is selectively etched by using a resist mask formed through a photolithography process using a fifth photomask, so that a conductive layer 5433 and a conductive layer 5434 are formed. A cross-sectional view of the steps so far corresponds to FIG. 23C. Each of the conductive layers 5433 and 5434 can function as a wiring, a pixel electrode, a reflective electrode, a transparent electrode, or the electrode of the capacitor. In particular, since the conductive layer 5434 is connected to the conductive layer 5422, it can function as the electrode of the capacitor 5442. Note that this embodiment is not limited thereto, and the conductive layers 5433 and 5434 can have a function of connecting the first conductive layer and the second conductive layer. For example, by connecting the conductive layers 5433 and 5434 to each other, the conductive layer 5422 and the conductive layer 5430 can be connected through the third conductive layer (the conductive layers 5433 and 5434).

Since the capacitor 5442 has a structure where the conductive layer 5431 is sandwiched between the conductive layers 5422 and 5434, the capacitance value of the capacitor 5442 can be increased. Note that this embodiment is not limited thereto, and one of the conductive layers 5422 and 5434 can be eliminated.

Note that after the resist mask is removed by wet etching, it is possible to perform heat treatment at 200° C. to 600° C. in an air atmosphere or a nitrogen atmosphere.

Through the above steps, the transistor 5441 and the capacitor 5442 can be manufactured.

Figure 23D:
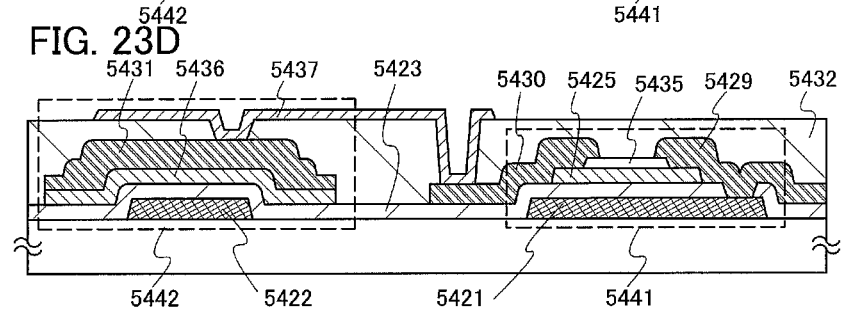

Note that as illustrated in FIG. 23D, an insulating layer 5435 can be formed over the oxide semiconductor layer 5425. The insulating layer 5435 has a function of preventing the oxide semiconductor layer from being etched when the second conductive layer is patterned, and functions as a channel stop film. Accordingly, the thickness of the oxide semiconductor layer can be reduced, so that reduction in driving voltage, reduction in off-state current, increase in the on/off ratio of drain current, improvement in subthreshold swing (S value), or the like of the transistor can be achieved. The insulating layer 5435 can be formed in such a manner that an oxide semiconductor layer and an insulating layer are successively formed over the entire surface, and then, the insulating layer is selectively patterned using a resist mask formed through a photolithography process using a photomask. After that, the second conductive layer is formed over the entire surface, and the oxide semiconductor layer is patterned at the same time as the second conductive layer. That is, the oxide semiconductor layer and the second conductive layer can be patterned using the same mask (reticle). In that case, the oxide semiconductor layer is always placed below the second conductive layer. In such a manner, the insulating layer 5435 can be formed without increase in the number of steps. The oxide semiconductor layer is often formed below the second conductive layer in such a manufacturing process. However, this embodiment is not limited thereto. The insulating layer 5435 can be formed in such a manner that after an oxide semiconductor layer is patterned, an insulating layer is formed over the entire surface and is patterned.

In FIG. 23D, the capacitor 5442 has a structure where the insulating layer 5423 and an oxide semiconductor layer 5436 are sandwiched between the conductive layers 5422 and 5431. Note that the oxide semiconductor layer 5436 can be eliminated. Moreover, the conductive layers 5430 and 5431 are connected through a conductive layer 5437 which is formed by patterning the third conductive layer. Such a structure can be used for a pixel of a liquid crystal display device, for example. For example, the transistor 5441 can function as a switching transistor, and the capacitor 5442 can function as a storage capacitor. Moreover, the conductive layers 5421, 5422, 5429, and 5437 can function as a gate line, a capacitor line, a source line, and a pixel electrode, respectively. Note that this embodiment is not limited thereto. In addition, as in FIG. 23D, the conductive layer 5430 and the conductive layer 5431 can be connected through the third conductive layer in FIG. 23C.

Figure 23E:
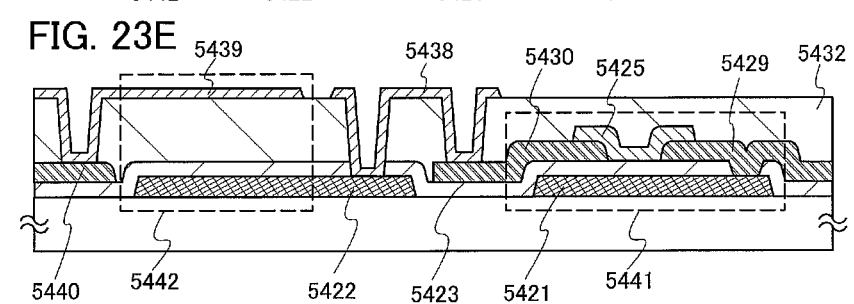

Note that as illustrated in FIG. 23E, the oxide semiconductor layer 5425 can be formed after the second conductive layer is patterned. Accordingly, the oxide semiconductor layer is not yet formed when the second conductive layer is patterned, so that the oxide semiconductor layer is not etched.

Thus, the thickness of the oxide semiconductor layer can be reduced, so that reduction in driving voltage, reduction in off-state current, increase in the on/off ratio of drain current, improvement in S value, or the like of the transistor can be achieved. Note that the oxide semiconductor layer 5425 can be formed in such a manner that after the second conductive layer is patterned, an oxide semiconductor layer is formed over the entire surface and selectively patterned using a resist mask formed through a photolithography process using a photomask.

In FIG. 23E, the capacitor has a structure where the insulating layers 5423 and 5432 are sandwiched between the conductive layer 5422 and a conductive layer 5439 which is formed by patterning the third conductive layer. Moreover, the conductive layers 5422 and 5430 are connected through a conductive layer 5438 which is formed by patterning the third conductive layer. Further, the conductive layer 5439 is connected to a conductive layer 5440 which is formed by patterning the second conductive layer. In addition, as in FIG. 23E, the conductive layers 5430 and 5422 can be connected through the conductive layer 5438 in FIGS. 23C and 23D.

A complete depletion state can be obtained by making the thickness of the oxide semiconductor layer (or a channel layer) smaller than that of a depletion layer formed in the case where the transistor is off. Accordingly, the off-state current can be reduced. In order to realize this, the thickness of the oxide semiconductor layer is preferably 20 nm or less, more preferably 10 nm or less, and further preferably 6 nm or less.

Note that in order to realize reduction in operation voltage, reduction in off-state current, increase in the on/off ratio of drain current, improvement in S value, or the like of the transistor, the thickness of the oxide semiconductor layer is preferably the smallest among those of the layers included in the transistor. For example, the thickness of the oxide semiconductor layer is preferably smaller than that of the insulating layer 5423. More preferably, the thickness of the oxide semiconductor layer is half or less, further preferably $1/5$ or less, and still preferably $1/10$ or less than the thickness of the insulating layer 5423. Note that this embodiment is not limited thereto, and the thickness of the oxide semiconductor layer can be larger than that of the insulating layer 5423 in order to improve the reliability. Since the thickness of the oxide semiconductor layer is preferably larger particularly in the case where the oxide semiconductor layer is etched as in FIG. 23C, it is possible to make the thickness of the oxide semiconductor layer larger than that of the insulating layer 5423.

Note that in order to increase the withstand voltage of the transistor, the thickness of the insulating layer 5423 is preferably larger, more preferably $3/4$ or more, and further preferably $4/3$ or more than the thickness of the first conductive layer. Note that this embodiment is not limited thereto, and the thickness of the insulating layer 5423 can be smaller than that of the first conductive layer in order to increase the mobility of the transistor.

Note that for the substrate, the insulating film, the conductive film, and the semiconductor layer in this embodiment, materials described in other embodiments or materials similar to those described in this specification can be used.

Note that in this embodiment, what is illustrated in the drawing can be freely combined with or replaced with what is described in other embodiments as appropriate.

Embodiment 11

In this embodiment, examples of structures of transistors will be described with reference to FIGS. 24A to 24C.

Figure 24A:
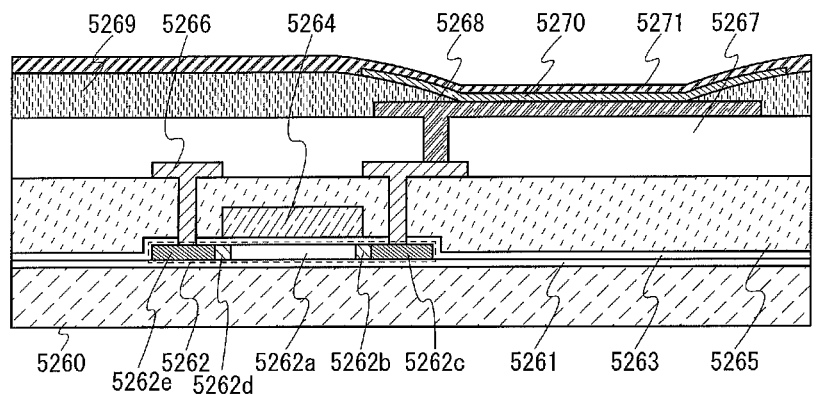
FIGS. 24A to 24C each illustrate a transistor shown in an embodiment.

FIG. 24A illustrates an example of a structure of a top-gate transistor. FIG. 24B illustrates an example of a structure of a bottom-gate transistor. FIG. 24C illustrates an example of a structure of a transistor formed using a semiconductor substrate.

FIG. 24A illustrates a substrate 5260; an insulating layer 5261 formed over the substrate 5260; a semiconductor layer 5262 which is formed over the insulating layer 5261 and includes a region 5262a, a region 5262b, a region 5262c, a region 5262d, and a region 5262e; an insulating layer 5263 formed so as to cover the semiconductor layer 5262; a conductive layer 5264 formed over the semiconductor layer 5262 and the insulating layer 5263; an insulating layer 5265 which is formed over the insulating layer 5263 and the conductive layer 5264 and is provided with opening portions; a conductive layer 5266 which is formed over the insulating layer 5265 and in the opening portions formed in the insulating layer 5265; an insulating layer 5267 which is formed over the conductive layer 5266 and the insulating layer 5265 and is provided with an opening portion; a conductive layer 5268 which is formed over the insulating layer 5267 and in the opening portion formed in the insulating layer 5267; an insulating layer 5269 which is formed over the insulating layer 5267 and the conductive layer 5268 and is provided with an opening portion; a light-emitting layer 5270 formed over the insulating layer 5269 and in the opening portion formed in the insulating layer 5269; and a conductive layer 5271 formed over the insulating layer 5269 and the light-emitting layer 5270.

Figure 24B:
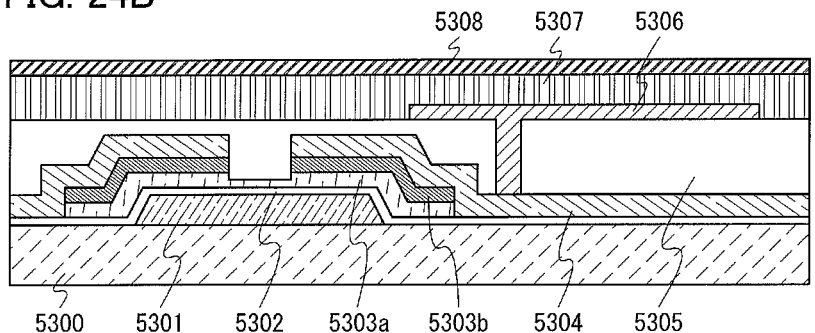

FIG. 24B illustrates a substrate 5300; a conductive layer 5301 formed over the substrate 5300; an insulating layer 5302 formed so as to cover the conductive layer 5301; a semiconductor layer 5303a formed over the conductive layer 5301 and the insulating layer 5302; a semiconductor layer 5303b formed over the semiconductor layer 5303a; a conductive layer 5304 formed over the semiconductor layer 5303b and the insulating layer 5302; an insulating layer 5305 which is formed over the insulating layer 5302 and the conductive layer 5304 and is provided with an opening portion; a conductive layer 5306 formed over the insulating layer 5305 and in the opening portion formed in the insulating layer 5305; a liquid crystal layer 5307 provided over the insulating layer 5305 and the conductive layer 5306; and a conductive layer 5308 formed over the liquid crystal layer 5307.

Figure 24C:
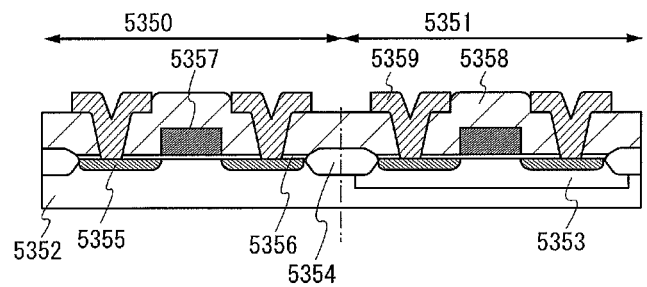

FIG. 24C illustrates a semiconductor substrate 5352 including a region 5353 and a region 5355; an insulating layer 5356 formed on the semiconductor substrate 5352; an insulating layer 5354 formed on the semiconductor substrate 5352; a conductive layer 5357 formed over the insulating layer 5356; an insulating layer 5358 which is formed over the insulating layer 5354, the insulating layer 5356, and the conductive layer 5357 and is provided with opening portions; and a conductive layer 5359 formed over the insulating layer 5358 and in the opening portions formed in the insulating layer 5358. Accordingly, a transistor is formed in each of a region 5350 and a region 5351.

The insulating layer 5261 can function as a base film. The insulating layer 5354 functions as an element isolation layer (e.g., a field oxide film). Each of the insulating layer 5263, the insulating layer 5302, and the insulating layer 5356 can function as a gate insulating film. Each of the conductive layer 5264, the conductive layer 5301, and the conductive layer 5357 can function as a gate electrode. Each of the insulating layer 5265, the insulating layer 5267, the insulating layer 5305, and the insulating layer 5358 can function as an interlayer film or a planarization film. Each of the conductive layer 5266, the conductive layer 5304, and the conductive layer 5359 can function as a wiring, an electrode of a transistor, an electrode of a capacitor, or the like. Each of the conductive layer 5268 and the conductive layer 5306 can function as a pixel electrode, a reflective electrode, or the like. The insulating layer 5269 can function as a bank. Each of the conductive layer 5271 and the conductive layer 5308 can function as a counter electrode, a common electrode, or the like.

As each of the substrate 5260 and the substrate 5300, a glass substrate, a quartz substrate, a single crystal substrate (e.g., a silicon substrate), an SOI substrate, a plastic substrate, a metal substrate, a stainless steel substrate, a substrate including a stainless steel foil, a tungsten substrate, a substrate including a tungsten foil, or a flexible substrate can be used, for example. Examples of the glass substrate are barium borosilicate glass and aluminoborosilicate glass. Examples of the flexible substrate are flexible synthetic resins such as plastics typified by polyethylene terephthalate (PET), polyethylene naphthalate (PEN), and polyethersulfone (PES), and acrylic. In addition, an attachment film (formed using polypropylene, polyester, vinyl, polyvinyl fluoride, polyvinyl chloride, or the like), paper including a fibrous material, a base material film (polyester, polyamide, polyimide, an inorganic vapor deposition film, paper, or the like), or the like can be used.

As the semiconductor substrate 5352, a single crystal silicon substrate having n-type or p-type conductivity can be used, for example. Note that this embodiment is not limited to this, and a substrate which is similar to the substrate 5260 can be used. As an example, the region 5353 is a region where an impurity is added to the semiconductor substrate 5352, and functions as a well. For example, in the case where the semiconductor substrate 5352 has p-type conductivity, the region 5353 has n-type conductivity and functions as an n-well. On the other hand, in the case where the semiconductor substrate 5352 has n-type conductivity, the region 5353 has p-type conductivity and functions as a p-well. As an example, the region 5355 is a region where an impurity is added to the semiconductor substrate 5352, and functions as a source region or a drain region. Note that an LDD region can be formed in the semiconductor substrate 5352.

For the insulating layer 5261, a single-layer structure or a layered structure of an insulating film containing oxygen or nitrogen, such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film can be used, for example. In the case where the insulating layer 5261 has a two-layer structure, a silicon nitride film and a silicon oxide film can be formed as a first insulating layer and a second insulating layer, respectively, for example. In the case where the insulating layer 5261 has a three-layer structure, a silicon oxide film, a silicon nitride film, and a silicon oxide film can be formed as a first insulating layer, a second insulating layer, and a third insulating layer, respectively, for example.

For the semiconductor layer 5262, the semiconductor layer 5303*a*, and the semiconductor layer 5303*b*, a non-single-crystal semiconductor (e.g., amorphous silicon, polycrystalline silicon, or microcrystalline silicon), a single crystal semiconductor, a compound semiconductor or an oxide semiconductor (e.g., ZnO, InGaZnO, SiGe, GaAs, IZO, ITO, SnO, TiO, or AlZnSnO (AZTO)), an organic semiconductor, or a carbon nanotube can be used, for example.

For example, the region 5262*a* is an intrinsic region where an impurity is not added to the semiconductor layer 5262, and functions as a channel region. However, a slight amount of impurities can be added to the region 5262*a*. The concentration of the impurity added to the region 5262*a* is preferably lower than the concentration of an impurity added to the region 5262*b*, the region 5262*c*, the region 5262*d*, or the region 5262*e*. Each of the region 5262*b* and the region 5262*d* is a region to which an impurity is added at low concentration, and functions as an LDD (lightly doped drain) region. Note that the region 5262*b* and the region 5262*d* can be eliminated. Each of the region 5262*c* and the region 5262*e* is a region to which an impurity is added at high concentration, and functions as a source region or a drain region.

Note that the semiconductor layer 5303*b* is a semiconductor layer to which phosphorus or the like is added as an impurity element, and has n-type conductivity.

Note that when an oxide semiconductor or a compound semiconductor is used for the semiconductor layer 5303*a*, the semiconductor layer 5303*b* can be eliminated.

For each of the insulating layer 5263, the insulating layer 5302, and the insulating layer 5356, a single-layer structure or a layered structure of an insulating film containing oxygen or nitrogen, such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film can be used, for example.

As each of the conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359, a conductive film having a single-layer structure or a layered structure can be used, for example. For the conductive film, a single-layer film containing one element selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), phosphorus (P), boron (B), arsenic (As), gallium (Ga), indium (In), tin (Sn), oxygen (O), zirconium (Zr), and cerium (Ce); or a compound containing one or more elements selected from the above group can be used, for example. Examples of the compound are an alloy containing one or more elements selected from the above group (e.g., an alloy material such as indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—W), aluminum-zirconium (Al—Zr), aluminum-titanium (Al—Ti), aluminum-cerium (Al—Ce), magnesium-silver (Mg—Ag), molybdenum-niobium (Mo—Nb), molybdenum-tungsten (Mo—W), or molybdenum-tantalum (Mo—Ta)); a compound containing nitrogen and one or more elements selected from the above group (e.g., a nitride film containing titanium nitride, tantalum nitride, or molybdenum nitride); and a compound containing silicon and one or more elements selected from the above group (e.g., a silicide film containing tungsten silicide, titanium silicide, nickel silicide, aluminum silicon, or molybdenum silicon). Alternatively, a nanotube material such as a carbon nanotube, an organic nanotube, an inorganic nanotube, or a metal nanotube can be used.

Note that silicon (Si) can contain an n-type impurity (e.g., phosphorus) or a p-type impurity (e.g., boron). When silicon contains the impurity, increase in conductivity or a function similar to a general conductor can be realized. Accordingly, such silicon can be utilized easily as a wiring, an electrode, or the like.

Note that as silicon, silicon with various levels of crystallinity, such as single crystal silicon, polycrystalline silicon (polysilicon), or microcrystalline (microcrystal) silicon; or silicon without crystallinity, such as amorphous silicon, can be used. By using single crystal silicon or polycrystalline silicon as silicon, the resistance of a wiring, an electrode, a conductive layer, a conductive film, a terminal, or the like can be reduced. By using amorphous silicon or microcrystalline silicon as silicon, a wiring or the like can be formed through a simple process.

Note that when a semiconductor material such as silicon is used for the conductive layer, the semiconductor material such as silicon can be formed at the same time as a semiconductor layer of a transistor.

Aluminum and silver have high conductivity, so that signal delay can be reduced. Moreover, since aluminum and silver can be easily etched, they are easily patterned and can be minutely processed.

Copper has high conductivity, so that signal delay can be reduced. When copper is used for the conductive layer, a layered structure is preferably employed in order to improve adhesion.

Molybdenum and titanium are preferable because of the following reasons: molybdenum and titanium are not likely to cause defects even if they are in contact with an oxide semiconductor (e.g., ITO or IZO) or silicon; and molybdenum and titanium are easily etched and have high heat resistance. Accordingly, molybdenum or titanium is preferably used for a conductive layer which is in contact with an oxide semiconductor or silicon.

Tungsten is preferable because it has advantages such as high heat resistance.

Neodymium is preferable because it has advantages such as high heat resistance. In particular, when an alloy material of neodymium and aluminum is used for the conductive layer, aluminum hardly causes hillocks. Note that this embodiment is not limited thereto, and hillocks are hardly generated in aluminum when an alloy material of aluminum and tantalum, zirconium, titanium, or cerium is used. In particular, an alloy material of aluminum and cerium can drastically reduce arcing.

Since ITO, IZO, ITSO, ZnO, Si, SnO, CTO, a carbon nanotube, or the like has light-transmitting properties, such a material can be used for a portion through which light passes, such as a pixel electrode, a counter electrode, or a common electrode. In particular, IZO is preferable because it is easily etched and processed. In etching IZO, residues are hardly left. Accordingly, when IZO is used for a pixel electrode, defects (e.g., short circuit or orientation disorder) of a liquid crystal element or a light-emitting element can be reduced.

Note that a conductive layer can have a single-layer structure or a multi-layer structure. When a single-layer structure is employed, a process for manufacturing a wiring, an electrode, a conductive layer, a conductive film, a terminal, or the like can be simplified, the number of days for a process can be reduced, and costs can be reduced. On the other hand, when a multi-layer structure is employed, a wiring, an electrode, or the like with high quality can be formed while an advantage of each material is utilized and a disadvantage thereof is reduced. For example, when a low-resistant material (e.g., aluminum) is included in a multi-layer structure, reduction in resistance of a wiring can be realized. As another example, when a layered structure is employed in which a low heat-resistant material is sandwiched between high heat-resistant materials, heat resistance of a wiring, an electrode, or the like can be increased while advantages of the low heat-resistance material are utilized. As an example of such a layered structure, it is preferable to employ a layered structure in which a layer containing aluminum is sandwiched between layers containing molybdenum, titanium, neodymium, or the like.

When wirings, electrodes, or the like are in direct contact with each other, they adversely affect each other in some cases. For example, in some cases, one wiring or one electrode is mixed into a material of another wiring or another electrode and changes its properties, whereby an intended function cannot be obtained. As another example, when a high-resistant portion is formed, a problem may occur so that the portion cannot be normally formed. In such cases, a material whose properties are changed by reaction with a different material can be sandwiched between or covered with materials which do not easily react with the different material. For example, when ITO and aluminum are connected to each other, titanium, molybdenum, an alloy of neodymium, or the like can be sandwiched between ITO and aluminum. For example, when silicon and aluminum are connected to each other, titanium, molybdenum, or an alloy of neodymium can be sandwiched between silicon and aluminum. Note that such a material can be used for a wiring, an electrode, a conductive layer, a conductive film, a terminal, a via, a plug, or the like.

For each of the insulating layer 5265, the insulating layer 5267, the insulating layer 5269, the insulating layer 5305, and the insulating layer 5358, an insulating layer having a single-layer structure or a layered structure can be used, for example. As the insulating layer, a film containing oxygen or nitrogen, such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film; a film containing carbon such as a diamond-like carbon (DLC) film; an organic material such as a siloxane resin, epoxy, polyimide, polyamide, polyvinyl phenol, benzocyclobutene, or acrylic; or the like can be used, for example.

For the light-emitting layer 5270, an organic EL element or an inorganic EL element can be used, for example. As an example, the organic EL element can have a single-layer structure or a layered structure of a hole injection layer formed using a hole injection material, a hole transport layer formed using a hole transport material, a light-emitting layer formed using a light-emitting material, an electron transport layer formed using an electron transport material, an electron injection layer formed using an electron injection material, or a layer in which a plurality of these materials are mixed.

The following liquid crystal can be used for the liquid crystal layer 5307: nematic liquid crystal, cholesteric liquid crystal, smectic liquid crystal, discotic liquid crystal, thermotropic liquid crystal, lyotropic liquid crystal, low molecular liquid crystal, high molecular liquid crystal, polymer dispersed liquid crystal (PDLC), ferroelectric liquid crystal, anti-ferroelectric liquid crystal, main chain type liquid crystal, side chain type polymer liquid crystal, plasma addressed liquid crystal (PALC), and banana-shaped liquid crystal. Moreover, the following methods can be used for driving the liquid crystal, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue phase mode.

Note that an insulating layer which functions as an alignment film, an insulating layer which functions as a protrusion portion, or the like can be formed over the insulating layer 5305 and the conductive layer 5306.

Note that a color filter, a black matrix, an insulating layer which functions as a protrusion portion, or the like can be formed over the conductive layer 5308. An insulating layer which functions as an alignment film can be formed below the conductive layer 5308.

Note that in the cross-sectional structure in FIG. 24A, the insulating layer 5269, the light-emitting layer 5270, and the conductive layer 5271 can be eliminated, and the liquid crystal layer 5307 and the conductive layer 5308 which are illustrated in FIG. 24B can be formed over the insulating layer 5267 and the conductive layer 5268.

Note that in the cross-sectional structure in FIG. 24B, the liquid crystal layer 5307 and the conductive layer 5308 can be eliminated, and the insulating layer 5269, the light-emitting layer 5270, and the conductive layer 5271 which are illustrated in FIG. 24A can be formed over the insulating layer 5305 and the conductive layer 5306.

Note that in the cross-sectional structure in FIG. 24C, the insulating layer 5269, the light-emitting layer 5270, and the conductive layer 5271 which are illustrated in FIG. 24A can be formed over the insulating layer 5358 and the conductive layer 5359. Alternatively, the liquid crystal layer 5307 and the conductive layer 5308 which are illustrated in FIG. 24B can be formed over the insulating layer 5358 and the conductive layer 5359.

Note that in this embodiment, what is illustrated in the drawing can be freely combined with or replaced with what is described in other embodiments as appropriate.

Embodiment 12

In this embodiment, examples of electronic devices will be described.

FIGS. 26A to 26H and FIGS. 27A to 27D illustrate electronic devices. These electronic devices can each include a housing 9630, a display portion 9631, a speaker 9633, an LED lamp 9634, an operation key 9635, a connecting terminal 9636, a sensor 9637 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9638, and the like.

Figure 26A:
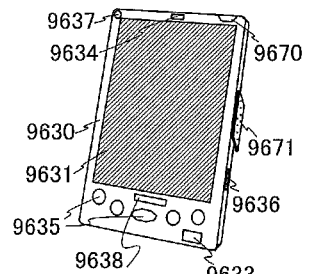
FIGS. 26A to 26H each illustrate an electronic device shown in an embodiment.
Figure 26B:
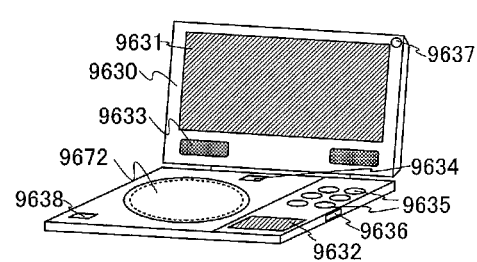
Figure 26C:
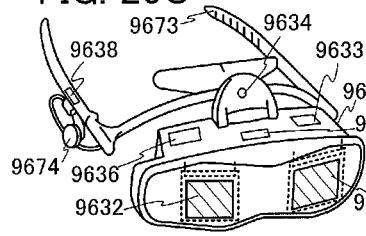
Figure 26D:
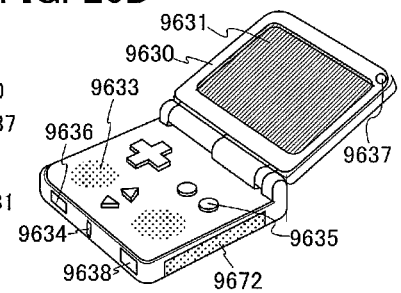
Figure 26E:
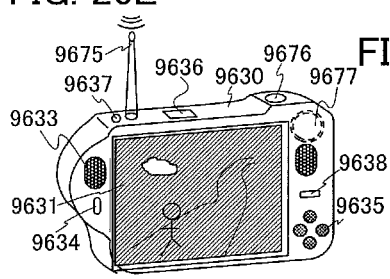
Figure 26F:
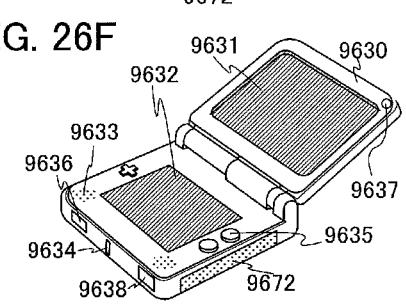
Figure 26G:
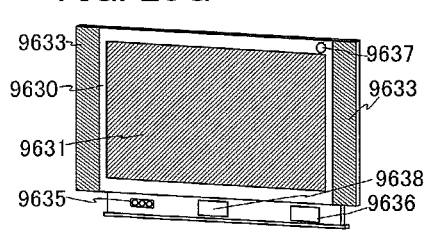
Figure 26H:
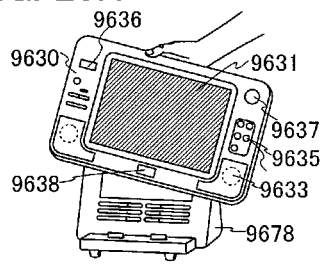

FIG. 26A illustrates a mobile computer which can include a switch 9670, an infrared port 9671, and the like in addition to the above objects. FIG. 26B illustrates a portable image reproducing device (e.g., a DVD reproducing device) provided with a memory medium, and the image reproducing device can include a second display portion 9632, a memory medium reading portion 9672, and the like in addition to the above objects. FIG. 26C illustrates a goggle-type display which can include the second display portion 9632, a supporting portion 9673, an earphone 9674, and the like in addition to the above objects. FIG. 26D illustrates a portable game machine which can include the memory medium reading portion 9672 and the like in addition to the above objects. FIG. 26E illustrates a digital camera having a television reception function, which can include an antenna 9675, a shutter button 9676, an image receiving portion 9677, and the like in addition to the above objects. FIG. 26F illustrates a portable game machine which can include the second display portion 9632, the memory medium reading portion 9672, and the like in addition to the above objects. FIG. 26G illustrates a television receiver which can include a tuner, an image processing portion, and the like in addition to the above objects. FIG. 26H illustrates a portable television receiver which can include a charger 9678 that can transmit and receive signals and the like in addition to the above objects. FIG. 27A illustrates a display which can include a supporting board 9679 and the like in addition to the above objects. FIG. 27B illustrates a camera which can include an external connecting port 9680, the shutter button 9676, the image receiver portion 9677, and the like in addition to the above objects. FIG. 27C illustrates a computer which can include a pointing device 9681, the external connecting port 9680, a reader/writer 9682, and the like in addition to the above objects. FIG. 27D illustrates a mobile phone which can include a transmitting portion, a receiving portion, a tuner of one-segment partial reception service for mobile phones and mobile terminals ("1seg"), and the like in addition to the above objects.

The electronic devices illustrated in FIGS. 26A to 26H and FIGS. 27A to 27D can have a variety of functions, for example, a function of displaying various kinds of information (e.g., still images, moving images, and text images) on a display portion, a touch panel function, a function of displaying a calendar, date, time, and the like, a function of controlling processing with various kinds of software (programs), a wireless communication function, a function of being connected to a variety of computer networks with a wireless communication function, a function of transmitting and receiving various kinds of data with a wireless communication function, and a function of reading program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiver portion can have a function of shooting a still image, a function of shooting a moving image, a function of automatically or manually correcting a shot image, a function of storing a shot image in a memory medium (an external memory medium or a memory medium incorporated in the camera), a function of displaying a shot image on the display portion, or the like. Note that functions which can be provided for the electronic devices illustrated in FIGS. 26A to 26H and FIGS. 27A to 27D are not limited to those described above, and the electronic devices can have a variety of functions.

The electronic devices described in this embodiment each include the display portion for displaying some sort of information. In the electronic device, influence of variation in characteristics of transistors is reduced in the display portion, whereby an extremely uniform image can be displayed.

Next, application examples of the semiconductor device will be described.

FIG. 27E illustrates an example in which the semiconductor device is provided so as to be integrated with a building. FIG. 27E illustrates a housing 9730, a display portion 9731, a remote controller device 9732 which is an operation portion, a speaker 9733, and the like. The semiconductor device is integrated with the building as a hung-on-wall type and can be provided without a large space.

FIG. 27F illustrates another example in which the semiconductor device is provided so as to be integrated with a building. A display panel 9741 is integrated with a prefabricated bath 9742, so that a person who takes a bath can watch the display panel 9741.

Note that although this embodiment gives the wall and the prefabricated bath as examples of the building, this embodiment is not limited thereto and the semiconductor device can be provided in a variety of buildings.

Next, examples in which the semiconductor device is provided so as to be integrated with a moving body will be described.

FIG. 27G illustrates an example in which the semiconductor device is provided in a vehicle. A display panel 9761 is provided in a body 9762 of the vehicle and can display information input from the operation of the body or the outside of the body on demand. Note that the display panel 9761 may have a navigation function.

FIG. 27H illustrates an example in which the semiconductor device is provided so as to be integrated with a passenger airplane. FIG. 27H illustrates a usage pattern when a display panel 9782 is provided on a ceiling 9781 above a seat in the passenger airplane. The display panel 9782 is integrated with the ceiling 9781 through a hinge portion 9783, and a passenger can watch the display panel 9782 by extending and contracting the hinge portion 9783. The display panel 9782 has a function of displaying information when operated by the passenger.

Note that although this embodiment gives the body of the vehicle and the body of the plane as examples of the moving body, this embodiment is not limited thereto. The semiconductor device can be provided to a variety of moving bodies such as a two-wheeled motor vehicle, a four-wheeled vehicle (including a car, bus, and the like), a train (including a monorail, a railway, and the like), and a ship.

Note that in this embodiment, what is illustrated in the drawing can be freely combined with or replaced with what is described in other embodiments as appropriate.

This application is based on Japanese Patent Application serial no. 2009-045574 filed with Japan Patent Office on Feb. 27, 2009, the entire contents of which are hereby incorporated by reference.

What is claimed is:

1. A method for driving a semiconductor device, the semiconductor device comprising:
    a transistor with n-type conductivity;
    a wiring;
    a first switch configured to control a conduction state between a gate of the transistor and a first terminal of the transistor;
    a second switch configured to control a conduction state between the first terminal of the transistor and the wiring;
    a capacitor electrically connected between the gate of the transistor and a second terminal of the transistor; and
    a display element,
    wherein the method for driving the semiconductor device includes:
        in a first period, holding a sum of a voltage corresponding to a threshold voltage of the transistor and an image signal voltage in the capacitor,
        in a second period, turning on the first switch so that electric charge held in the capacitor in accordance with the sum of the image signal voltage and the threshold voltage is discharged through the transistor, and turning off the second switch so that the first terminal of the transistor and the wiring are in a non-conduction state with each other, and
        in a third period, turning on the second switch and supplying a current from the wiring to the display element through the second switch and the transistor after the second period.

2. The method according to claim 1, wherein the transistor includes an oxide semiconductor.

3. The method according to claim 2, wherein the oxide semiconductor comprises one material selected from the group consisting of ZnO, a-InGaZnO, SiGe, GaAs, IZO, ITO, SnO, TiO, and AlZnSnO.

4. The method according to claim 1,
    wherein the semiconductor device further comprises a third switch configured to control a conduction state between the second terminal of the transistor and the display element,
    wherein the third switch is turned off so as to prevent a current from being supplied to the display element in the second period, and
    wherein the third switch is turned on in the third period.

5. A method for driving a semiconductor device, the semiconductor device comprising:
    a transistor with n-type conductivity;
    a wiring;
    a first switch configured to control a conduction state between a gate of the transistor and a first terminal of the transistor;
    a second switch configured to control a conduction state between the first terminal of the transistor and the wiring;
    a capacitor electrically connected between the gate of the transistor and a second terminal of the transistor; and
    a display element,
    wherein the method for driving the semiconductor device includes:
        in a first period, holding a voltage corresponding to a threshold voltage of the transistor in the capacitor,
        in a second period, holding a sum of the voltage corresponding to the threshold voltage of the transistor and an image signal voltage in the capacitor,
        in a third period, turning on the first switch so that electric charge held in the capacitor in accordance with the sum of the image signal voltage and the threshold voltage is discharged through the transistor, and turning off the second switch so that the first terminal of the transistor and the wiring are in a non-conduction state with each other, and
        in a fourth period, turning on the second switch and supplying a current from the wiring to the display element through the second switch and the transistor after the third period.

6. The method according to claim 5,
    wherein the semiconductor device further comprises a third switch configured to control a conduction state between the second terminal of the transistor and the display element,
    wherein the third switch is turned off so as to prevent a current from being supplied to the display element in the third period, and
    wherein the third switch is turned on in the fourth period.

7. The method according to claim 5, wherein the transistor includes an oxide semiconductor.

8. The method according to claim 7, wherein the oxide semiconductor comprises one material selected from the group consisting of ZnO, a-InGaZnO, SiGe, GaAs, IZO, ITO, SnO, TiO, and AlZnSnO.

9. The method according to claim 7, wherein the oxide semiconductor comprises one material selected from the group consisting of ZnO, a-InGaZnO, SiGe, GaAs, IZO, ITO, SnO, TiO, and AlZnSnO.

10. A method for driving a semiconductor device, the semiconductor device comprising:
- a transistor with n-type conductivity;
- a wiring;
- a first switch configured to control a conduction state between a gate of the transistor and a first terminal of the transistor;
- a second switch configured to control a conduction state between the first terminal of the transistor and the wiring;
- a capacitor electrically connected between the gate of the transistor and a second terminal of the transistor; and
- a display element,
- wherein the method for driving the semiconductor device includes:
  - in a first period, initializing a voltage held in the capacitor,
  - in a second period, holding a voltage corresponding to a threshold voltage of the transistor in the capacitor,
  - in a third period, holding a sum of the voltage corresponding to the threshold voltage of the transistor and an image signal voltage in the capacitor,
  - in a fourth period, turning on the first switch so that electric charge held in the capacitor in accordance with the sum of the image signal voltage and the threshold voltage is discharged through the transistor, and turning off the second switch so that the first terminal of the transistor and the wiring are in a non-conduction state with each other, and
  - in a fifth period, turning on the second switch and supplying a current from the wiring to the display element through the second switch and the transistor after the fourth period.

11. The method according to claim 10, wherein the transistor includes an oxide semiconductor.

12. The method according to claim 10,
- wherein the semiconductor device further comprises a third switch configured to control a conduction state between the second terminal of the transistor and the display element,
- wherein the third switch is turned off so as to prevent a current from being supplied to the display element in the fourth period, and
- wherein the third switch is turned on in the fifth period.

* * * * *